(12) United States Patent
Rogers et al.

(10) Patent No.: US 6,838,869 B1
(45) Date of Patent: Jan. 4, 2005

(54) CLOCKED BASED METHOD AND DEVICES FOR MEASURING VOLTAGE-VARIABLE CAPACITANCES AND OTHER ON-CHIP PARAMETERS

(75) Inventors: David Michael Rogers, Sunnyvale, CA (US); Mimi Xuefeng Qian, Campbell, CA (US); Roger Huazne Tsao, San Jose, CA (US); Michael Allen Van Buskirk, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 112 days.

(21) Appl. No.: 09/825,027

(22) Filed: Apr. 2, 2001

(51) Int. Cl.[7] .................. G01R 31/26; G01R 31/08; H01L 23/58
(52) U.S. Cl. .............. 324/158.1; 324/519; 324/719; 324/765; 257/48
(58) Field of Search .................... 324/158.1, 519, 324/520, 548, 658, 667, 674, 681, 686, 719, 763, 765; 327/14, 336, 337, 554; 257/48

(56) References Cited

U.S. PATENT DOCUMENTS 6,404,222 B1 * 6/2002 Fan et al. ............... 324/765

OTHER PUBLICATIONS

Chen et al (An On–Chip Attofarad Interconnect Charge–Based Capacitance Measurement (CBCM) Technique, Chen, J.C.; McGaughy, B.W.; Sylvester, D.; Chenming Hu, Electron Devices Meeting, International, Dec. 8–11, 1996, pp: 69–72).*

McGaughy et al (A Simple Method for On–Chip, Sub–Femto Farad Interconnect Capacitance Measurement, McGaughy, B.W.; Chen, J.C.; Sylvester, D.; Chenming Hu; Electron Device Letters, IEEE, vol: 18, Issue: 1, Jan. 1997, pp: 21–23).*

* cited by examiner

*Primary Examiner*—David A. Zarneke
*Assistant Examiner*—Russell M. Kobert

(57) ABSTRACT

A characterization method for a device under test includes applying a bias voltage to a test circuit. The test circuit includes a first transistor coupled to the device under test, a second transistor coupled to the device under test and to the first transistor. A third transistor is coupled to a dummy device, a fourth transistor is coupled to the dummy device and to the third transistor. The transistors are of a common type. The characterization method further includes applying non-overlapping clocking signals to transistors of the test circuit to produce test signals for application to the device under test and detecting a current in one or more transistors from the device under test. The bias voltage is further varied to characterize the device under test.

11 Claims, 38 Drawing Sheets

100

500

1500

FIG. 22
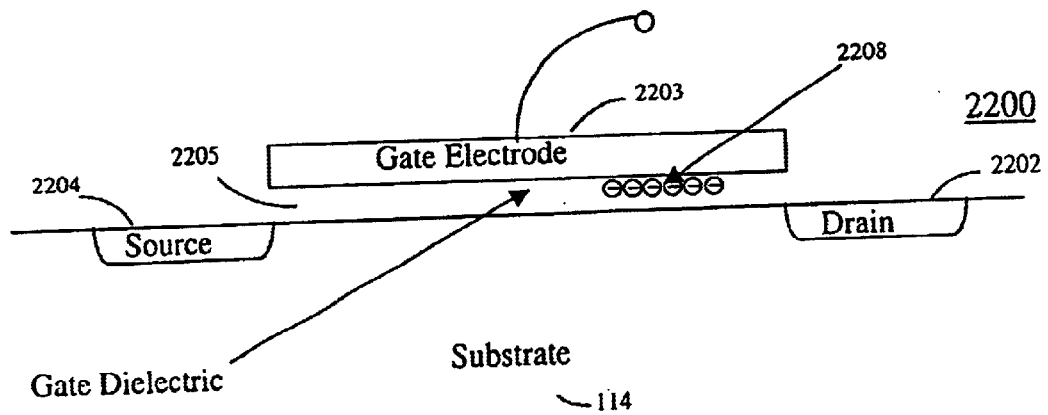
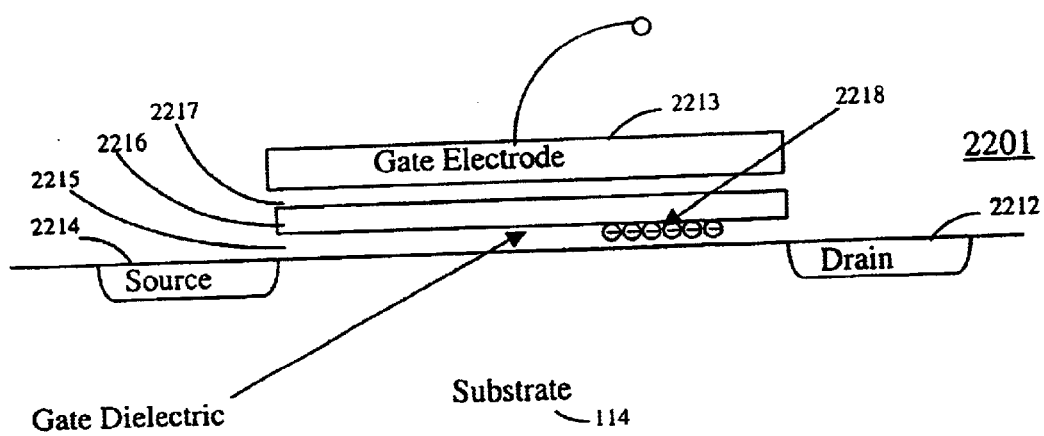
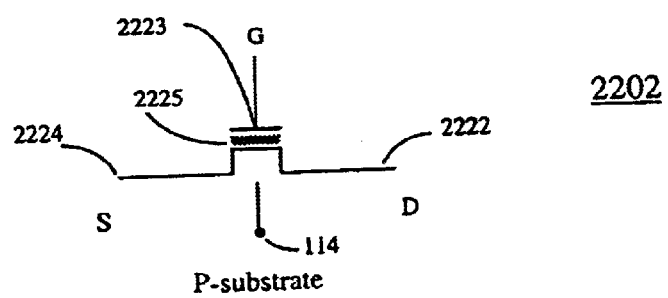

FIG.33
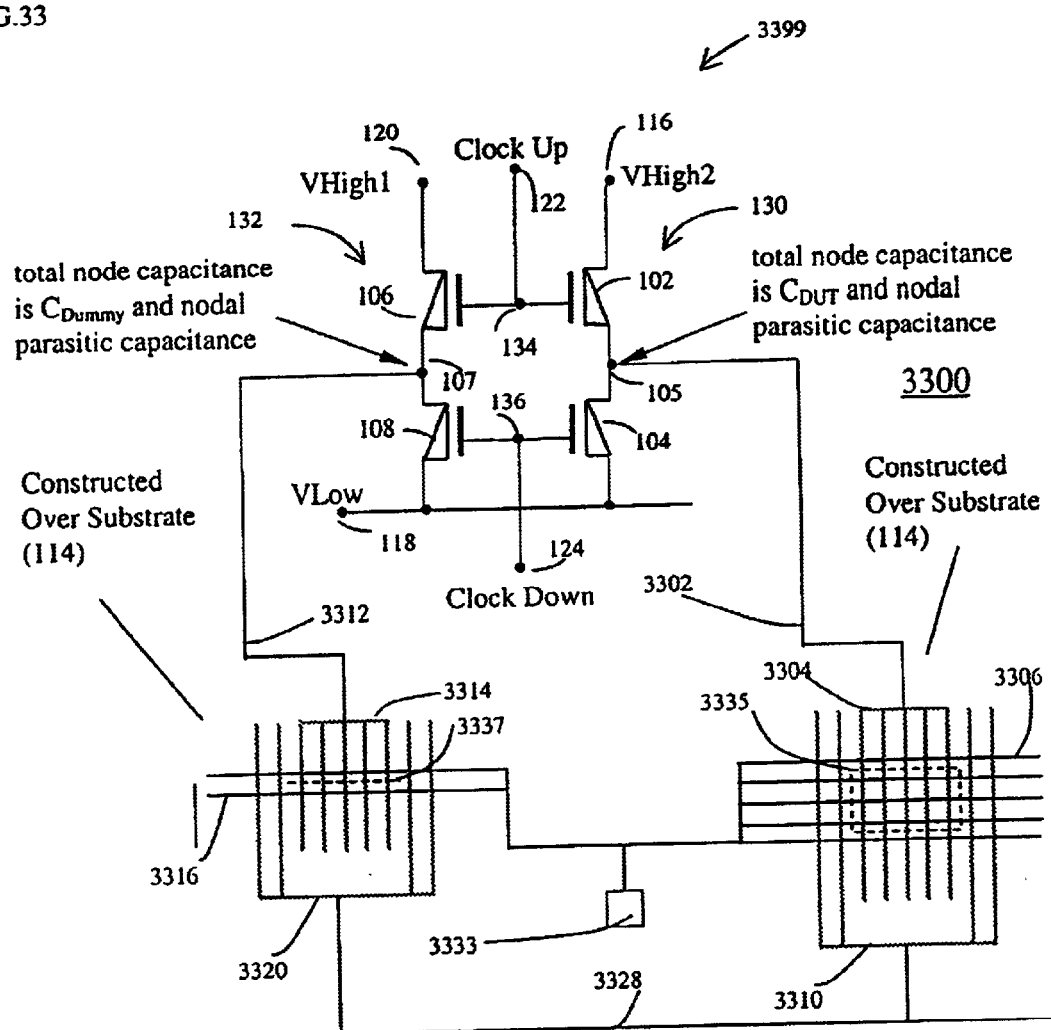
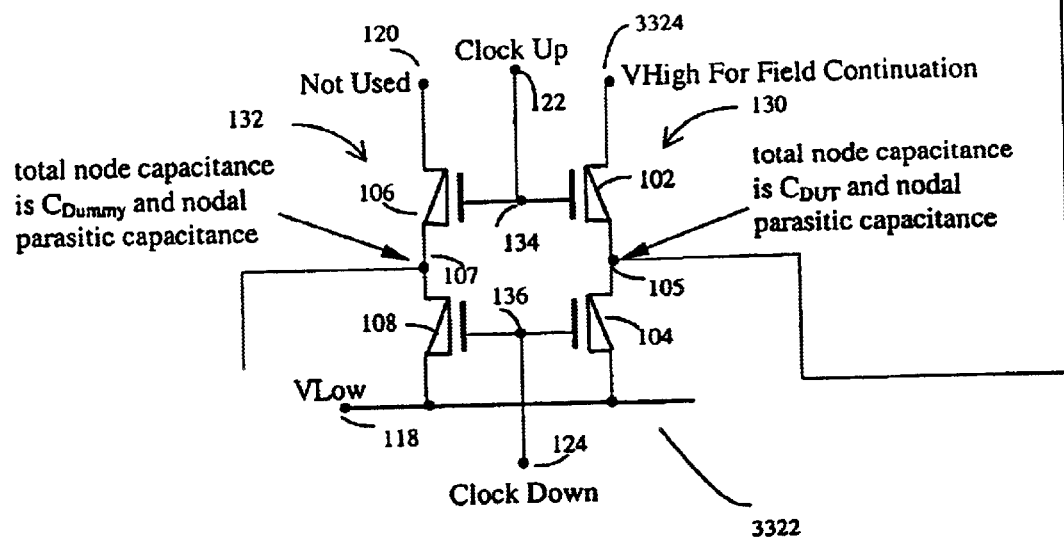

FIG. 35
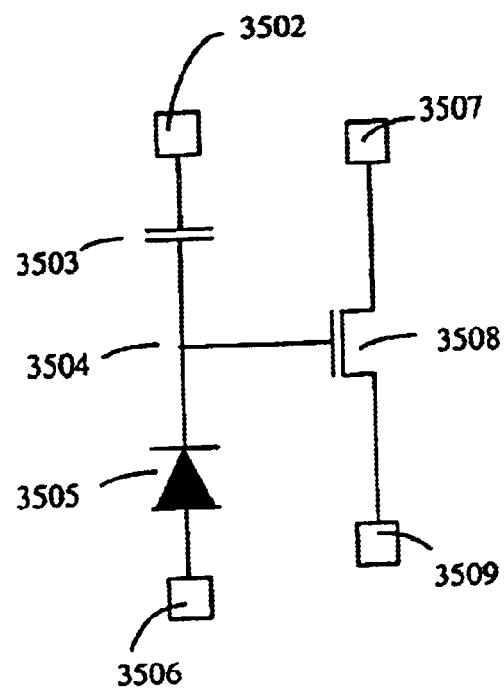
3500
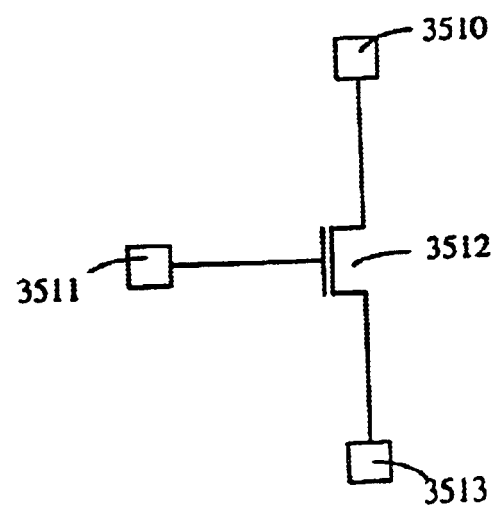

FIG. 37
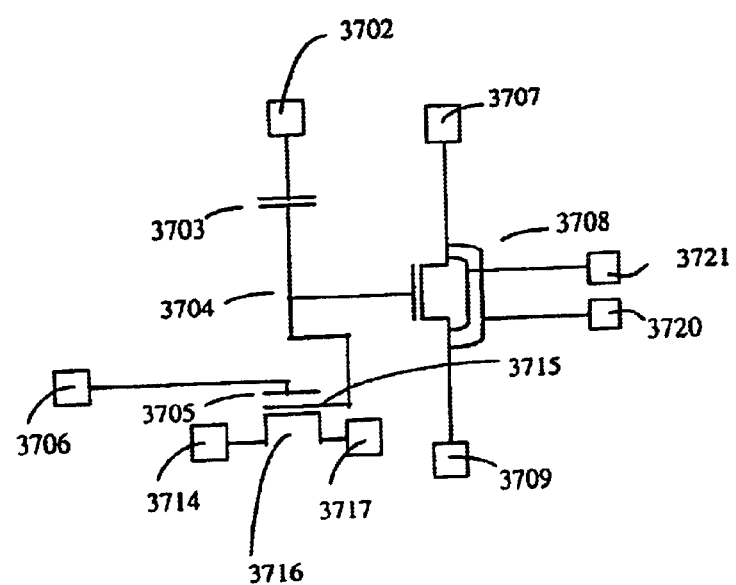
3700
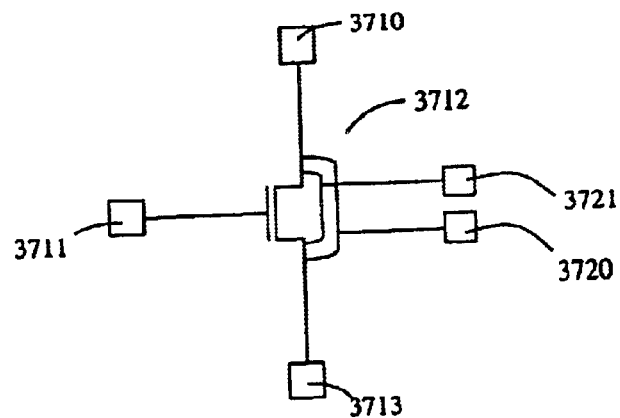

FIG. 38
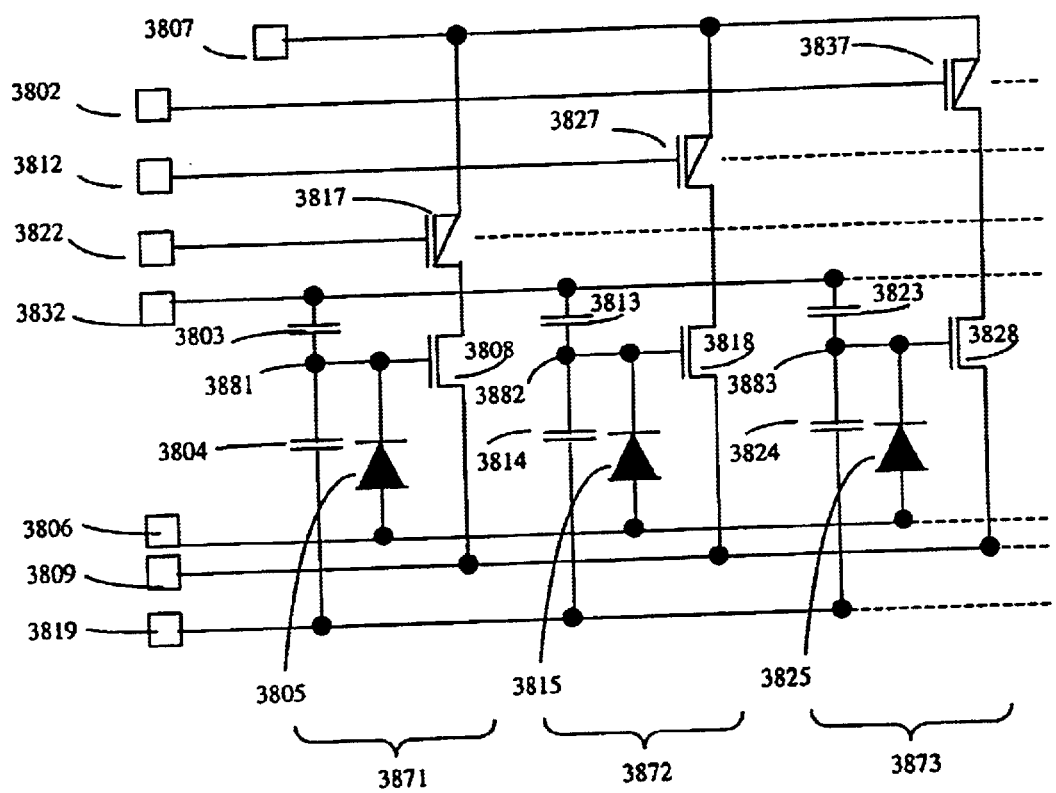
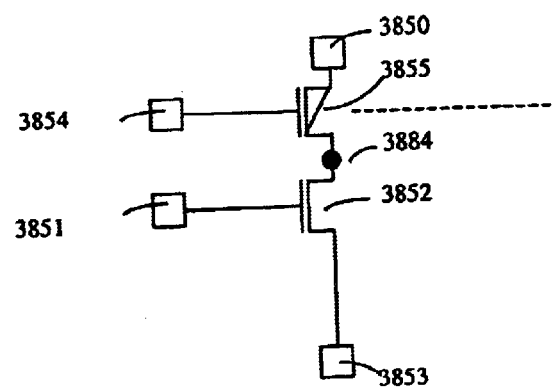
3800

CLOCKED BASED METHOD AND DEVICES FOR MEASURING VOLTAGE-VARIABLE CAPACITANCES AND OTHER ON-CHIP PARAMETERS

BACKGROUND

The present invention is related generally to test methods and structures for integrated circuits. In particular, the present invention is related to clocked based methods and devices for measuring voltage-variable capacitances and other on-chip parameters.

Integrated circuits and their constituent components are tested for a variety of reasons. Completed circuits are tested for functionality and satisfaction of performance parameters. Such performance parameters include circuit speed or frequency of operation and power dissipation. Test cells on a circuit are tested for characterization of device parameters. Such device parameters include insulator dielectric capacitances, junction capacitances and threshold voltages in metal-oxide-semiconductor (MOS) integrated circuits, diode reverse bias leakage currents, dielectric tunneling currents, and, in non-volatile memory devices and standard MOS transistors, the location and density of trapped charges in gate dielectrics. Other circuit parameters are measured as well, such as metal interconnect resistance and interlayer capacitances. In particular, capacitance versus voltage characteristics, C-V curves, are among the most fundamental and popular analysis methods used in the semiconductor industry. These tests are performed during initial process design and characterization and for parametric data gathering even in mature semiconductor manufacturing processes.

Many of these tests require measurement of on-chip capacitances and similar values. Such measurements have grown increasingly unreliable and difficult to make as integrated circuit dimensions have decreased. A capacitance meter has been used, both manually and under automatic control. However, such a meter can be cumbersome, inaccurate and unreliable. For example, current capacitance meters have a resolution of approximately 1 pF. However, many device and interconnect capacitances of interest are in the range of 0.0-100 fF.

Although most on-chip capacitances of interest could be represented in test chip test structures, the large sizes of such structures often prevent their use. Achieving capacitance measurement structures that have enough capacitance to make accurate measurements possible requires that the structures be very large. These large structures consume inordinate amounts of valuable test chip space.

The maximum sizes of test chips are limited by the sizes of the stepping fields of the "wafer steppers" on which the test chips are manufactured. Wafer steppers are the lithographic systems that are currently used in most semiconductor manufacturing facilities for optically patterning the various layers of semiconductor products and of technology development test chips. Steppers use reticules (advanced photolithographic masks) to selectively expose specific areas of photographic emulsions on each wafer during wafer processing. This selective exposure determines the shapes and locations of the polygons that make up the structure of each layer on a semiconductor product or test chip.

Due to each stepper's optical constraints, the area of a wafer or exposure field that a stepper can pattern in a single exposure is limited. Normally, one exposure transfers the pattern from a complete reticule to the photographic emulsion on a wafer. A typical area of a single exposure is 2.5 cm by 2.5 cm. Typically, a single stepper will use a single reticule for patterning a given layer on all of the wafers in a manufacturing wafer lot. Each lot typically consists of 25 or 50 wafers. The stepper starts at one point on each wafer, exposes that location and then steps to the next location and exposes that location. The stepper repeats this process until it has stepped to and exposed all of the assigned locations on a wafer. Hence the term "stepper."

Different reticules with different patterns are used for different layers. Normally however, only one reticule is used to pattern a single given layer on all of the wafers in a manufacturing wafer lot. Steppers are generally not interrupted in the midst of stepping a wafer lot for the sake of changing to a second reticule. Changing reticules requires that a stepper be disabled for a significant period of time. Any such stepper "down time" is prohibitively costly. The cost of a new semiconductor manufacturing facility's steppers are a major fraction of the cost of the entire facility (on the order of $100 million out of the typical $1 billion that is spent in building and equipping a facility). It would be very impractical, for example, to use one reticule to pattern a layer on a portion of the wafers in a wafer lot and to then to switch to a different reticule to pattern that same layer on the wafers in the remainder of the wafer lot.

Thus the sizes and numbers of test structures that can be placed into a process development test chip are strictly limited to the structures that will fit together into the limited wafer area that is afforded by a single stepper exposure field. While designing the test structures for a test chip, it is common for engineers to make very difficult decisions as to which test structures they will include in the test chip and which test structures they will not include. Omitting structures can often lead to an engineering group later painfully realizing that it does not have the test structures needed answering critical technology development questions. In short, test chip area is extremely costly and reducing the sizes of test structures while maintaining the efficacy of the structures is desirable.

A technique has been developed for measuring on-chip voltage independent capacitance. In "A Simple Method for On-Chip, Sub-Femto Farad Interconnect Capacitance Measurement," McGaughy et al., IEEE Electron Device Letters, Vol. 18, No. 1, January 1997, a technique and circuit are disclosed which permit measuring on-chip capacitances with high resolution. The test structures that the technique uses consume significantly less test chip area than do previous techniques. An on-chip test circuit uses four transistors in addition to the unknown capacitance to be characterized. No reference capacitor is required and resolution down to 0.03 fF is provided. Measurement may be conducted automatically or manually.

While the disclosed technique is useful for measuring voltage independent capacitance, a large class of device and circuit characteristics are voltage dependent or voltage variable. That is, the capacitance of a device or interconnect or other structure varies with applied voltage. Examples include gate capacitance of a MOS transistor or the capacitance of a reverse biased diode. Further, parameters other than capacitance vary with applied voltage and are not measurable with the disclosed technique. These include leakage current in a reverse biased diode and dielectric tunneling currents. All of these voltage variable parameters are key to device characterization and modeling and essential to process control. However, none of these parameters is available using the technique as disclosed in the above-identified reference.

Accordingly, there is a need for an improved method and apparatus for characterizing on-chip devices, currents and capacitances that are variable with applied voltage. Ideally the method will have enough measurement resolution and precision to allow the accurate characterization of capacitors that are small enough to be economically included in technology development test chips.

SUMMARY

By way of introduction only, the embodiments illustrated herein disclose methods and apparatus for measuring device parameters such as capacitances including voltage variable capacitances. A test circuit allows the current and voltage characteristics of the device parameter to be measured while excluding parasitic effects. A bias voltage is varied while clocked test signals are applied to the test circuit. In one embodiment, the transistors of the test circuit are fabricated in a well to isolate them from the substrate potential of the semiconductor substrate. This permits application of both positive and negative voltages for complete characterization of device and circuit parameters.

The foregoing discussion of the preferred embodiments has been provided only by way of introduction. Nothing in this section should be taken as a limitation on the following claims, which define the scope of the invention.

BRIEF DESCRIPTION OF SEVERAL VIEWS OF THE DRAWINGS

FIG. 22 illustrates a cross sectional view of a MOSFET transistor, a cross sectional view an NROM memory core cell transistor, and a schematic symbol for an NROM memory core cell transistor;

FIG. 33 is an illustration of an exemplary on-chip circuit in partial schematic, partial layout form which uses two copies of the test circuit of FIG. 1 for measuring device parameters;

FIG. 35 is a schematic diagram of a test circuit for measuring reverse biased diode leakage currents which uses capacitances previously characterized with the test circuit of FIG. 1;

FIG. 37 is a schematic diagram of a test circuit for measuring tunnel currents through a dielectric which uses capacitances previously characterized with the test circuit of FIG. 1; and FIG. 38 is a schematic diagram of a circuit for multiplexing signals to multiple test circuits which are similar to the test circuits shown in FIG. 35 and in FIG. 37.

DETAILED DESCRIPTION OF PRESENTLY PREFERRED EMBODIMENTS

Figure 1:
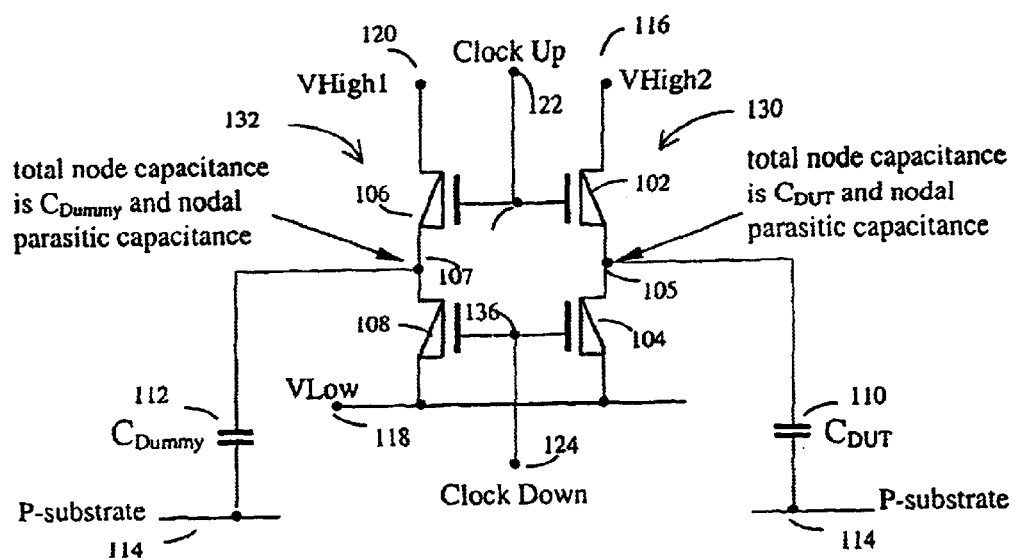
FIG. 1 is a schematic diagram of a test circuit for measuring integrated circuit parameters.

Referring now to FIG. 1, it shows a schematic diagram of a test circuit 100 used for measurement of integrated circuit parameters. The test circuit 100 includes a first transistor 102, a second transistor 104, a third transistor 106 and a fourth transistor 108. The third transistor is substantially the same in all regards as the first transistor. The fourth transistor is substantially the same in all regards to the second transistor. The test circuit 100 is connected to a device under test 110, in this case a capacitance labeled $C_{DUT}$ (Device Under Test Capacitance). In addition, the test circuit 100 includes a dummy capacitance 112, labeled $C_{DUMMY}$. The device under test 110 is positioned between an output 105 of the test circuit 100 and the substrate 114. Similarly, the dummy capacitance 112 is electrically located between a node 107 and the substrate 114. Note that the device under test capacitance and the dummy capacitance are connected to the substrate 114 in this embodiment. Alternatively, in other embodiments, they could instead be connected to an independently biased node (for example they could be connected to a doped well in the substrate, or to a plate of metal interconnect or poly silicon interconnect residing over the substrate).

It is envisioned that the test circuit 100 will be manufactured on a semiconductor substrate 114 along with other devices forming an integrated circuit or a wafer of integrated circuits. By appropriate application of control signals, to be described herein, a wide variety of circuit and device parameters may be characterized, automatically or manually, using one or more test circuits, such as the test circuit 100.

Each of the transistors 102, 104, 106, 108 is preferably of the same doping type. In FIG. 1, each transistor is a p-channel transistor. More specifically, each of the transistors 102, 104, 106, 108 is formed by defining P+ diffusion areas in an n-well defined in the p-type substrate 114. Preferably, standard semiconductor processing techniques are used to manufacture the test circuit 100 along with the conventional devices which form an integrated circuit or a wafer of integrated circuits. Thus, the test circuit 100 may be included as a component of a test circuit or test chip on the wafer, or may be included as a test circuit within an individual integrated circuit of the wafer. Alternatively, the test circuit and other test devices may be included in the scribe grid of the wafer so as not to take up any active space of the wafer of integrated circuits.

The test circuit 100 is suitable for testing a device under test 110. The device under test may be a device such as a transistor or a diode, a portion or parasitic component of a device such as the gate oxide capacitance, or tunnel oxide capacitance of a non-volatile memory cell transistor, or a portion or parasitic of another component of an integrated circuit such as the capacitance associated with interconnect metal.

A dummy device or capacitance 112 is typically also included. Preferably, the dummy capacitance contains all of the parts of the device under test capacitance 110 that are not portions of the capacitance of interest. Specifically, in most embodiments, the dummy capacitance and node 107 contain a copy of the parasitic (undesired) capacitances that are associated with the device under test capacitance and node 105. The purpose here is for duplicates of all of the parasitic capacitances associated with node 105 to be associated with node 107. In this way, the measurement structure of FIG. 1 can be used to measure both the device under test capacitance and the dummy capacitance and the difference between the two resultant capacitance values will be the capacitance of interest. Normally, many of the parts of the device under test capacitance are duplicated in the dummy capacitance. These duplicated parts are the portions of the structure of the device under test for which capacitance is not desired to be measured (it is desired that these portions of the capacitance be excluded from the final capacitance result).

The first transistor 102 has a source connected to a bias node 116 labeled VHigh2 in FIG. 1. The first transistor 102 has a drain connected to an output 105 of the test circuit 100. The first transistor 102 has a gate connected to a first clocked node 122, labeled Clock Up. The second transistor 104 has a source connected to the output 105, a drain connected to a second bias node 118, labeled VLow in FIG. 1, and a gate connected to a second clocked node 124, labeled Clock Down. Similarly, the third transistor has a source connected to a third bias node 120, labeled VHigh1, a drain connected to the output 107, and a gate connected to the first clocked node 122. Still further, the fourth transistor 108 has a source connected to the output 107, a drain connected to the second bias node 118, and a gate connected to the second clocked node 124.

Thus, the test circuit 100 includes a first transistor pair 130 including first transistor 102 and second transistor 104 connected with the device under test 110. The test circuit 100 further includes a second transistor pair 132 including the third transistor 106 and the fourth transistor 108. The third transistor 106 and the first transistor 102 have a common gate connection 134 configured to be driven by a first variable voltage at the first clocked node 122. The third transistor and the first transistor receive a first variable bias voltage at the nodes 116, 120. The fourth transistor 108 and the second transistor 104 have a common gate connection 136 configured to be driven by a second variable voltage at the second clocked node 124. The fourth transistor 108 and the second transistor 104 receive a second variable bias voltage at the second bias node 118. In the preferred embodiment, bias voltage $V_{HIGH}$ is applied to node 116 and the current flowing into node 116 is measured in order to determine the combined capacitance of the device under test capacitor $C_{DUT}$ 110 and the parasitic capacitance associated with node 105 ($C_{PARASITIC-105}$). Subsequently, the bias voltage $V_{HIGH}$ is applied to node 120 and the current flowing into node 120 is measured in order to determine the combined capacitance of the dummy capacitor $C_{Dummy}$ 112 and the parasitic capacitance associated with node 107, ($C_{PARASITIC-107}$).

Figure 2:
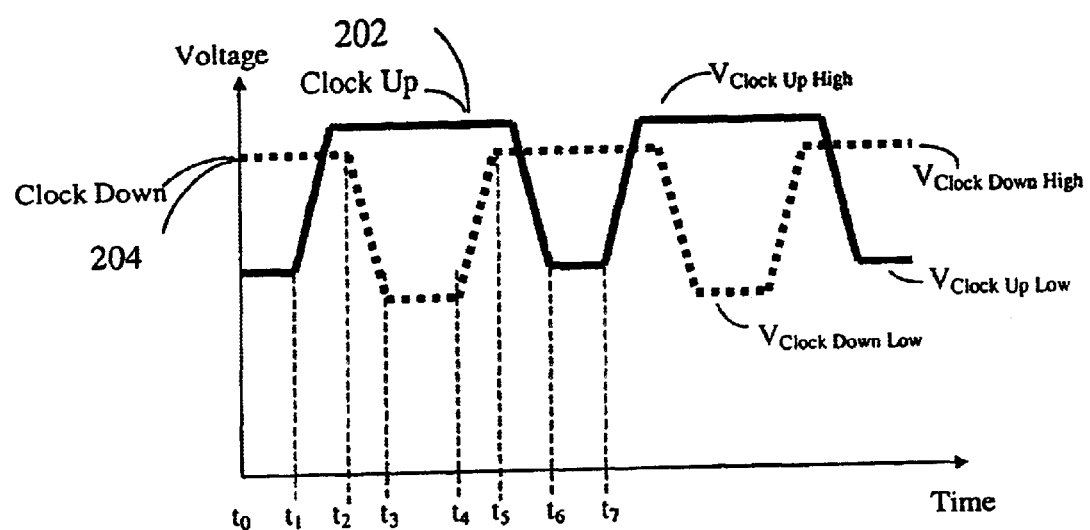
FIG. 2 illustrates exemplary waveforms for activating the test circuit of FIG. 1.

FIG. 2 illustrates exemplary waveforms for activating the test circuit 100 of FIG. 1. In FIG. 1, a first clocking signal 202 labeled Clock Up, is applied to the first clocked node 122 of the test circuit 100 in FIG. 1. Similarly, a second clock signal 204 labeled Clock Down, is applied to the second clocked node 124 of FIG. 1. The first clock signal 202 and the second clock signal 204 are preferably non-overlapping clock signals. That is, the high and low states of the two clock signals 202, 204 are arranged so that the two transistors of the first transistor pair 130 are not conducting simultaneously. Similarly, the high and low states of the two clock signals 202, 204 are arranged so that the two transistors of the second transistor pair 132 are not conducting simultaneously.

Thus, in the exemplary embodiment of FIG. 2, at the time $t_0$, the first clock signal 202 has a value $V_{CLOCK-UP-LOW}$ and the second clock at 204 has a value $V_{CLOCK-DOWN-HIGH}$. In this state, the first transistor 102 is turned on and is conducting current. The second transistor 104, also a p-channel transistor, is turned off and not conducting. After time $t_1$, the first clock signal 202 transitions from $V_{CLOCK-UP-LOW}$ to $V_{CLOCK-UP-HIGH}$, turning off the first transistor 102. After time $t_2$, the second clock signal 204 transitions from $V_{CLOCK-DOWN-HIGH}$ to $V_{CLOCK-DOWN-LOW}$ turning on the second transistor 104.

From time $t_3$ to time $t_4$, the second transistor 104 is turned on and conducting. Meanwhile, the first transistor 102 is turned off. From time $t_4$ to time $t_5$, the second clock signal 204 transitions from a voltage $V_{CLOCK-DOWN-LOW}$ to a voltage $V_{CLOCK-DOWN-HIGH}$ turning off the second transistor 104. From time $t_5$ until time $t_6$, the first clock signal 202 transitions from voltage $V_{CLOCK-UP-HIGH}$ to a voltage $V_{CLOCK-UP-LOW}$, turning on the first transistor 102. Subsequently, after time $t_6$, the first transistor 102 is turned on and conducting. The cycle repeats again starting at time $t_7$. This repetition occurs with a frequency f, typically 500,000 Hz. Depending upon the application, the clocking frequency can be very slow, such as 5,000 Hz or less, or fairly fast, such as 2,000,000 Hz or greater.

During times such as $t_0$ to $t_1$, with the first transistor 102 turned on and conducting, the device under test 110 is charged from a voltage $V_{LOW}$ to a voltage equal to $V_{HIGH}$. During a subsequent time period from $t_3$ to $t_4$, the device under test 110 is discharged through the second transistor 104 from a voltage $V_{HIGH}$ to a voltage equal to $V_{LOW}$. During each of these charging and discharging cycles all of the capacitances associated with node 105 are charged and discharged. These capacitances include the device under test capacitance and all of the parasitic capacitances associated with node 105, including $C_{PARASITIC-105}$; the diode capacitances associated with the drain of transistor 102 and the source of transistor 104, the gate to drain capacitance of transistor 102, the gate to source capacitance of transistor 104, the interconnect capacitances connected to node 105, etc. The amount of charge transferred from node 116 to node 118 via node 105 during each cycle is equal to the product of the total capacitance associated with node 105 (device under test and parasitic) and the difference in the charging voltage $V_{HIGH}$ and the discharging voltage $V_{LOW}$. This transferred charge results in an average current flowing from node 116 to node 118 which is equal to the product of the transferred charge per cycle and the cycling frequency f. By measuring the average current via node 116 into transistor 102, the sum of the device under test capacitance and the parasitic capacitance associated with node 105 can be determined.

Normally, so that the same current measurement device can be used to measure the current associated with the dummy capacitance and the device under test capacitance, the two capacitances are measured at different times. It is desirable to use the same current measurement device for measuring both capacitances so that the two measurements will be equally affected by any errors in calibration of the current measurement device.

Measurement of the dummy capacitance, 112, is normally conducted in the same fashion as the measurement of the device under test capacitance. During the dummy capacitance measurement, transistors 106 and 108 respectively in FIG. 1 are treated in the same fashion as transistors 102 and 104 were during the device under test capacitance measurement. As with transistors 102 and 104, transistors 106 and 108 are normally p-channel transistors. Node 120 is treated in the same fashion as was node 116. Node 107 is treated in the same fashion as was node 105.

Thus, in the exemplary embodiment of FIG. 2, at the time $t_0$, the first clock signal 202 has a value $V_{CLOCK-UP-LOW}$ and the second clock at 204 has a value $V_{CLOCK-DOWN-HIGH}$. In this state, the third transistor 106 is turned on and able to conduct current. The fourth transistor 108 is turned off and not conducting. After time $t_1$, the first clock signal 202 transitions from $V_{CLOCK-UP-LOW}$ to $V_{CLOCK-UP-HIGH}$, turning off the third transistor 106. After time $t_2$, the second clock signal 204 transitions from $V_{CLOCK-DOWN-HIGH}$ to $V_{CLOCK-DOWN-LOW}$ turning on the fourth transistor 108. From time $t_3$ to time $t_4$, the fourth transistor 108 is turned on and conducting. Meanwhile, the third transistor 106 is turned off. From time $t_4$ to time $t_5$, the second clock signal 204 transitions from a voltage $V_{CLOCK-DOWN-LOW}$ to a voltage $V_{CLOCK-DOWN-HIGH}$ turning off the fourth transistor 108. From time $t_5$ until time $t_6$, the first clock signal 202 transitions from voltage $V_{CLOCK-UP-HIGH}$ to a voltage $V_{CLOCK-UP-LOW}$, turning on the third transistor 106. Subsequently, after time $t_6$, the third transistor 106 is turned on and conducting. The cycle repeats again starting at time $t_7$. As with the measurement of the device under test capacitance, this repetition occurs with a frequency f, typically 500,000 Hz.

During times such as $t_0$ to $t_1$, with the third transistor 106 turned on and conducting, the dummy capacitance 112 is charged from a voltage $V_{LOW}$ to a voltage equal to $V_{HIGH}$. During a subsequent time period from $t_3$ to $t_4$, the dummy capacitance 112 is discharged through the fourth transistor 108 from a voltage $V_{HIGH}$ to a voltage equal to $V_{LOW}$.

During each of these charging and discharging cycles, all of the capacitances associated with node 107 are charged and discharged. These capacitances include the dummy capacitance and all of the parasitic capacitances associated with node 107 ($C_{PARASITIC\text{-}107}$; the diode capacitances associated with the drain of transistor 106 and the source of transistor 108, the gate to drain capacitance of transistor 106, the gate to source capacitance of transistor 108, the interconnect capacitances connected to node 107, etc.). The amount of charge transferred from node 120 to node 118 via node 107 during each cycle is equal to the product of the total capacitance associated with node 107 (dummy capacitance and parasitic) and the difference in the charging voltage $V_{HIGH}$ and the discharging voltage $V_{LOW}$. This transferred charge results in an average current flowing from node 120 to node 118 which is equal to the product of the transferred charge per cycle and the cycling frequency f. By measuring the average current via node 120 into transistor 106, the sum of the dummy capacitance and the parasitic capacitance associated with node 107 can be determined.

In turn, the above procedures apply effective average DC biases of $(V_{HIGH}+V_{LOW})/2$ to the device under test 110 and to the dummy capacitor 112. In the illustrated embodiment, referring to the measurement of the device under test capacitor as an example, the voltage $V_{HIGH}$ on node 116 is varied along with $V_{LOW}$ on node 118 to characterize the voltage dependence of the capacitance of the device under test 110 and the accompanying parasitic capacitances associated with node 105. The values of $V_{LOW}$ and $V_{HIGH}$ are preferably kept close to one another so that measured capacitances will be accurate for the effective DC bias in the vicinity of $V_{LOW}$ and $V_{HIGH}$. Moreover, the difference between the values of $V_{LOW}$ and $V_{HIGH}$ is maintained constant as $V_{LOW}$ and $V_{HIGH}$ are varied together. In one typical embodiment, the difference between the voltage values $V_{LOW}$ and $V_{HIGH}$ will be on the order of 0.2 volts. Other values can also be used for this difference. Note that the values of voltages $V_{LOW}$ and $V_{HIGH}$ applied to nodes 118 and 116 respectively when measuring the device under test capacitance are normally the same as the values of the voltages $V_{LOW}$ and $V_{HIGH}$ applied to nodes 118 and 120 respectively when measuring the dummy capacitance.

The DC voltage that results from the average of $V_{LOW}$ and $V_{HIGH}$ can be varied over a wide range of voltage, from negative to positive voltage. For example, at one data point, the value of $V_{HIGH}$ is set at 3.1 volts and the value of $V_{LOW}$ is set at 2.9 volts. In the case when $V_{HIGH}$ is applied to 116, the average of $V_{HIGH}$ and $V_{LOW}$, 3.0 volts, is the effective DC voltage applied to the device under test 10 (assuming that the substrate 114 is grounded). For device under test capacitors that have their non-switched common nodes connected to a node other than the substrate (114), the overall average voltage applied across the device under test capacitor is the difference in voltage between the average effective DC voltage applied to node 105 (3.0 volts in this example) and the voltage applied to the non-switched common node. All of the above procedures and analysis can also be analogously applied to the measurement of the dummy capacitance and the parasitic capacitance associated with node 107.

With the values of the bias voltages $V_{HIGH}$ (on node 116) and $V_{LOW}$ (on node 118) set as described above, the clock nodes 122, 124 are supplied with the clock signals 202 and 204 as shown in FIG. 2. Preferably, this measurement technique is repeated across a wide range of voltages $V_{HIGH}$ and $V_{LOW}$. $V_{HIGH}$ and $V_{LOW}$ are varied together across the measurement range, for example, from +3 to −3 volts, keeping the same difference, such as 0.2 volts, between the two bias voltages. Thus, at one data point, $V_{HIGH}$ is set at +0.1 volts and $V_{LOW}$ is set at −0.1 volts, producing an effective average DC voltage applied to the device under test 110 of 0 volts. At a subsequent data point, $V_{HIGH2}$ is set to a value of −0.9 volts and $V_{LOW}$ is set to a value of −1.1 volts, producing an effective average DC value of −1.0 volts across the device under test 110.

As the values of $V_{HIGH}$ and $V_{LOW}$ are varied, the high and low voltage values of the clock signals 202 and 204 ($V_{ClockupHigh}$, $V_{ClockupLow}$, $V_{ClockDownHigh}$, and $V_{ClockDownLow}$) are normally also varied to maintain the clock signals' abilities to turn on and turn off the transistors 102, 104, 106 and 108. Again, the above procedures and analysis can also be analogously applied to the measurement of the dummy capacitance and the parasitic capacitance associated with node 107.

Equations 1 and 2 yield the sum of the device under test capacitance and the parasitic capacitance associated with node 105 ($C_{DUT}+C_{Parasitic\text{-}105}$), and the sum of the dummy capacitance and the parasitic capacitance associated with node 107 ($C_{DUMMY}+C_{Parasitic\text{-}107}$)

$$C_{DUT} + C_{Parasitic\text{-}105} = \frac{I_{(Average\ Into\ Node\ 116)}}{(V_{HIGH\ Applied\ To\ Node\ 116} - V_{LOW}) \cdot f} \quad \text{Equation 1}$$

$$C_{Dummy} + C_{Parasitic\text{-}107} = \frac{I_{(Average\ Into\ Node\ 120)}}{(V_{HIGH\ Applied\ To\ Node\ 120} - V_{LOW}) \cdot f} \quad \text{Equation 2}$$

In these two equations, "f" is the cycling frequency of the clocking signals 202 and 204.

In the preferred embodiment, the parasitic capacitances associated with nodes 105 and 107 ($C_{Parasitic\text{-}105}$, and $C_{Parasitic\text{-}107}$) are made to be equal. This is normally accomplished in semiconductor test chips by making the physical layouts of the various portions of nodes 105 and 107 be geometrically and structurally the same in each node. Often this equivalence is achieved by constructing the physical structures of nodes 105 and 107 as geometric mirror images of one another. In this way the parasitic capacitances associated with node 105 and with node 107 can be regarded as being equivalent to one another.

$$C_{Parasitic\text{-}105} = C_{Parasitic\text{-}107} \quad \text{Equation 3}$$

In equation 4, the dummy capacitance and the parasitic capacitance associated with node 107 are subtracted from the device under test capacitance and the parasitic capacitance associated with node 105. The parasitic capacitances associated with node 107 in equation 4 cancel the parasitic capacitances associated with node 105. This cancellation occurs because all of the portions of nodes 105 and 107 except for the device under test capacitor and the dummy capacitor are normally constructed identically or in mirror image to their counterparts in the other node. Accordingly, equation 4 yields the desired difference in the values of the device under test capacitor and the dummy capacitor. A primary goal in the development of the device under test capacitor and the dummy capacitor is to construct the two capacitors in such a way that their difference is a structure which has a capacitance of interest, namely the desired capacitance.

$$C_{Desired} = C_{DUT} + C_{Parasitic\text{-}105} - C_{Dummy} - C_{Parasitic\text{-}107} \quad \text{Equation 4}$$

Figure 3:
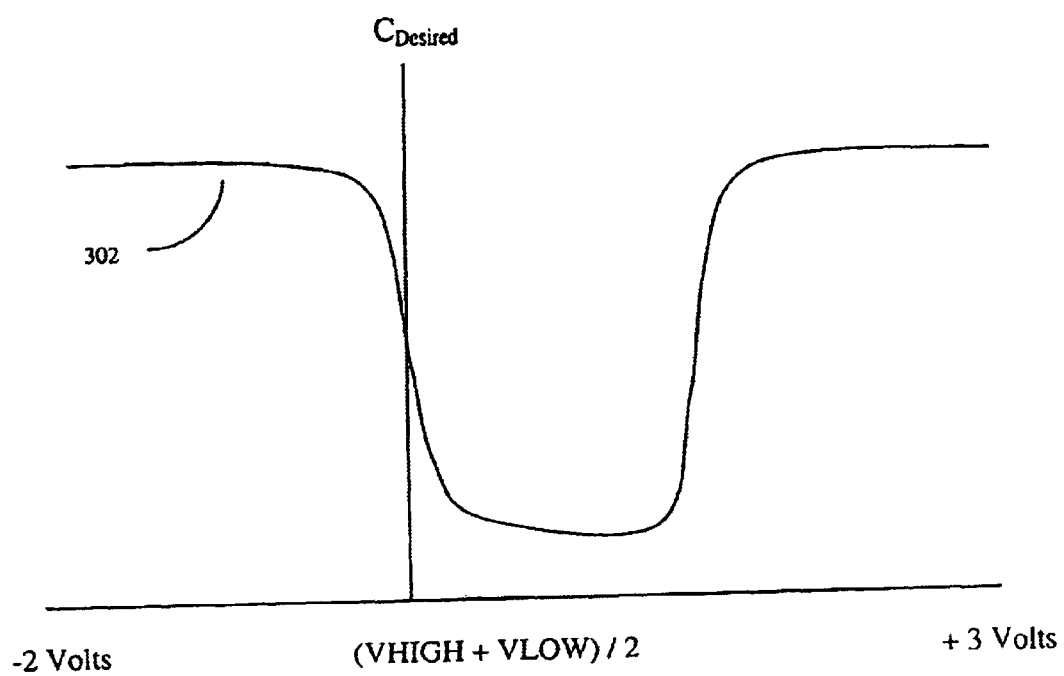
FIG. 3 is an exemplary curve illustrating capacitance as a function of average effective DC voltage resulting from the test circuit of FIG. 1.

Ultimately, by separating the values of $V_{HIGH2}$ and $V_{LOW}$ by a small voltage (for example 0.2 volts) and then sweeping the values of $V_{HIGH2}$ and $V_{LOW}$ together across a range of voltages (for example from −3 volts to +3 volts), and applying the above described methods at each voltage in the voltage range, a C-V curve (a capacitance versus voltage curve) that is characteristic of the device under test capacitance can be created. Similarly a C-V curve that is characteristic of the dummy capacitance can also be created. Subtracting the dummy capacitance curve from the device under test capacitance curve yields a C-V curve that is characteristic of the capacitance of interest over the voltage range. This capacitance is characteristic of the desired capacitance. FIG. 3 shows an exemplary C-V curve 302 for a voltage variable capacitance that could result from the above outlined devices and procedures.

The test circuit 100 of FIG. 1, operated in conjunction with the test signals 202, 204 of FIG. 2, provides unique advantages over the measurement technique disclosed in "A Simple Method For On-Chip Sub Femto Farad Interconnect Capacitance Measurement" of McGaughy, et al. In that disclosure, transistors analogous to the second transistor 104 and the fourth transistor 108 are n-channel transistors formed in the p-type substrate 114. Further, to prevent the n-channel transistors' n-type source diffusions from forward biasing their diodes with the p-type substrate, the voltage applied to the sources (analogous to $V_{LOW}$ in FIG. 1) must be constrained to voltage levels above the substrate potential (often the ground potential). Furthermore, McGaughy, et al. connect the sources of their n-channel transistors to the substrate, further constraining the voltage on their node analogous to $V_{LOW}$ in FIG. 1 to the substrate's ground potential (0 volts).

Thus, the test circuit of FIG. 1 allows the application of voltages to the nodes $V_{LOW}$ and $V_{HIGH}$ that are independent of the substrate voltage and all other node voltages. The second bias node 118 is independent of the substrate and all other nodes. Also, the test circuit 100 employs switching devices that are capable of applying $V_{LOW}$ and $V_{HIGH}$ voltages that can be both negative as well as positive with respect to the non-clocked electrode or terminal of the capacitor or other device under test. This non-clocked node is shown as P-substrate in the example of FIG. 1. The circuit of FIG. 1 enables the measurement of capacitances over a range of average effective DC voltages (positive to negative). In short, the circuit of FIG. 1 enables the measurement of common capacitance versus voltage characteristics, C-V curves. The ability to measure C-V curves is of fundamental value to the practice of developing and manufacturing integrated circuits.

The use of p-channel transistors in n-wells formed in the p-substrate is particularly suitable for an n-well CMOS technology. In other processes, any transistor that can be biased independently from the substrate node would likely be suitable for switching. Examples include n-channel transistors and p-channel transistors in a twin tub process or n-channel transistors in a p-well formed in an n-substrate process. Further, other waveforms besides the waveforms of the test signals 202, 204 may be substituted. For example, sinusoids, triangle waves and other variations in the high and low voltage values may be advantageous for measurement accuracy, stability, repeatability and reproducibility. For example, sinusoids, having fewer harmonics than the square waves illustrated in FIG. 2, helped to reduce signal noise and reflections in a test setup. The peak to peak voltages and the average voltages of the clock signals can also be varied in order to optimize capacitance measurement accuracy. Some of this optimization can be guided through circuit simulation of the measurement circuit (FIG. 1 and its variations) and the applied input signals.

Figure 4:
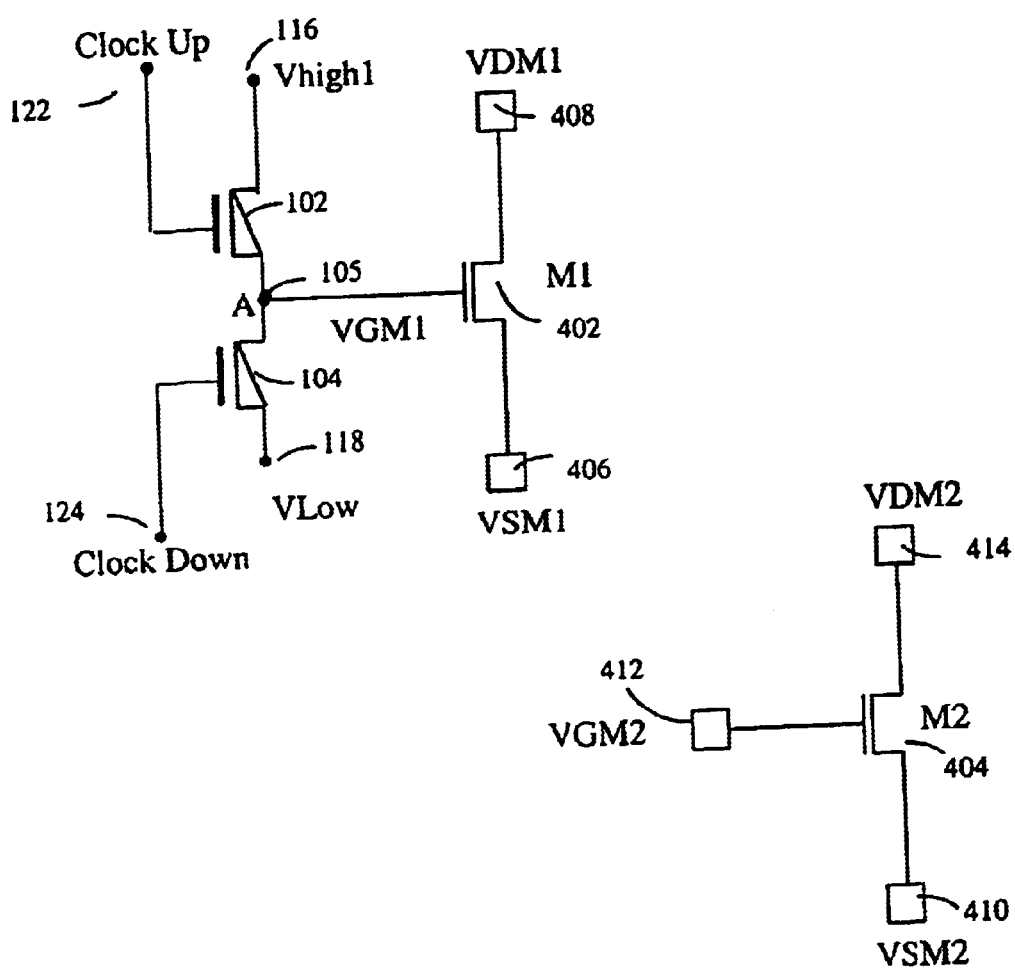
FIG. 4 is a schematic diagram of a test circuit to be used in conjunction with the test circuit in FIG. 1.

FIG. 4 is a schematic diagram of a circuit that can be used in conjunction with the test circuit 100 of FIG. 1. A portion of the test circuit 100 of FIG. 1 is repeated in FIG. 4. The circuit of FIG. 4 can be useful in diagnosing problems in the test circuit of FIG. 1. The circuit of FIG. 4 can be used for measuring the voltages on the internal node 105 of a copy of the test circuit of FIG. 1 (also shown as node 105 in FIG. 4). In FIG. 4, additional transistors 402, 404 have been added to the test circuit of FIG. 1. Preferably, the transistor 404 is electrically identical to the transistor 402. For example, the transistor 404 normally has an identical geometrical structure to that of the transistor 402 and is normally in close proximity to the transistor 402 so that the two transistors 402, 404 experience similar fabrication, temperature, and other processing and environmental effects. As indicated in FIG. 4, the source of the transistor 402 is electrically connected to a probe pad 406 and the drain of the transistor 402 is electrically connected to a probe pad 408. Similarly, the source of the transistor 404 is electrically connected to a probe pad 410, the gate of the transistor 404 is electrically connected to a probe pad 412 and the drain of the transistor 404 is electrically connected to a probe pad 414.

The circuit of FIG. 4 permits determination of the voltage on the internal node 105 of a copy of the test circuit 100 (FIG. 1). The voltage at node 105 can be determined by setting the drain and source voltages of transistors 402, 404 equal to each other. That is, the voltage applied to probe pad 408 is set the same as the voltage applied to probe pad 414 while the voltage applied to probe pad 406 is set the same as the voltage applied to probe pad 410. These voltages may be established using automatic test equipment, for example, during final wafer test, or can otherwise be applied during bench testing. Further, the voltage on the gate of the transistor 404 is varied until the current through transistor 404 matches the current through transistor 402. Once equivalent currents are achieved, since the transistors 402 and 404 and their biasing are substantially identical, then the voltage on the gate of transistor 402 is the same as the voltage applied to the gate of the transistor 404. The voltage on the gate of transistor 404 can be varied, for example, using automatic test equipment, by binary searching the voltage applied at the probe pad 412 until the currents in the transistors 402 and 404 are substantially equal.

In the preferred embodiment, the sense circuit which detects the voltage at node 105 is implemented using on chip devices. If the gate of transistor M1 in FIG. 4 is connected to node 107 in a copy of circuit 100 instead of to node 105, then the resultant circuit can be used to measure the voltage on node 107.

Having knowledge of the voltages on nodes 105 and 107 can be important. For example, when the voltage on the second clocked node 124 is raised to shut off the transistor 108, some of the rise in voltage on node 124 may be connected to node 107 via the gate to source capacitance of transistor 108. The portion of the voltage on node 124 that occurs after transistor 108 is shut off could perhaps in some cases contribute to a perturbation in the voltage on node 107. Due to this perturbation, node 107 may no longer be at a voltage $V_{LOW}$. This deviation from $V_{LOW}$ may perhaps cause errors in the capacitance measured using the techniques described herein. Having knowledge of whether or not the perturbation occurs and knowing the exact amount of perturbation, if any, could lead to ways for counteracting the perturbation.

Figure 5:
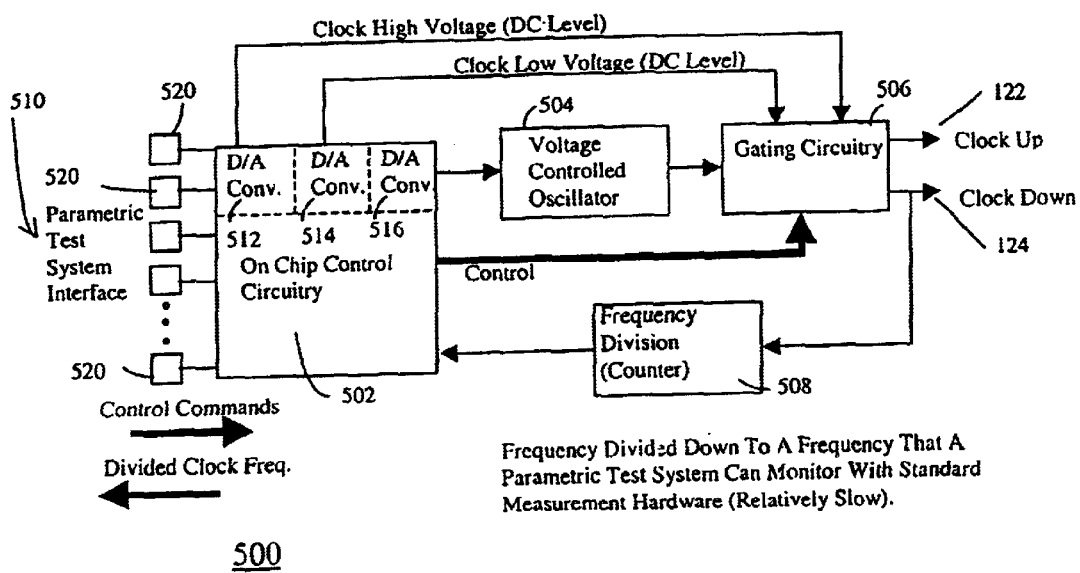
FIG. 5 is a block diagram of a circuit for providing the clocking signals of FIG. 2.

FIG. 5 is a block diagram of a circuit 500 for providing the clocking signals of FIG. 2. This circuit would be used as an alternative to having an automated parametric test system provide the clocking signals required for driving the test circuit of FIG. 1 (on nodes 122 and 124). The circuit 500 includes a control circuit 502, a voltage controlled oscillator (VCO) 504, gating circuitry 506 and a frequency divider 508. Circuit 500 is preferably fabricated on the same semiconductor substrate as the test circuit 100 of FIG. 1.

The control circuitry 502 includes an interface 510 and digital to analog converters (DACs) 512, 514, 516. The interface 510 includes a plurality of probe pads 520 for exchanging signals with an automated parametric test system, external to the semiconductor substrate that includes circuit 500. It is envisioned that, in measurements, probes will contact the probe pads 520 to permit exchange of electrical signals between the external parametric test system and the circuit 500. In the preferred embodiment, interface 510 receives digital signals from the parametric test system and provides digital signals to the parametric test system. In alternative embodiments, analog signals or a combination of analog and digital signals could be used instead of digital signals. The digital signals received from the parametric test system define, for example, the clock high voltage, the clock low voltage, and the period of the clocked signals to be applied to the test circuit 100.

The DACs 512, 514, 516 of the control circuit 502 convert received digital data from the parametric test system interface 510 to analog on-chip levels for use by test circuit 100. DAC 512 converts digital data to a voltage corresponding to $V_{HIGH}$. The DAC 514 converts digital data to a voltage corresponding to $V_{LOW}$. The DAC 516 converts digital data from the parametric test system interface 510 to an analog voltage for controlling the voltage controlled oscillator 504. The voltages $V_{high}$ and $V_{LOW}$ are provided from the DAC 512 and the DAC 514, respectively, to the gating circuitry 506. The voltage controlled oscillator 504, in response to the voltage received from the DAC 516, produces an oscillating signal. This oscillating signal is provided to the gating circuitry 506. The gating circuitry 506 responds to the high voltage DC level and the low voltage DC level received from the DACs 512, 514, respectively and to the oscillating signal received from the voltage controlled oscillator by providing the clocking signals required by the test circuit 100. The outputs of the gating circuitry 506 are the clock signal labeled CLOCK UP (202) and the clock signal labeled CLOCK DOWN (204) in FIG. 2.

For monitoring the clock frequency of the circuit 500, a feedback path is provided to the frequency counter 508. The counter 508 receives the CLOCK DOWN signal from the gating circuitry 506. The counter 508 divides the frequency of the CLOCK DOWN signal down to a lower value. The divided signal is provided to the control circuitry 502 and in turn provided to one of the probe pads 520.

The frequency division counter 508 divides the on-chip frequency of the CLOCK DOWN signal down to a frequency that the parametric test system can monitor with standard measurement hardware. Since typical parametric test systems are designed to operate at dc or at low frequencies, dividing the frequency of the on-chip signal down to a lower value allows the clock frequency of the circuit 500 to be monitored by the parametric test system. The divider 508 provides a means for the parametric test system to monitor the clock frequency of circuit 500 without substantial modification to the parametric test system's hardware or software. Alternatively, a circuit for dividing the on chip frequency down to a more manageable level may be located off chip from the circuit 500. A range of frequency division that is suitable for most applications is division by 10 to 10,000,000.

Often multiple test circuits 100 and their associated devices under test 110 and dummy capacitors 112 can be constructed in smaller spaces on a test wafer than can the probe pads that are required for connecting such circuits to parametric test systems. Accordingly, using just a few probe pads to control many such circuits 100 can be very advantageous from the standpoint of saving space on test wafers and test chips. Moreover, using just a few probe pads to control many test circuits 100 is a likely requirement for economically placing large numbers of capacitance measurement circuits 100 and their associated devices under test and dummy capacitors into product wafer scribe lines (scribe grids). The circuits in FIG. 6 and in FIG. 7 provide methods for controlling large numbers of test circuits 100 with a relatively small number of probe pads.

Figure 6:
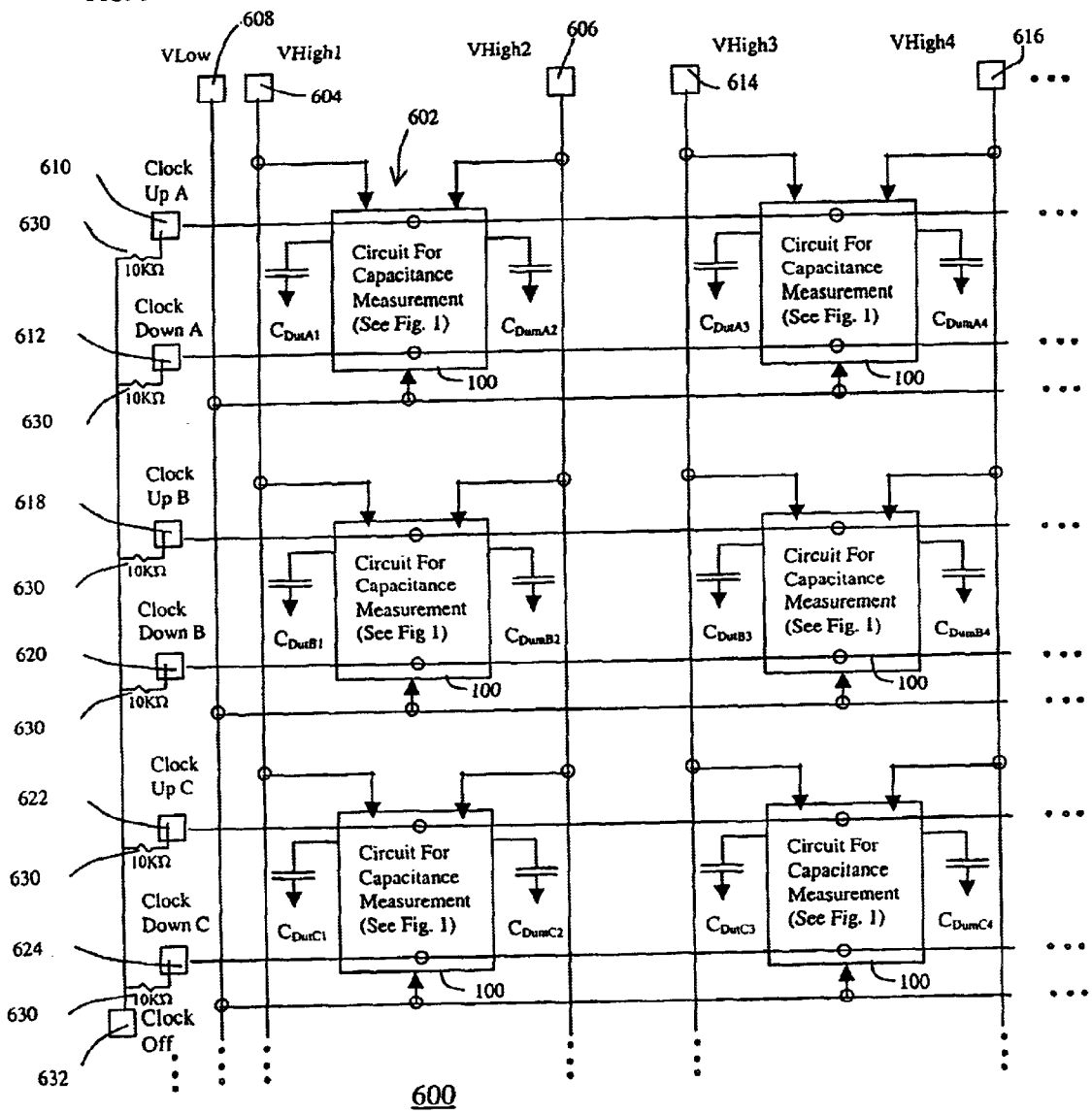
FIG. 6 is a circuit in partial-block, partial schematic form for multiplexing signals to test circuits of an integrated circuit.
Figure 7:
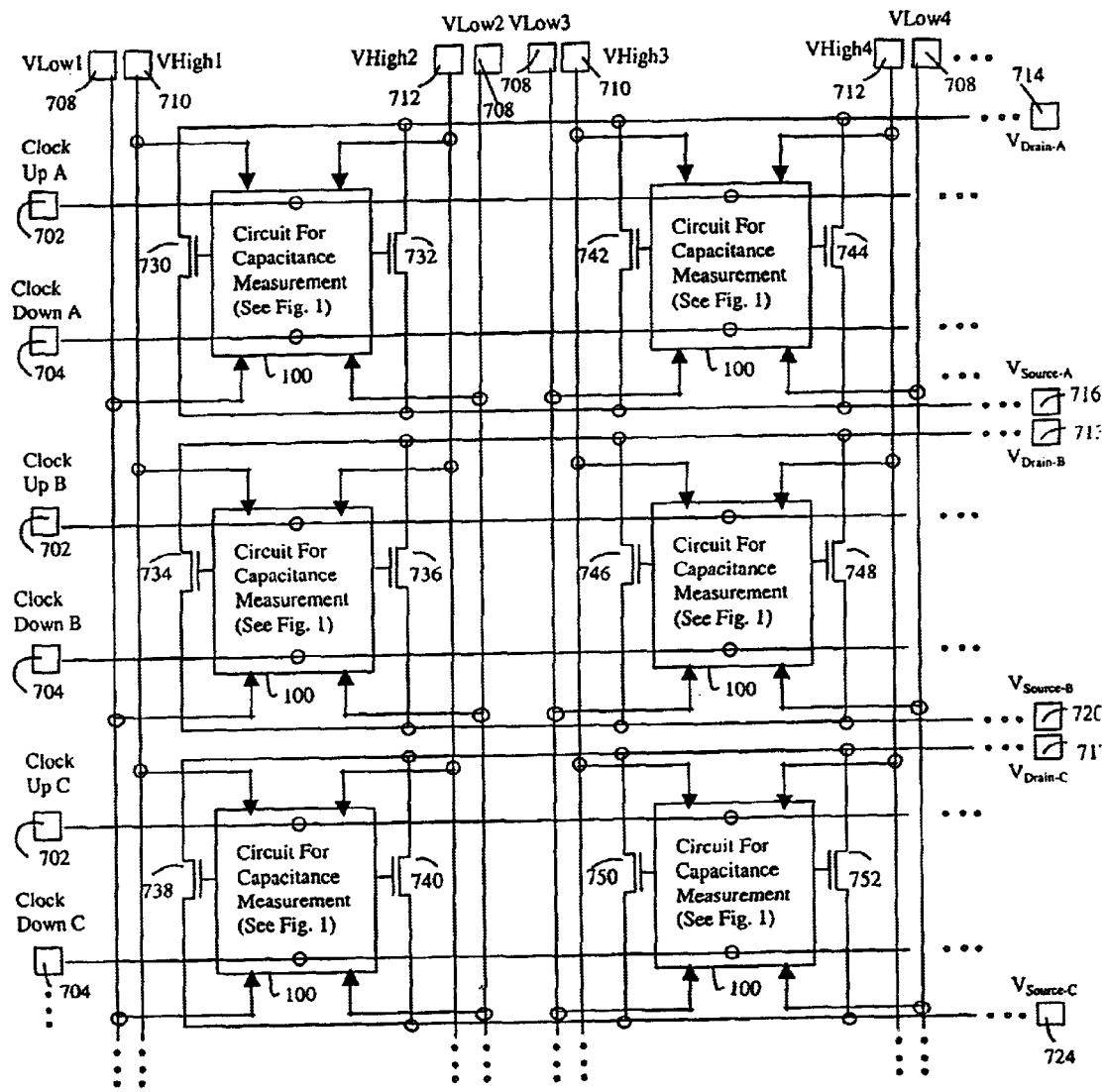
FIG. 7 is an alternative embodiment of the circuit of FIG. 6.

FIG. 6 and FIG. 7 illustrate circuits in partial block, partial schematic form for multiplexing signals to multiple copies of test circuit 100. Each test circuit 100 of FIG. 1 is generally suitable for testing a single device under test 110. However, for characterizing a semiconductor fabrication process or an individual wafer or substrate, many device and circuit parameters should be characterized. These include voltage variable capacitances such as metal-oxide-semiconductor capacitances and reverse biased junction capacitances, as well as voltage invariant capacitances such as interconnect capacitances. For each such capacitance, it may be desirable to characterize different sized devices or different geometries and configurations of interconnect layers. This allows, for example, characterization of capacitance due to device area as well as perimeter. Use of an automatic parametric test system allows application of control signals and collection of large amounts of data for a variety of device parameters through software control of the parametric test system. By having the parametric test system interrogate a large number of test circuits of the form 100, the device and circuit parameters associated with each such test circuit can be characterized. Doing this permits substantially complete characterization of a given technology's device capacitances and a large number of its other device and process parameters.

The embodiments of FIG. 6 and FIG. 7 are two examples of various possible ways for using relatively small numbers of probe pads to control a large number of test circuits 100. Using fewer probe pads saves substantial test chip space. Both FIG. 6 and FIG. 7 illustrate the circuitry and method that allow the sharing of individual test structure probe pads by numerous device test structures, that is multiplexing of test structure probe pads.

In FIG. 6, the multiplexing technique is implemented by connecting numerous copies of test circuit 100 to the same probe pad in a parallel-connected configuration. In the exemplary embodiment of FIG. 6, the test circuits 100 are all substantially identical. Each test circuit 100 is connected to a device under test labeled $C_{DUTA1}$, $C_{DUTB1}$, etc. Each test circuit 100 is substantially implemented and operated as illustrated above in FIG. 1. The test circuits are arranged generally in an array of rows and columns. Each row of test circuits shares a common node for the CLOCK UP signal and a separate common node for the CLOCK DOWN signal. Along columns, each test circuit of a column shares a common node for the bias voltage $V_{HIGH1}$, and a separate common node for the bias voltage $V_{HIGH2}$. In this embodiment, all test circuits 100 share a single separate common node for the bias voltage $V_{LOW}$.

Thus, to activate an individual test circuit merely requires providing appropriate bias voltages at the bias probe pads and providing appropriate clocking signals at the appropriate clocking probe pads. For example, to activate the test circuit 602 and device under test $C_{DUTA1}$ at the top left of FIG. 6, an appropriate bias voltage is applied to the probe pad 604 labeled $V_{HIGH1}$ and another appropriate bias voltage is applied to the probe pad 608 labeled $V_{LOW}$. Similarly, test circuit 602's dummy capacitance $C_{DUMA2}$ can be accessed by applying an appropriate bias voltage to probe pad 606 (labeled $V_{HIGH2}$). In the preferred embodiment $C_{DUTA1}$ and $C_{DUMA2}$ would normally be accessed at separate times. However, with very extensive, extremely accurate and well calibrated measurement equipment, $C_{DUTA1}$ and $C_{DUMA2}$ could be measured simultaneously. With such equipment, all of the devices in a single row could be simultaneously measured; $C_{DUTA1}$, $C_{DUMA2}$, $C_{DUTA3}$, $C_{DUMA4}$, etc.

Continuing with the example of measuring the capacitance Of $C_{DUTA1}$, appropriate clock signals are provided to the clock up probe pad 610 and to the clock down probe pad 612. Appropriate deselect voltages are provided to the circuit's other clocking probe pads, including probe pad 618 labeled Clock Up B and probe pad 620 labeled Clock Down B; and probe pad 622 labeled Clock Up C and probe pad 624 labeled Clock Down C. In the preferred embodiment, the clocking transistors in the test circuit 100 of FIG. 1, transistors 102, 104, 106, and 108 are all p-channel MOSFET's in n-doped wells in a p-doped substrate. Thus, shutting off these transistors and deselecting their circuits 100 in FIG. 6 merely requires setting the transistors' clock probe pads (their gates), Clock Up B, Clock Down B, Clock Up C, and Clock Down C to a positive voltage which is higher in potential than the values of the voltages on the $V_{HIGH1}$ probe pad 604 and the $V_{HIGH2}$ probe pad 606.

In this manner, each test circuit can be uniquely selected to permit characterization of an individual device under test. By identifying the device under test associated with each probe pad combination, a software program routine can be written for a parametric test system to apply the proper voltages to the proper probe pads in the proper sequence with the proper timing to fully characterize each device under test.

The circuit 600 further includes isolation resistors 630 connected between each of the clock probe pads 610, 612, 618, 620, 622, 624, and a clock off probe pad 632. By biasing the common clock off probe pad 632 to a voltage that will deselect the respective test circuits, all of the nodes that control the test circuits may be biased to voltages that will deselect the test circuits. In FIG. 6, the resistors 630 have an exemplary value of 10 KΩ. However, any suitable value may be used.

The measurement structure or test circuit to be selected is selected by biasing two of the common switch nodes so that the switches that they control are turned on and turned off at the appropriate times during measurements. For example, Clock Up B probe pad 618 and Clock Down B probe pad 620 can be selected to activate one of the test circuits 100 in the second row of the circuit 600 of FIG. 6. The Clock Off probe pad 632 is biased to a voltage that is appropriate to shut off all of the deselected test circuits 100 that do not have their Clock Up and Clock Down nodes biased otherwise. In this example it is assumed that the switch transistors 102, 104, 106, and 108 of circuit 600's copies of circuit 100 are all p-channel enhancement transistors. As such, a sufficient positive voltage applied to the Clock Off probe pad will deselect all of the test circuits 100 except for the one that is selected. The Clock Off probe pad is connected through resistors 632 to the gates of transistors 102, 104, 106, and 108 in circuit 600's copies of circuit 100. This deselect voltage applied to the Clock Off probe pad must be more positive than the voltages applied to the various VHigh1, VHigh2, etc probe pads. The clocking voltages applied directly to the Clock Up B probe pad 618 and to the Clock Down B probe pad 620 overcome the deselect voltage that would otherwise be applied to the two probe pads by the resistors 630 connected to Clock Off probe pad 632.

In this manner, test circuits using multiplexed $V_{HIGH}$ and $V_{LOW}$ probe pads can be clocked with just five probes. A first probe is placed on the Clock Off probe pad 632. A second and a third probe are placed on the Clock Up and Clock Down probe pads of the test circuit to be interrogated. Two probes are used to bias the $V_{LOW}$ probe pad, the appropriate $V_{HIGH}$ probe pad, and to measure the current into the $V_{HIGH}$ probe pad. This method is very helpful when bench testing is accomplished with a limited number of individual probes, i.e., without a probe card or without an automated parametric test system. Alternatively, of course, any suitable method of electrically stimulating and sensing the circuit 600, such as by bonding out the probe pads to a ceramic or plastic package containing the integrated circuit, may be used.

In an alternative embodiment, the resistors 630 of FIG. 6 may be implemented as transistors. In one embodiment, p-channel transistors with long narrow channels are employed with the transistor gates connected to their respective Clock Up and Clock Down nodes. These p-channel transistors are fabricated in n-doped wells in the semiconductor substrate. Similarly, a p-well technology could just as well use n-channel transistors in p-wells. Still further, a test circuit 100 to be interrogated could be selected by turning on and turning off appropriate isolation transistors that are implemented in series with the test structures. The isolation transistors could be controlled by on chip circuitry, off chip circuitry or a combination of the two. For example, each test circuit 100 may have a set of logic signals corresponding to an address which is unique among the addresses of all the test circuits in the circuit 600. By providing the appropriate logic signals to be decoded as the address of a unique test circuit 100, that test circuit may be activated or interrogated.

In another alternative embodiment, the circuit of FIG. 6 could be altered to eliminate additional probe pads. Specifically all but one of the clock down probe pads can be eliminated. Clock Down A pad 612, Clock Down B pad 620, Clock Down C pad 624, etc. could all be connected to one common probe pad. Individual rows of circuits 100 could be deselected by setting the Clock Up probe pad for each deselected row to a voltage that would turn off the transistors 102 and 106 in the deselected test circuits 100 (see FIG. 1 for transistor designations). In this example, as in that above, the transistors 102 and 106 are p-channel transistors and shutting them off in deselected circuits would require a positive voltage applied to their Clock Up probe pads. This voltage would be high and positive relative to the voltage applied to the $V_{HIGH1}$ probe pad of the selected circuit 100 and the $V_{HIGH2}$ probe pad of the selected circuit 100. As with the circuit shown in FIG. 6, the particular device under test capacitor or dummy capacitor ($C_{DUT}$ or $C_{DUM}$) to be chosen from among the capacitors on a selected row of circuits 100, is selected by merely applying voltage $V_{HIGH}$ to the appropriate $V_{HIGH1}$, $V_{HIGH2}$, or $V_{HIGH3}$, etc. probe pad and then measuring the current into that probe pad.

FIG. 7 is an example of a circuit that can be used similarly to the circuit in FIG. 6 to employ a relatively small number of probe pads to provide a method for characterizing a large number of device under test capacitors and dummy capacitors. The circuit 700 of FIG. 7, however, is applied specifically to the characterization of capacitances which are portions of various transistors (in this example MOSFET's such as those used in CMOS products). In addition to some of the ways that the circuit in FIG. 6 can alleviate space consuming probe pads, the circuit of FIG. 7 minimizes the number of drain and source probe pads that are necessary for correctly biasing the MOSFET's that form the device under test capacitors and the dummy capacitors. A circuit that is used for measuring the gate capacitances of MOSFET's must provide for the DC biasing to various choices of voltages of the transistor gates, drains, and sources while gate capacitance is being measured. Further, the circuit must provide for the DC biasing of each transistor's gate, the biasing of each transistor's drain, the biasing of each transistor's source, and the measurement of the drain current into each transistor with biases applied. The circuit 700 of FIG. 7 fulfills these requirements while also reducing the number of probe pads that the circuit requires.

As in FIG. 6, the test circuits 100 of FIG. 7 are arranged generally in an array or matrix of rows and columns. Each test circuit 100 is associated with a device under test 730, 734, 738, 742, 746, 750, etc. and with a dummy device 732, 736, 740, 744, 748, 752, etc. Selecting a specific device to characterize can be accomplished by applying appropriate clocking signals to the clock up and clock down nodes associated with the row of test circuits in which the selected device resides, applying appropriate inhibiting voltages to the clock up and clock down nodes associated with the rows of the other test circuits, applying appropriate voltages to the VLow and VHigh nodes, such as nodes 708, 710, etc. associated with the column of devices under test or dummy devices that the selected device resides in, applying inhibit voltages to the VLow and VHigh nodes of the other columns of devices and then applying voltages to the drain and source nodes of the row of devices that the device resides in.

These concepts can best be understood through two general examples. The first example will be of an embodiment of a method for measuring the DC drain current through n-channel MOSFET 746 (a device under test transistor) in FIG. 7 while the transistor is undergoing DC biasing. The second example will illustrate a method for measuring the capacitance of the gate of the same transistor while the transistor is undergoing an effective average DC gate bias, a drain bias and a source bias. In these embodiments, all of the device under test transistors and dummy transistors of FIG. 7 are assumed to be fabricated in the technology's p-doped substrate. Transistors in doped wells and in other types of substrates could also be characterized in this same general fashion. Further the examples assume that the transistors 102, 104, 106, and 108 in the test circuits 100 (of FIG. 1) shown in the circuit 700 of FIG. 7 are all p-channel MOSFET transistors in n-doped wells in a p-doped substrate technology.

For example, the DC drain current characteristics of transistor 746 can be measured through applying the following biases to the circuit 700 of FIG. 7. An appropriately large negative voltage is applied to the Clock Up B probe pad (node 702) and the voltage that is desired to be applied to the gate node of transistor 746 is applied to the VHigh3 probe pad (node 710). This combination of biases will cause the transistor 106 of the circuit 100 associated with transistor 746 to turn on and pass the chosen gate voltage to the gate of transistor 746. Alternatively, an appropriately large negative voltage could be applied to the Clock Down B probe pad (node 704) and the voltage that is desired to be applied to the gate node of transistor 746 would be applied to the VLow3 probe pad (node 708). This combination would pass the chosen gate voltage through the 108 transistor of the same test circuit 100. Continuing with the first example, an appropriately large negative voltage would be applied to the other VHigh probe pads (VHigh1, VHigh2, VHigh4, etc.) in order to turn off unselected transistors 734, 736, 748, etc. Then the desired drain and source voltages would be applied to the drain and source probe pads $V_{Drain-B}$ (node 713) and $V_{Source-B}$ (node 720), respectively. Finally the drain current of transistor 746 would be measured as the current flowing into the drain probe pad $V_{Drain-B}$ (node 713). The current flowing into $V_{Drain-B}$ (node 713) can only pass from the drain to the source of transistor 746 because the VHigh or VLow biasing associated with the other transistors on transistor 746's row has turned off all of the transistors on that row except for transistor 746.

In a second example, the gate capacitance of device under test transistor 746 and the parasitic capacitances associated with that gate node can be measured through applying the following biases and signals to the circuit 700 of FIG. 7. Signals as described in the discussion of FIG. 1 and FIG. 2 are applied to the Clock Up B probe pad (node 702) and to the Clock Down B probe pad (node 704). Appropriate high positive voltages are applied to the non-selected row Clock Up and Down nodes (Clock Up A, Clock Down A, Clock Up C, Clock Down C, etc.) in order to turn off transistors 102, 104, 106, and 108 of circuits 100 on the unselected rows. In this way, the only current path that current traveling into the VHigh3 node (710) can travel is through transistors 106 and 108 of the test circuit 100 associated with the gate of transistor 746. As described in the discussions of FIG. 1 and FIG. 2, appropriate voltages are applied to the VHigh3 node and the VLow3 node and the current flowing into the VHigh3 node is measured in order to determine the sum of the gate capacitance of transistor 746 and the parasitic capacitance associated with the rest of transistor 746's gate node. Equating this result with similar results from transistors having other channel widths and channel lengths provides a way to determine, for example, the capacitance per unit area of the gate of a typical transistor. More examples extracting various transistor parameters will be discussed below in conjunction with discussions of specific transistor related device structures.

It is important to note that FIG. 7 is only one possible embodiment of ways to reduce the number of probe pads required for test structures that are designed for measuring transistor gate capacitances. As with the circuit of FIG. 6, the number of probe pads used by circuit 700 (FIG. 7) can be further reduced by connecting all of the circuit's Clock Down nodes together to one common clock down node probe pad.

Consider again the example of measuring DC drain current. In this case however, the clock down nodes of circuit 700 would be linked to a single common probe pad. In this arrangement, the various Clock Up nodes would be used to gate appropriately large negative DC voltages from the unselected column VHigh nodes into the gates of the unselected transistors 730, 734, 736, 738, 740, 742, 744, 746, 748, 750, 752 in order to turn off the unselected transistors. With the clock down nodes linked together the DC current into the drain of transistor 746 could, for example, be measured through the second row's drain node ($V_{Drain-B}$, 713) by biasing the common clock down node to an appropriately high positive voltage (turning off transistors 108 and 104 on all test circuits 100 of FIG. 7), biasing all clock up nodes to an appropriately large negative voltage (and turning on all transistors 106 and 102), applying an appropriate large negative voltage to the unselected column VHigh nodes (turning off all unselected transistors 730 through 752), and applying the desired voltage to the gate of transistor 746 via the VHigh3 node and transistor 746's associated transistor 106.

In the common clock down node scheme, the gate capacitance of transistor 746 can be measured by blocking current from passing through transistors 106 of the test circuits associated with transistors 742, and 750, etc. This current blocking is brought on by applying appropriately large positive voltages to nodes Clock Up A, and Clock Up C, etc. In this way, current from the node VHigh3 can only pass through transistor 106 of the test circuit 100 associated with transistor 746.

Figure 8:
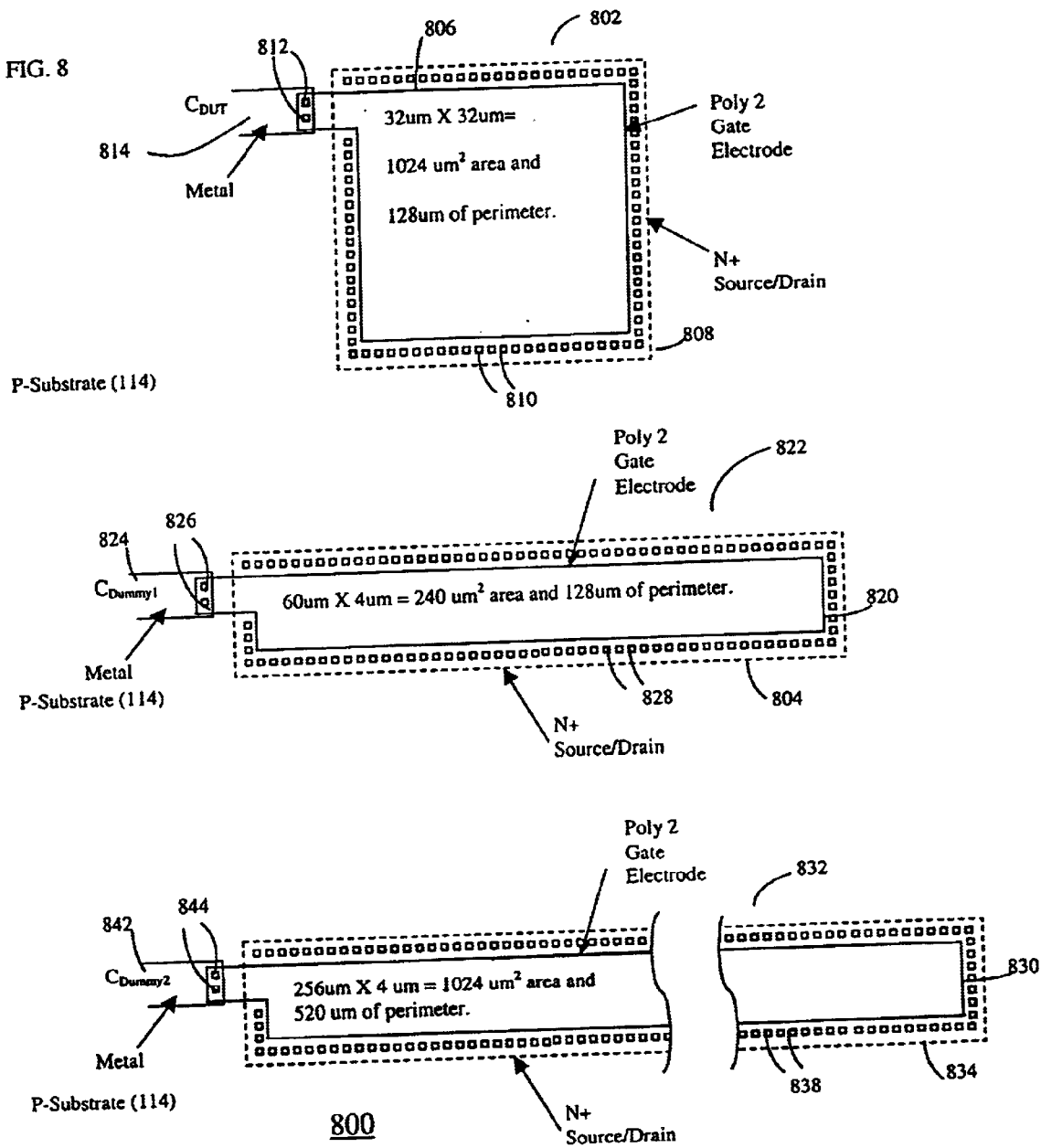
FIG. 8 is a schematic diagram of exemplary device layouts of on-chip capacitors for measuring device parameters in conjunction with the test circuit of FIG. 1.

FIG. 8 illustrates one example of a set of test capacitors 800 that can be used for characterizing the gate capacitance of a given type of metal oxide semiconductor field effect transistor (MOSFET). The test capacitors 800 include a first capacitor 802, a second capacitor 822 and a third capacitor 832. In this embodiment, capacitor 802 is substituted for the $C_{DUT}$ capacitor 110 in a first copy of test circuit 100. Capacitor 822 is substituted for the $C_{Dummy}$ capacitor 112 in the first copy of test circuit 100. Capacitor 832 is substituted for the $C_{DUT}$ capacitor 110 in a second copy of test circuit 100. In all cases, the gate nodes 814, 824, and 842 of the capacitors shown in FIG. 8 would be connected to the appropriate choices of nodes 105 for capacitor 802 and capacitor 832 or node 107 for capacitor 822. In this example, the N+ source/drain node of each capacitor is connected to a probe pad or other electrical connection not shown in FIG. 8.

In this example, the capacitors 802, 822, and 832 are formed as n-channel capacitors in the p-doped substrate of an N-well in p-substrate CMOS process technology. Capacitor 802 has source/drain diffusion 808 connected to metal (not shown) via contacts 810 and also has the substrate node. Capacitor 802 has gate poly silicon 806 connected to metal via contacts 812. The capacitor's poly silicon gate and source/drain are separated by one of the technology's various gate dielectrics such as a thin layer of silicon dioxide. Similarly, capacitor 822 has source/drain diffusion 804 connected to metal (not shown) via contacts 828 and also has the substrate node. Capacitor 822 has gate poly silicon 820 connected to metal via contacts 826. The capacitor's poly silicon gate and source/drain are separated by one of the technology's various gate dielectrics such as a thin layer of silicon dioxide. Capacitor 832 has source/drain diffusion 834 connected to metal (not shown) via contacts 838 and also has the substrate node. Capacitor 832 has gate poly silicon 830 connected to metal via contacts 844. The capacitor's poly silicon gate and source/drain are separated by one of the technology's various gate dielectrics such as a thin layer of silicon dioxide.

In the simplest embodiment, all of these source/drain connections are connected to probe pads to allow connection to the probes associated with an automated parametric test system. The substrate is also connected to a probe pad. The switching portion of test circuit 800 is identical to the switching portion of test circuit 100 of FIG. 1 (the VHigh1 node 120, VHigh2 node 116, Clock Up node 122, Clock Down node 124, the VLow node 118, and transistors 102, 104, 106, and 108). The biasing and capacitance measurement procedure for test circuit 800 largely parallels that described above in conjunction with test circuit 100 of FIG. 1.

Test circuit 800 of FIG. 8 allows the source/drains 808, 804 and 834 of capacitors 802, 822 and 832 to be biased during gate capacitance measurement. As pointed out in the discussion of test circuit 100 of FIG. 1, appropriately biasing the VHigh2 node and the VLow node allows an effective average DC bias to be applied to node 105 during capacitance measurement. In this case, node 105 of the first copy of test circuit 100 is the gate electrode of MOS capacitor 802. Similarly, the gate of MOS capacitor 822 can be biased during capacitance measurement via appropriate biasing of VHigh1 and VLow of the first copy of the test circuit 100. Similarly, the gate of MOS capacitor 832 can be biased during capacitance measurement via appropriate biasing of VHigh2 and VLow of the second copy of the test circuit 100.

In this way, during gate capacitance measurement, the source/drain, gate, and substrate of each MOS capacitor 802, 822 and 832 can be separately biased to any level that would normally be appropriate for such capacitors and the MOSFET's that they are associated with in the given technology. For example, MOS capacitor 802's gate capacitance can be measured with the capacitor's semiconductor surface operating in an accumulated mode (VGS<0), in depletion ($V_{FlatBand}$<VGS<$V_{Threshold}$), or in inversion ($V_{Threshold}$<VGS).

By appropriately choosing the geometries of capacitors 802, 822, and 832, test capacitors 800 can be developed which can lead to the determination of various MOS capacitor capacitance parameters, transistor capacitance parameters, and various general transistor parameters. In the example shown in FIG. 8, the main rectangular portion of capacitor 802 is 32 micrometers (um) by 32 um with an area of 1024 $um^2$ and a perimeter of 128 um. The main rectangular portion of capacitor 822 is 60 um by 4 um with an area of 240 $um^2$ and a perimeter of 128 um. The main rectangular portion of capacitor 832 is 256 um by 4 um with an area of 1024 $um^2$ and a perimeter of 520 um. Capacitors 802, 822 and 832 are normally created using the same gate insulator thickness and gate dielectric material. Using dimensions such as these brings about cancellations of the area components of gate capacitance and of the perimeter components of gate capacitance when measured capacitances from the various capacitors in 800 are subtracted from one another. The gate areas of capacitors 802 and 822 are different by 784 $um^2$ but their gate perimeter lengths are equal at 128 um. When the result of measuring the gate capacitance of capacitor 822 is subtracted from the result of measuring the gate capacitance of capacitor 802, the resultant difference is the gate to channel region capacitance due to substantially 784 $um^2$ of pure gate to channel region (without any perimeter component or gate to source/drain overlap or fringing fields involved). It is important to note that the specific shapes of capacitor 802 and capacitor 822 are constructed so that non-ideal effects will cancel when the capacitances are subtracted. Both capacitors have three gate corners over their respective source/drain regions. Both capacitors have gate to metal connections which are identical in shape. The same cancellations hold true for the capacitor 832. When the capacitance of capacitor 832 is subtracted from the capacitance of capacitor 802, the capacitance due to substantially 392 um of perimeter results. MOSFET's having the same gate, source, and drain processing as these capacitors will have gate to source and gate to drain capacitances per micrometer of source and drain width that will be the same as this perimeter capacitance.

It is important to note that many critical process parameters and device parameters can be derived from the capacitance versus voltage characteristics that these structures can provide. Among these parameters are threshold voltages versus source to substrate or source to well bias, flat band voltages, information on charge trapping, gate oxide capacitance, information on gate oxide purity, depletion region capacitance and thickness, information on transistor channel doping density, transistor gate to drain and gate to source fringing field capacitances, etc.

Figure 9:
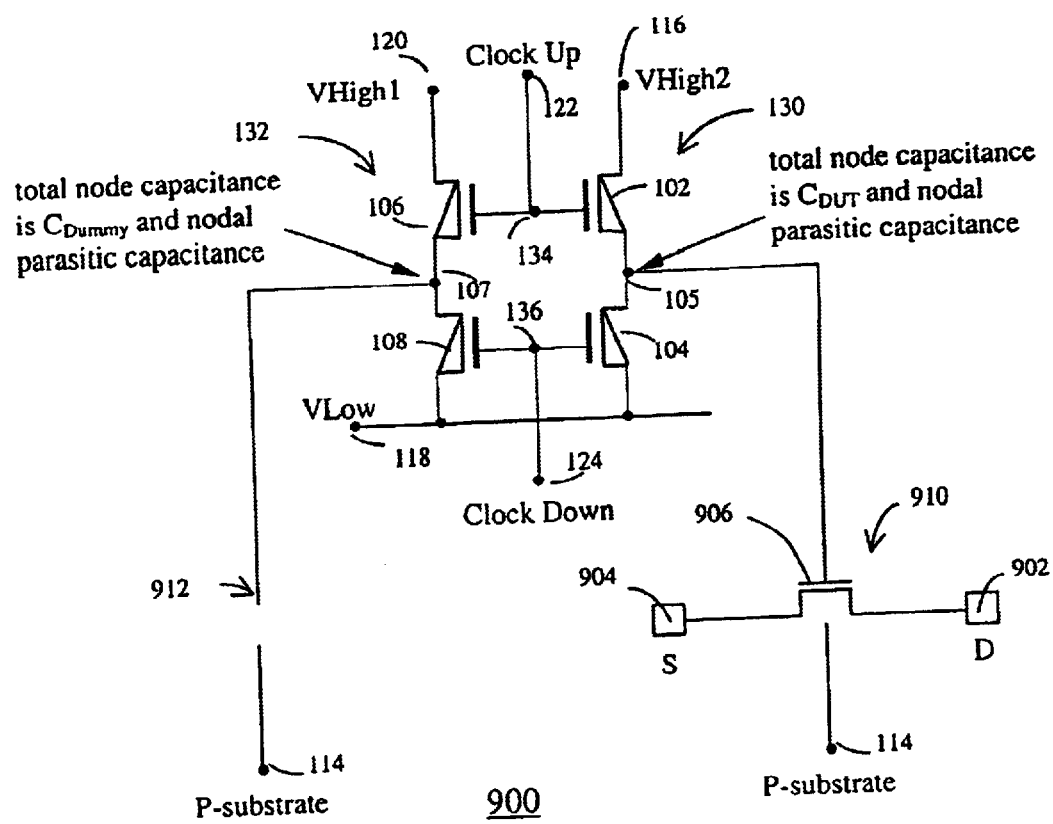
FIG. 9 is a schematic diagram of an exemplary on-chip circuit which uses the test circuit of FIG. 1 for measuring the gate capacitance and other device parameters of a common MOSFET transistor.

FIG. 9 illustrates one example of an application of the test circuit 100 of FIG. 1 in which the device under test capacitance 110 is replaced in a test circuit 900 with MOSFET transistor 910 (Metal Oxide Semiconductor Field Effect Transistor). In this configuration the gate 906 of transistor 910 is connected to node 105 and will allow the test circuit 900 to measure the sum of the gate capacitance of transistor 910, the parasitic capacitance associated with the interconnect to the gate of 910 and the other parasitic capacitances associated with node 105. The drain of transistor 910 is connected to probe pad 902 and the source of the transistor is connected to probe pad 904. For this example, the transistor is an n-channel enhancement transistor that resides in the p-doped substrate 114.

In test circuit 900, the dummy capacitance 112 of the test circuit 100 is replaced with a copy, 912, of the interconnect to the gate 906 of transistor 910. In the various embodiments of this circuit, this copy of transistor 910's gate connection can be made to contain more or less parts of the interconnect to 910 and more or less parts of the gate of transistor 910. These choices depend upon which parts of the gate capacitance of transistor 910 are desired to be measured. In one embodiment, for example, the dummy capacitor 912 contains only a copy of the metal line to the gate of 910. In another, 912 contains a copy of the metal line to the gate of 910, a copy of the small portion of the gate poly silicon that the metal line is connected to, and copies of the contacts that connect the metal line to the gate. In these example embodiments, the contacts to the poly silicon gate do not reside over the channel of the transistor but instead make contact to a portion of the poly silicon gate which is fabricated over thick oxide, for example the field oxide over the substrate adjacent to the transistor, normally much thicker than the transistor's gate oxide.

Following procedures described in conjunction with the discussion of FIG. 1 and FIG. 2, the gate capacitance of the transistor 910 can be characterized over a range of effective average DC gate voltages. The capacitance of interconnect 912 is also characterized and transistor 912's measured capacitance is subtracted from the capacitance deriving from the measurement of transistor 910's gate capacitance. In this way, the capacitance of transistor 910's gate can be separated from the capacitance of 910's gate interconnect and from the parasitic capacitances associated with node 105. The pure gate capacitance of transistor 910 can be determined. Further, using this method, the gate capacitance characteristic of transistor 910 can be determined for a range of gate voltages (negative to positive) and under various conditions of drain bias and source bias.

Figure 10:
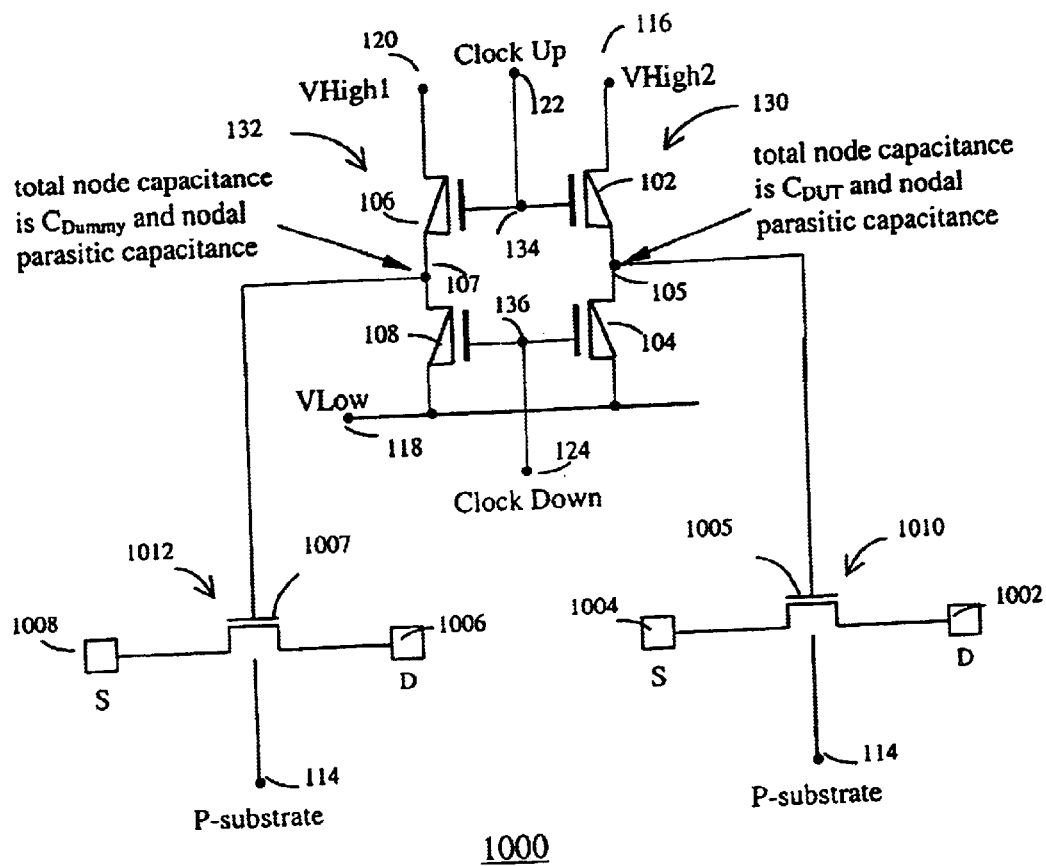
FIG. 10 is a schematic diagram of a second exemplary on-chip circuit which uses the test circuit of FIG. 1 for measuring the gate capacitance and other device parameters of two different geometries of common MOSFET transistors.

FIG. 10 is an illustration of a circuit 1000 for measuring various aspects of gate capacitance of a MOSFET. The circuit 1000 of FIG. 10 is very similar to the circuit 900 of FIG. 9. The device under test capacitance of circuit 1000, transistor 1010 is very similar (perhaps the same as) transistor 910 in the circuit 900 of FIG. 9. FIG. 10 continues the concept of adding more portions of the device under test transistor to the dummy capacitor. In the case of test circuit 1000, the dummy capacitor is a complete transistor. In this embodiment, the dummy transistor 1012 has a channel length or a channel width which differs from the dimensions of the device under test transistor 1010. In the case of test circuit 1000, there are not strong reasons for referring to either device 1012 or 1010 as dummy or device under test. Devices 1010 and 1012 are each full transistors. Normally, transistor 1010 and transistor 1012 have different channel lengths or different channel widths.

A number of versions of the circuit 1000 of FIG. 10 can be used in order to provide for the comparison of the capacitances of a number of devices. Purposely forming each device with a different geometry can lead to the determination of various device parameters. Comparing the capacitances of devices having varying channel lengths, L (for example, a set of devices with width to length ratios of 20 um/10 um, 20 um/5 um, 20 um/2 um, and 20 um/1 um), can lead to the determination of gate to channel capacitance per unit length of channel for a given channel width (20 um in this case). Comparing this information with that garnered from another set of devices having the same channel lengths as the first set, L, but having a different channel width, W, (for example, a set of devices with width to length ratios of 5 um/10 um, 5 um/5 um, 5 um/2 um, and 5 um/1 um), can lead to a determination of gate to channel capacitance per unit area. Such analysis can also lead to a determination of the capacitances associated with the edges of transistor channels (the edges parallel to the flow of current). Other combinations of geometries can also lead to the determination of the capacitances from the gates to the drains and gates to the sources of the transistors.

For example, the gate capacitances of transistors of various channel widths but having the same channel length can be compared to determine the combined gate to channel, gate to source, and gate to drain capacitances of a strip of transistor stretching from the drain to the source. This strip does not include the effects of the field edges of the channel. The field edges are the edges of the channel parallel to current flow. Having several groups of transistors of this sort, each group with its own common channel length, can lead to a determination of the gate to source and gate to drain capacitance of a given type of transistor. Part of this determination involves measuring the gate capacitances of the various transistors under several bias conditions. These conditions include channel in accumulation, in depletion, and in inversion.

As with transistor 910 of the circuit 900, transistors 1010 and 1012 each have drains and sources connected to probe pads. These probe pads enable the biasing of the transistors into their various operating modes (for n-channel transistors; accumulation with the gate to source voltage well below threshold voltage and the transistor turned off; depletion with the gate to source voltage somewhat below threshold voltage and the transistor turned off but near turn on; inversion in saturation with the gate to source voltage above threshold voltage and the transistor turned on but with the gate voltage below the drain voltage; and inversion in linear with the gate to source voltage above threshold voltage and the transistor turned on with the gate voltage above the drain voltage).

Using appropriate combinations of the circuits 800, 900 and 1000 (having appropriate choices of capacitor and transistor geometries) can lead to the full characterization of gate to accumulated channel capacitance, gate to inversion layer capacitance, gate to channel depletion region capacitance, gate to source capacitance, and gate to drain capacitance. The circuits 800, 900, and 1000 can be applied to all types of MOSFET transistors (residing in various substrates, doped wells, and having various types of source and drain doping and channel doping), MESFET transistors (Metal Semiconductor Field Effect Transistors), JFET transistors (Junction Field Effect Transistors), bipolar junction transistors (in which the base is used as the node whose primary capacitance is to be measured, and in which the transistor is biased so that the device will remain turned off), and any other types of devices in which the devices' switch control nodes (gates, bases, etc.) are maintained in a largely insulating mode.

It is important to note that all of the features and advantages of the circuits 900 and 1000 can also, if desired, be incorporated into the multiplexing circuit 700 of FIG. 7. The features of test circuit 800 can also be incorporated into the multiplexing circuit of FIG. 6.

Further, the circuits 900 and 1000 of FIG. 9 and FIG. 10 could be expanded to use numbers of identical transistors in parallel with one another for the circuit's device under test transistor, and for the circuit's dummy transistor. For example, device 910 in circuit 900 could be replaced with a number of devices identical to device 910 connected to one another in an electrically parallel arrangement. These parallel devices would have their common gate connected to node 105. The devices would share a common drain probe pad, a common source probe pad, and a common substrate probe pad the common substrate probe pad is normal for most test structures. The advantage of this common transistor arrangement is that it increases the amount of capacitance that each circuit is to measure and thus increases the accuracy of each measurement.

Figure 11:
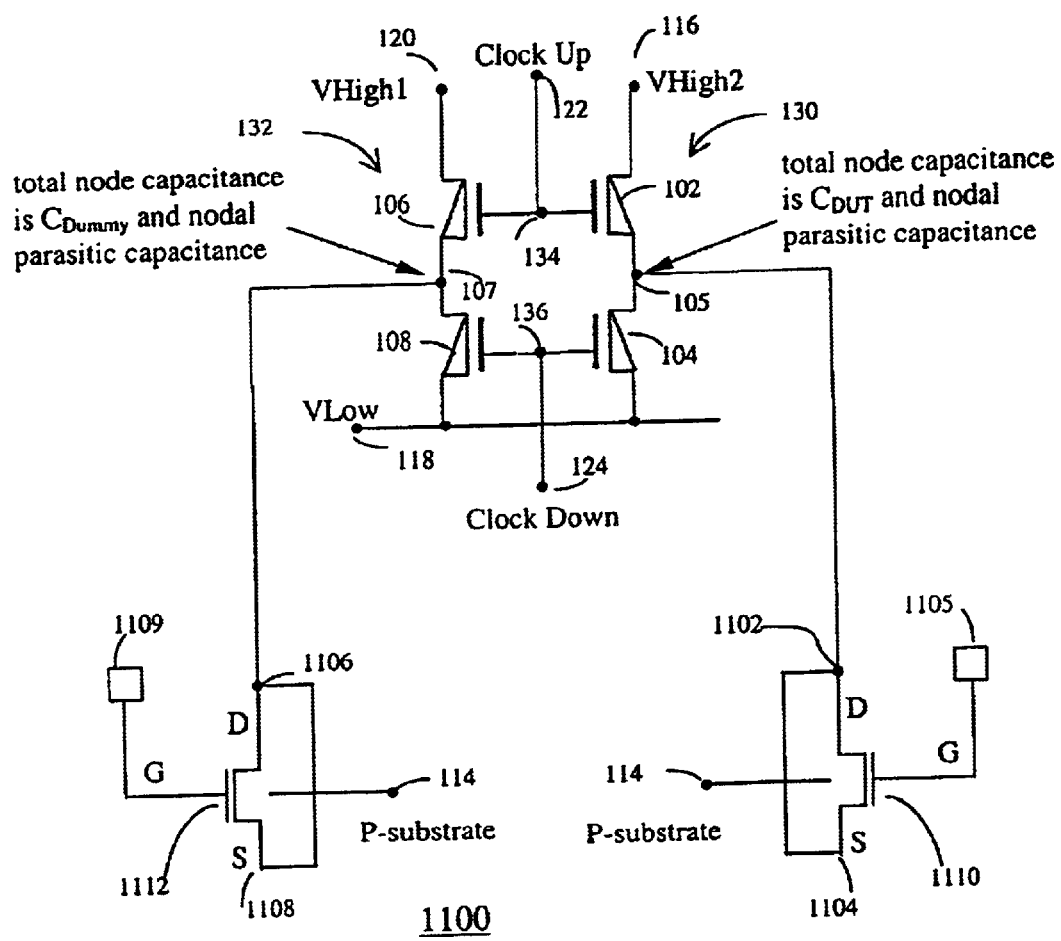
FIG. 11 is a schematic diagram of a second exemplary on-chip circuit which uses the test circuit of FIG. 1 for measuring the drain to gate capacitances, drain to substrate capacitances, source to gate capacitances, source to substrate capacitances, and other device parameters of two different geometries of common MOSFET transistors.

FIG. 11 illustrates one example of an application of the test circuit 100 of FIG. 1 in which the device under test capacitance 110 is replaced with MOSFET transistor 1110 (Metal Oxide Semiconductor Field Effect Transistor) and the dummy capacitance 112 is replaced with MOSFET transistor 1112. In this configuration, the drain and source of transistor 1110 are connected to node 105 and allow the test circuit 1100 to measure the sum of the drain capacitance of transistor 1110, the source capacitance of transistor 1110, the parasitic capacitance associated with the interconnect to the drain and source of 1110 and the other parasitic capacitances associated with node 105. The gate of transistor 1110 is connected to probe pad 1105. In this embodiment, the transistor is an n-channel enhancement transistor that resides in the p-doped substrate 114. The drain and source of transistor 1112 are connected to node 107 and allow the test circuit 1100 to measure the sum of the drain capacitance of transistor 1112, the source capacitance of transistor 1112, the parasitic capacitance associated with the interconnect to the drain and source of 1112, and the other parasitic capacitances associated with node 107. The gate of transistor 112 is connected to probe pad 1109. The transistor is also an n-channel enhancement transistor that resides in the p-doped substrate 114.

Figure 12:
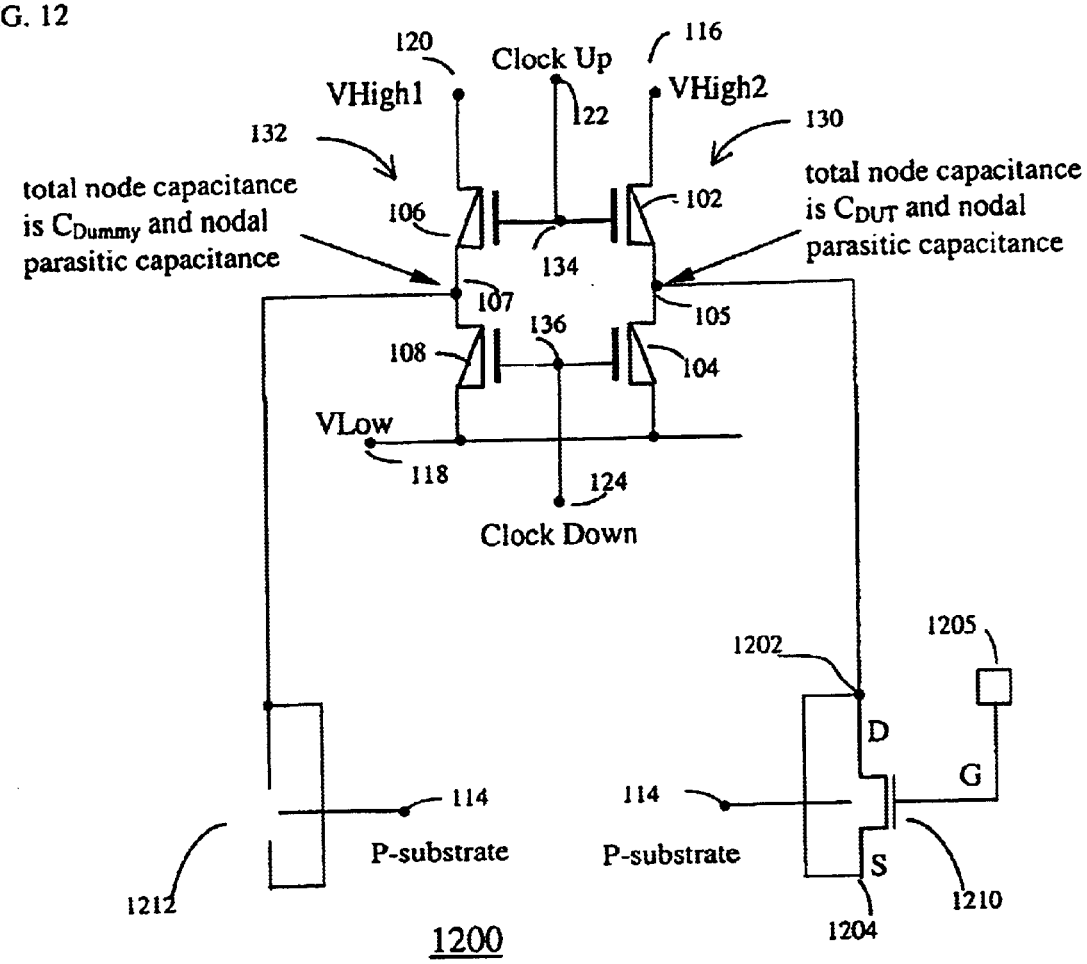
FIG. 12 is a schematic diagram of an exemplary on-chip circuit which uses the test circuit of FIG. 1 for measuring the drain to gate capacitance, drain to substrate capacitance, the source to gate capacitance, source to substrate capacitance, and other device parameters of a common MOSFET transistor.

Additionally, in analogy to circuit 900 of FIG. 9, transistor 1112 in circuit 1100 can be removed and replaced with a copy of the interconnect from node 105 to the source and drain of transistor 1110. Doing this creates the circuit 1200 shown in FIG. 12. For this example, transistor 1210 in circuit 1200 is similar in type and function to transistor 1110 in circuit 1100. Again in analogy to circuit 900, circuit 1200 of FIG. 12 provides a way to separate the value of transistor 1210's source and drain capacitance from the parasitic capacitances associated with node 105 and from the parasitic capacitance associated with the interconnect leading to the source and drain of transistor 1210.

In analogy to the example procedures discussed in conjunction with circuits 900 and 1000, various transistor geometries can be used in conjunction with circuits 1200 and 1100 to provide ways to determine numerous important device parameters. Being able to measure the capacitances associated with the sources and drains of these transistors (1210, 1110, and 1112) while simultaneously being able to apply bias voltages to the transistors' drains and sources, and to their gates allows the determination of the effects on source capacitance, drain capacitance, inversion layer to gate capacitance, and inversion layer to substrate capacitance of various modes of transistor bias. Among the possible biasing modes for the transistors of circuits 1200 and 1100 are: accumulation with the gate to source voltage well below threshold voltage and the transistor turned off; depletion with the gate to source voltage somewhat below threshold voltage and the transistor turned off but near turn on; and inversion in linear with the gate to source voltage above threshold voltage and the transistor turned on.

Also in analogy to the methods employed with circuits 900 and 1000, multiple copies of circuits 1200 and 1100 can be used to determine numerous device parameters. Each copy would employ unique geometries of transistors to be characterized. The various transistor geometries allow the determination of device capacitances as functions of transistor widths and lengths. Moreover, characterizing numerous device sizes allows the determination of the capacitances associated with each of the various portions of a device.

For example, the gate of transistor 1210 is biased so that the transistor is in accumulation. Then the capacitances connected to node 107 and to node 105 are each measured. Subtracting the two capacitances yields the capacitance from the source 1204 and the drain 1202 of transistor 1210 to the transistor's gate 1205 and to the substrate 114. Doing this same measurement, but with the gate of 1210 biased so that 1210 is in inversion, yields the combined capacitance of the source and drain to the gate and to the substrate along with the capacitance from the inversion layer to the gate and the inversion layer to the substrate. Doing this procedure for various sizes of transistors and comparing the results leads to the combined capacitance from the inversion layer to the gate and to the substrate. Knowing the gate to inversion layer capacitance from using the circuits 900 and 1000 as described above, allows through subtraction the determination of the capacitance between the inversion layer and the substrate.

It is important to note that the above is merely one example of how this concept can be used. The circuits 1200 and 1100 can be used in conjunction with most any type of transistor including a bipolar junction transistor by connecting the emitter and collector together and connecting them to nodes 105 or 107, a metal-semiconductor field effect transistor (MESFET), floating gate flash EPROM memory transistors, floating gate standard EPROM memory transistors, etc.

Figure 14:
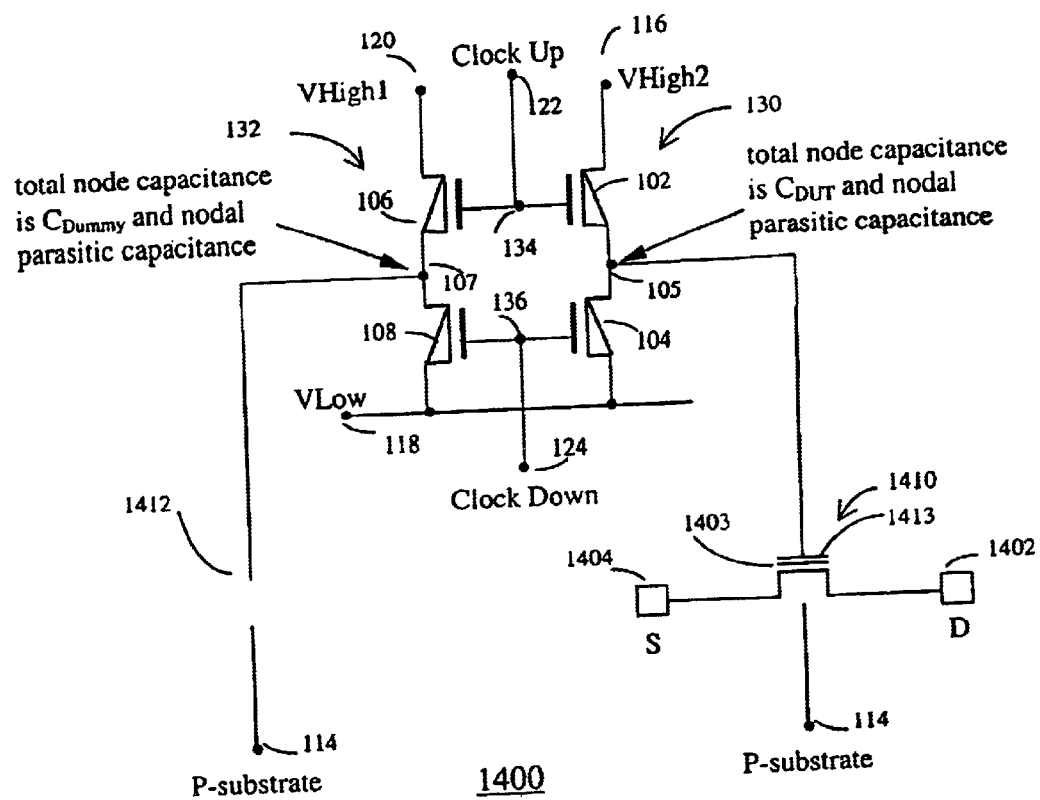
FIG. 14 is a schematic diagram of an exemplary on-chip circuit which uses the test circuit of FIG. 1 for measuring device parameters of a floating gate flash EPROM (erasable programmable read only memory) memory core cell transistor.
Figure 15:
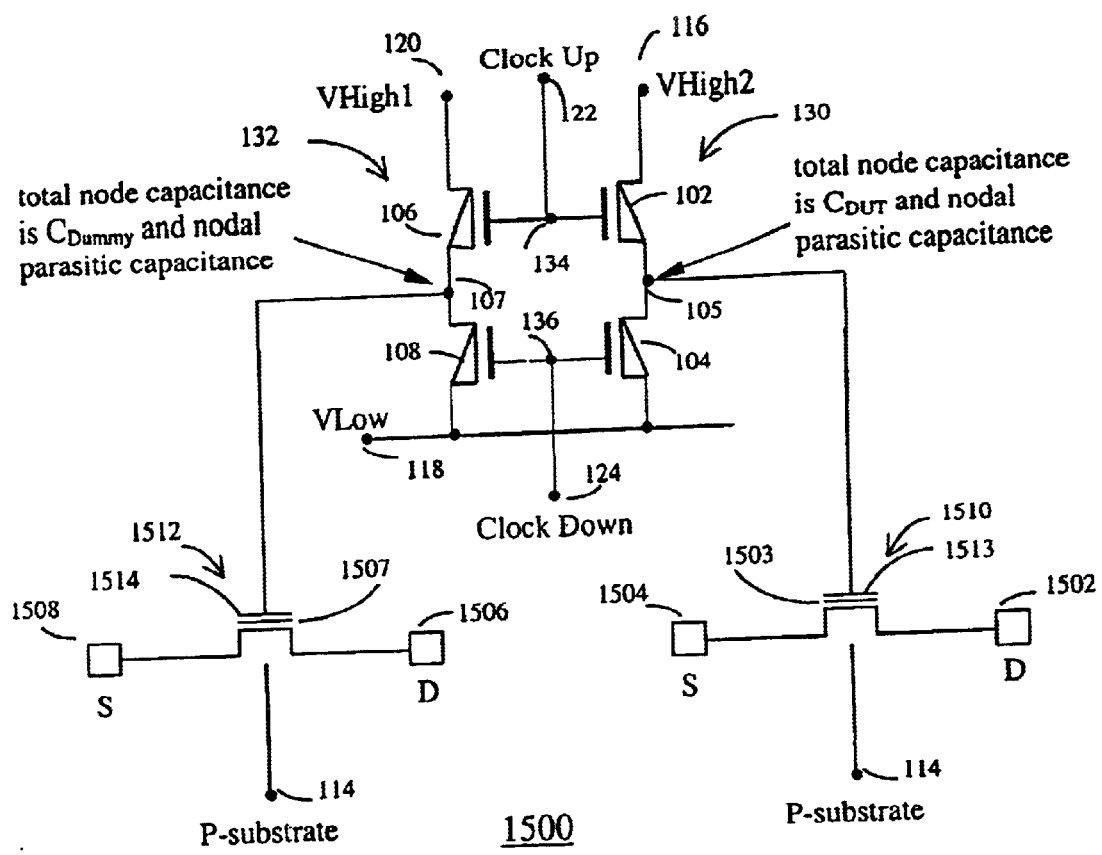
FIG. 15 is a schematic diagram of a second exemplary on-chip circuit which uses the test circuit of FIG. 1 for measuring device parameters of two different geometries of floating gate flash EPROM memory core cell transistors.

Circuit 1400 of FIG. 14 and circuit 1500 of FIG. 15 function similarly to circuits 900 and 1000. These two circuits can be used to measure the overall gate capacitance of various forms of floating gate non-volatile memory transistors. The two circuits are part of a group of circuits that can be used to characterize the various gate related capacitances of floating gate flash EPROM memory core cell transistors and floating gate EPROM memory core cell transistors. It is important to note however that because floating gate memory transistors have floating gates 1403 in addition to their control gates 1413, floating gate transistors require special treatment. Having two electrodes such as the floating gate and the control gate and a ground plane such as the drain, source, substrate and any inversion layer requires that floating gate transistors be treated as multiple electrode capacitors, multiple meaning more than two electrodes.

Figure 13:
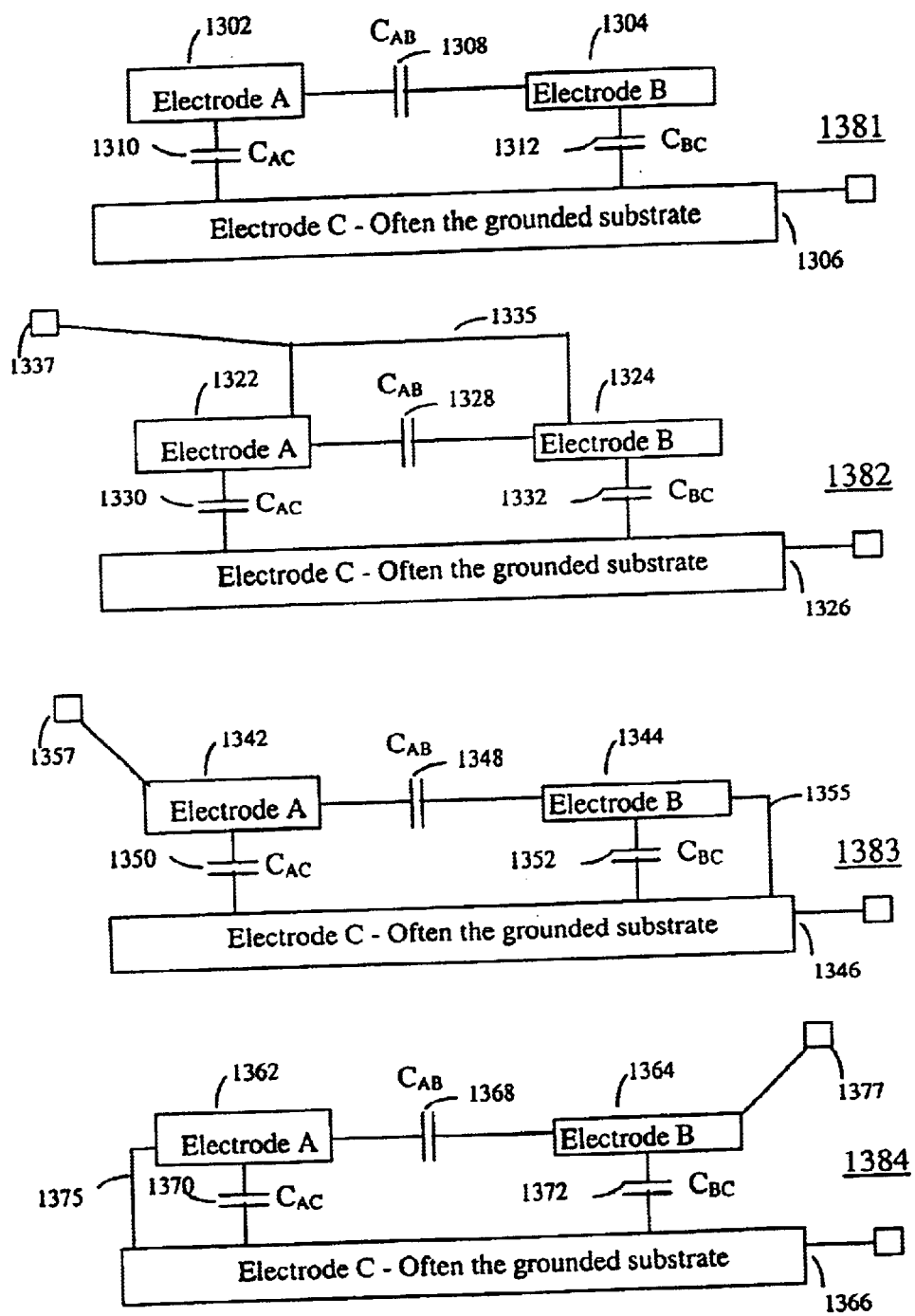
FIG. 13 illustrates the various combinations of measurement arrangements for measuring and isolating the individual node to node capacitances associated with a three or more electrode capacitance structure.

FIG. 13 shows the general forms of the various measurement structures that are required for correctly measuring the capacitances of and characterizing three electrode capacitors. The method illustrated in FIG. 13 can be extended to multiple electrode capacitors with more than three electrodes. Specifically, the circuits 1382, 1383 and 1384 are required for measurements in three electrode situations. Circuit 1382 shows how electrodes A 1322 and B 1324 are connected together. Their combined capacitance to electrode C 1326 is measured. Circuit 1383 shows how electrodes B 1344 and C 1346 are connected together. The capacitance from electrode A 1342 to the connected combination of electrode B 1344 and electrode C 1346 is measured. Circuit 1384 shows how electrode A 1362 and electrode C 1366) are connected together. The capacitance from electrode B 1364 to the connected combination of electrode A 1362 and electrode C 1366 is measured. The measurement of these three capacitances renders information which can be used to determine the values of capacitors CAB (all the same value and labeled 1308, 1328, 1348, and 1368 in 1381, 1382, 1383, and 1384), $C_{AC}$ (all the same value and labeled 1310, 1330, 1350, and 1370 in 1381, 1382, 1383, and 1384), and $C_{BC}$ (all the same value and labeled 1312, 1332, 1352, and 1372 in 1381, 1382, 1383, and 1384).

Figure 16:
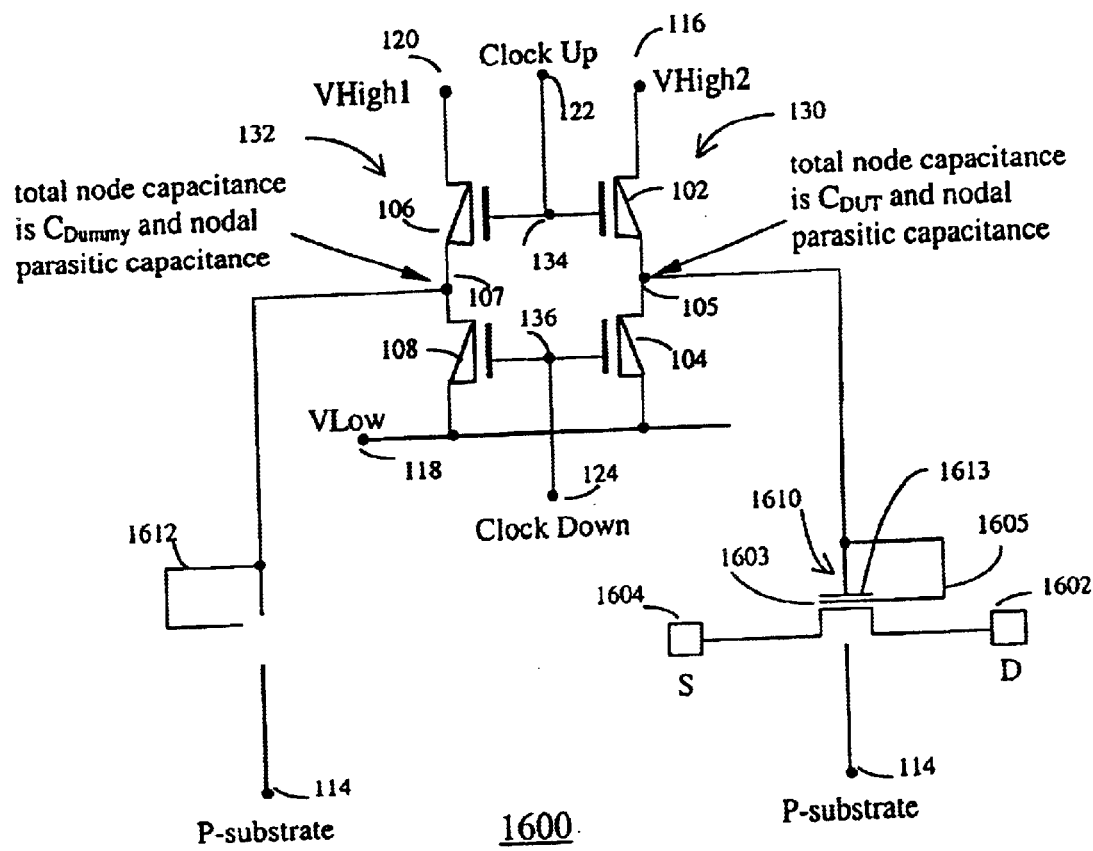
FIG. 16 is a schematic diagram of an exemplary on-chip circuit which uses the test circuit of FIG. 1 for measuring device parameters of a flash EPROM memory core cell transistor.
Figure 17:
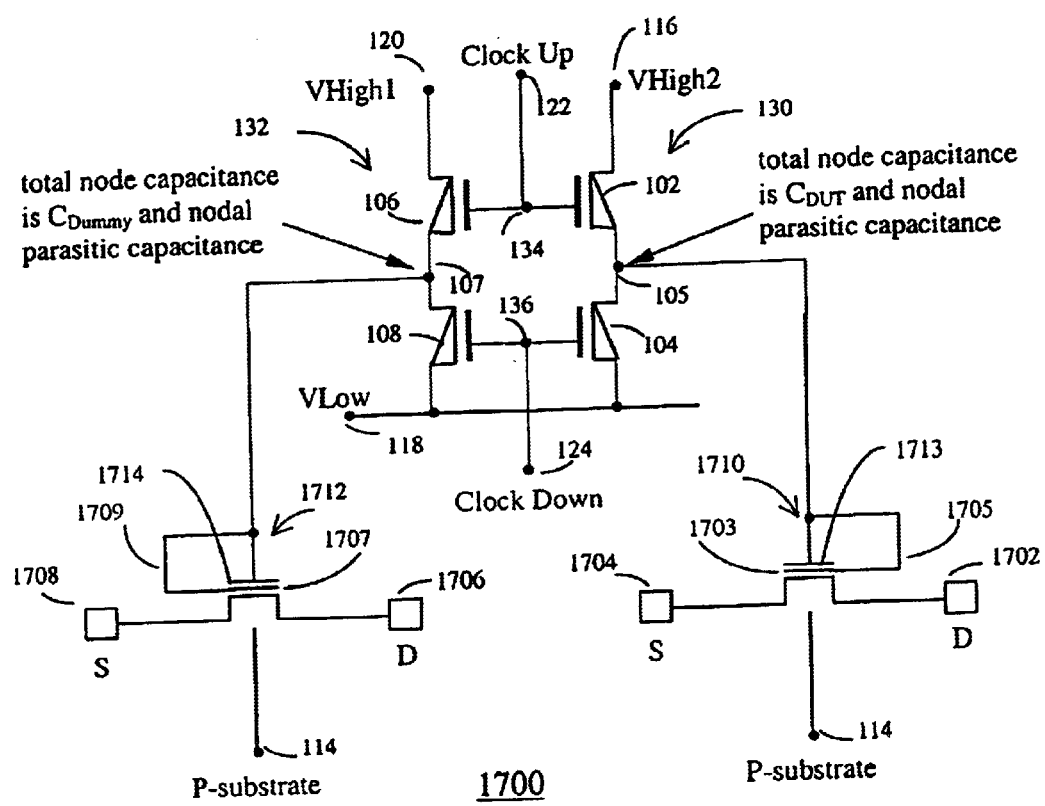
FIG. 17 is a schematic diagram of a second exemplary on-chip circuit which uses the test circuit of FIG. 1 for measuring device parameters of one geometry of flash EPROM memory core cell transistor.
Figure 18:
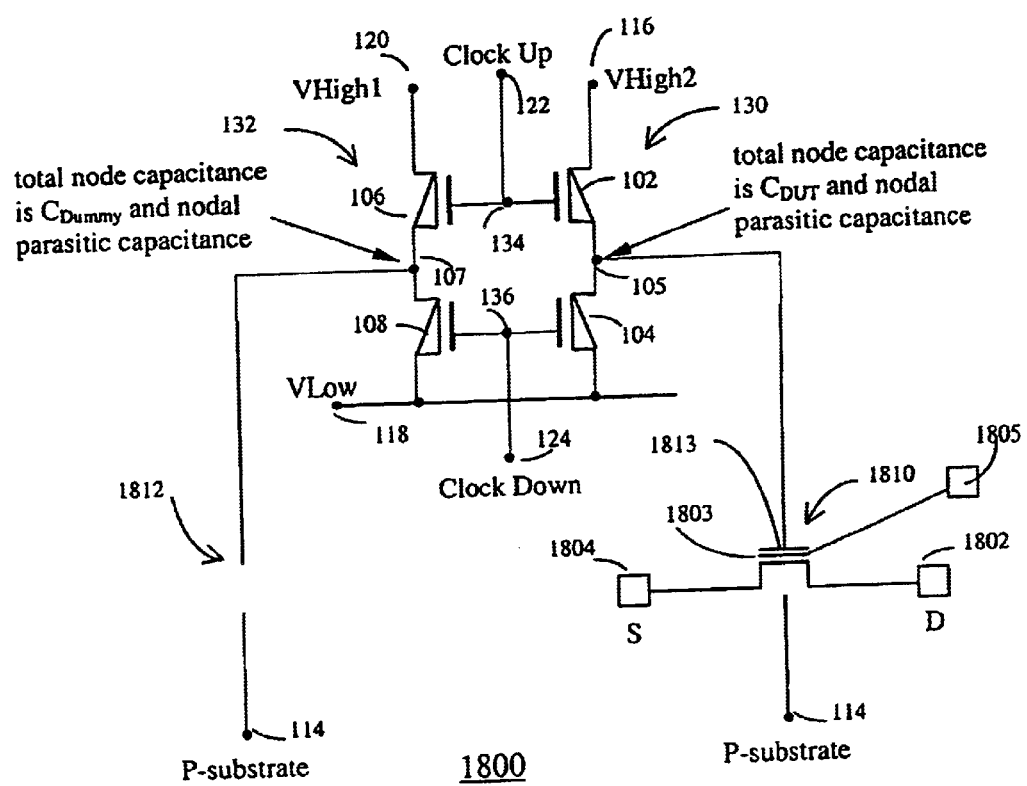
FIG. 18 is a schematic diagram of an exemplary on-chip circuit which uses the test circuit of FIG. 1 for measuring device parameters of a flash EPROM memory core cell transistor with a connection being provided for separately biasing the transistor's floating gate node.
Figure 19:
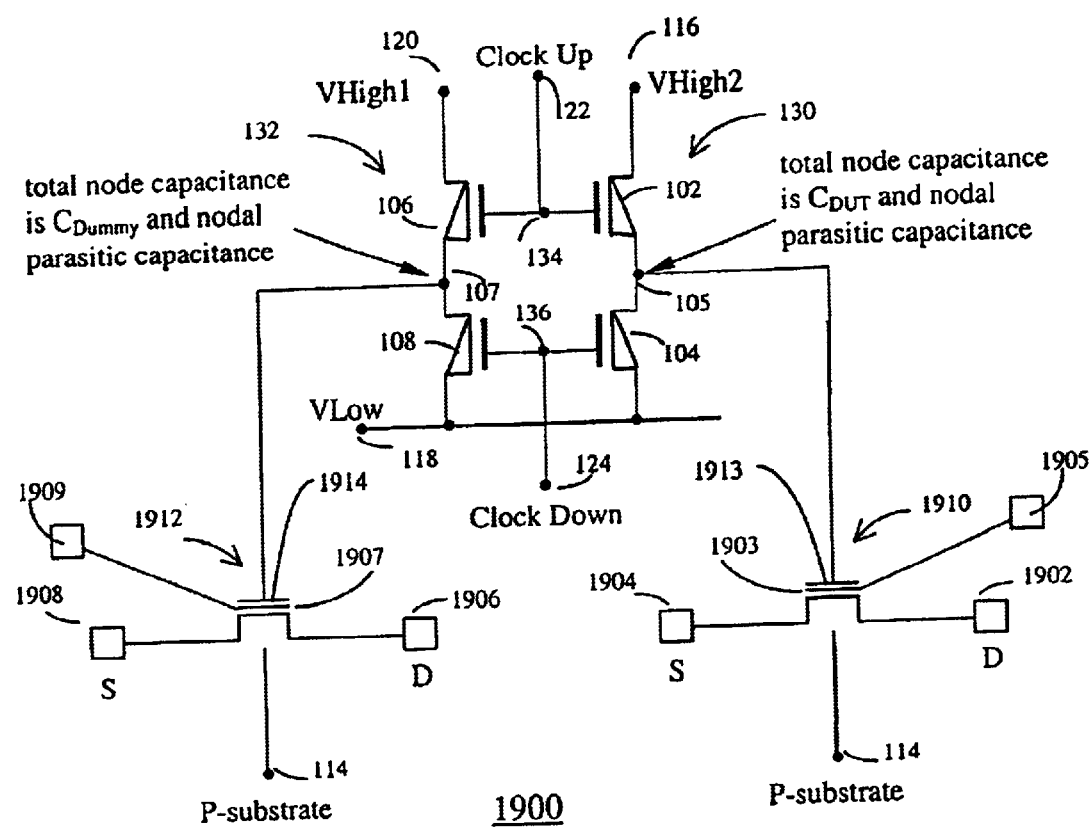
FIG. 19 is a schematic diagram of a second exemplary on-chip circuit which uses the test circuit of FIG. 1 for measuring device parameters of a second geometry of flash EPROM memory core cell transistor to the second transistor's other nodes, with connections being provided for separately biasing each of the transistors' floating gate nodes.
Figure 20:
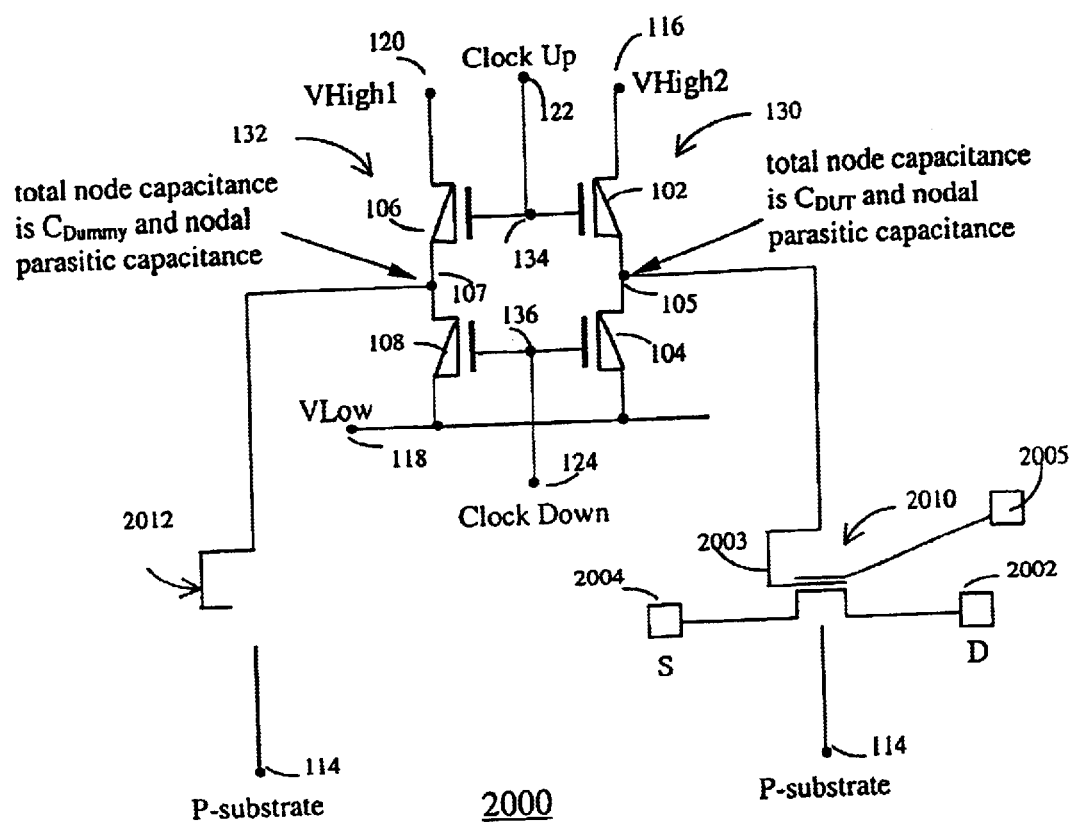
FIG. 20 is a schematic diagram of an exemplary on-chip circuit which uses the test circuit of FIG. 1 for measuring device parameters of a flash EPROM memory core cell transistor, with a connection being provided for separately biasing the transistor's control gate node.
Figure 21:
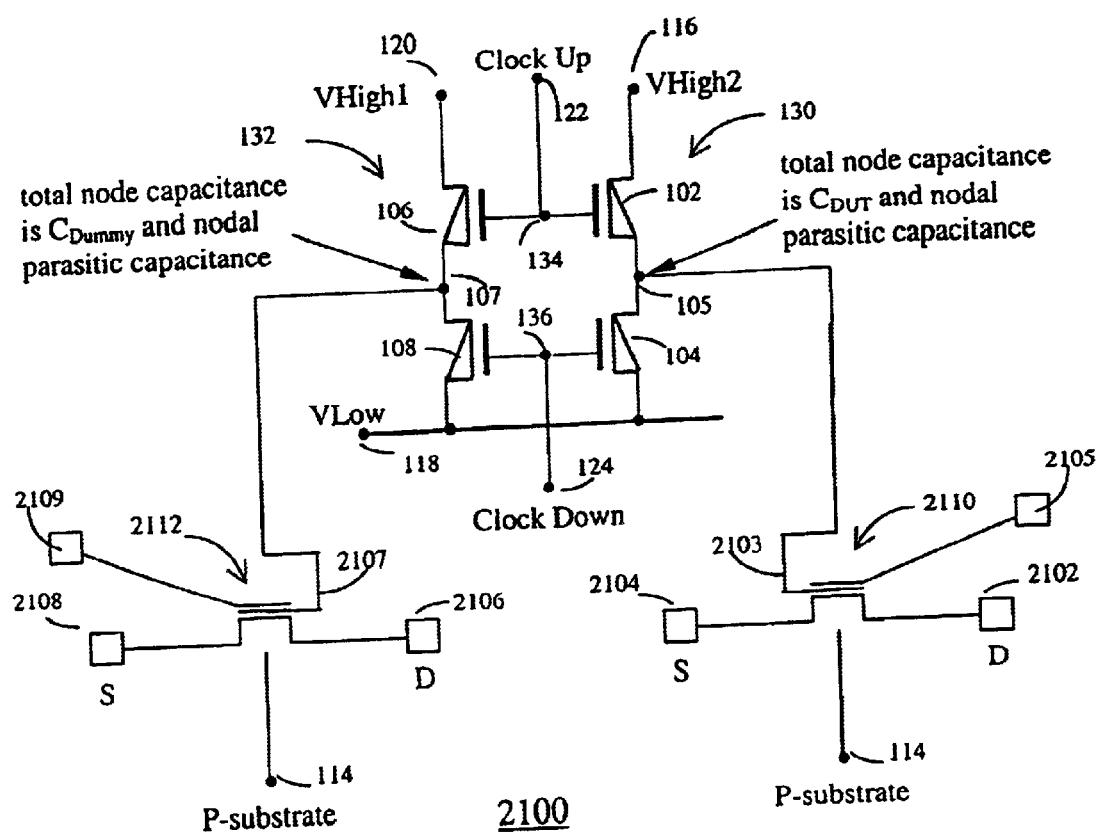
FIG. 21 is a schematic diagram of a second exemplary on-chip circuit which uses the test circuit of FIG. 1 for measuring device parameters of a flash EPROM memory core cell transistor, with connections being provided for separately biasing each of the transistors' control gate nodes.

Circuit 1600 in FIG. 16 and circuit 1700 in FIG. 17 are analogous to the circuit 1382. Circuit 1800 in FIG. 18 and circuit 1900 in FIG. 19 are analogous to the circuit 1383. Circuit 2000 in FIG. 20 and circuit 2100 in FIG. 21 are analogous to the circuit 1384.

Measurements very similar to those employed in conjunction with the circuits 900 and 1000 are likewise conducted using circuits 1600 and 1700. In the embodiments of circuit 1600, all of the capacitances connected to node 105 are compared with the capacitances connected to node 107. Interconnect 1612 is connected to node 107 and is a copy of the interconnect from node 105 to the control gate and floating gate of flash EPROM transistor 1610. Subtracting the value of the total of the capacitances connected to node 107 from the value of the total connected to node 105 yields the capacitance from the control gate and floating gate of flash EPROM transistor 1610 to the rest of the transistor. This capacitance includes both the control gate and floating gate fringe capacitances to the transistor source, drain, and adjacent substrate regions. The capacitance also includes the capacitances from the floating gate to the channel, and to the source and drain overlap regions. As explained in the discussion of circuits 900 and 1000, various widths and lengths of transistor 1610 can be measured in order to isolate the values of the capacitances associated with the various parts of the flash EPROM transistor. Similarly, circuit 1700 is use in much the same way that circuit 1000 is used. Again, various widths and lengths of transistors 1710 and 1712 can be measured in order to isolate the values of the capacitances associated with the various parts of the flash EPROM transistor.

Device sizes are varied in circuits 1800 and 1900 (FIG. 18 and FIG. 19, respectively) just as they are in circuits 1600 and 1700 in order to determine capacitances for the various parts of the flash EPROM transistor. In circuits 1800 and 1900 however, the floating gate of the transistors 1810, 1910, and 1912 are connected to probe pads so that they can be biased to desired voltages. Biasing is normally to ground in order to have the same potential as the substrate. The various portions of the devices in these two circuits serve the same role as the electrodes in circuit 1383. The control gates act as electrode A 1342 in 1383. The floating gates act as electrode B 1344 in circuit 1383, while the drains, sources and substrates in 1810, 1912 and 1910 serve the same role as electrode C in 1383.

In a very similar sense, device sizes are varied in circuits 2000 and 2100 (FIG. 20 and FIG. 21, respectively) just as they are in circuits 1600, 1700, 1800 and 1900 in order to determine capacitances for the various parts of the flash EPROM transistor. In circuits 2000 and 2100 however, the control gate of the transistors 2010, 2110, and 2112 are connected to probe pads so that they can be biased to desired voltages (normally to ground in order to have the same potential as the substrate). The various portions of the devices in these two circuits serve the same role as the electrodes in circuit 1384. The floating gates act as electrode A (1362) in 1384. The control gates act as electrode B (1364) in circuit 1384, while the drains, sources and substrates in 2010, 2112 and 2110 serve the same role as electrode C in 1384.

Once the devices in the three forms of circuits (the forms analogous to circuits 1382, 1383, and 1384) have all been characterized, capacitances analogous to $C_{AB}$, $C_{AC}$, and $C_{BC}$ can be calculated for each specific type of device capacitance as desired. For example, the capacitances from the floating gate and the from floating gate edges to the control gate, to the transistor source, to the transistor drain, and to the substrate regions adjacent to the transistor's channel can be determined.

It is important to note that any or all of flash EPROM core cell transistors 1410, 1510, 1512, 1610, 1710, 1712, 1810, 1910, 1912, 2010, 2110, and 2112 can be replaced with multiple flash EPROM core cell transistors of the same sizes in parallel with one another. This is often done in order to increase the values of the capacitances being measured and bring about more measurement accuracy. Further, this method of making measurements on three electrode flash EPROM core cell transistors can be generalized to other types of three electrode devices.

FIG. 22 illustrates two examples of the various types of MOSFET transistors that can trap charges in their gate dielectrics. Transistor 2200 is an example of a standard n-channel enhancement transistor with charge trapped in its gate dielectric near its drain. Trapping charge in the gate dielectric of such a standard MOSFET is almost always a very undesirable event. It is useful to be able to characterize the concentration and location of trapped charge when trapping occurs in such transistors.

In contrast, when done correctly, trapping charge is a useful thing to have happen in the gate dielectrics of NROM memory core cell transistors, device 2201. The NROM memory transistor is described in U.S. Pat. No. 6,011,725; issued Jan. 4, 2000 to Boaz Eitan and titled Two Bit Non-Volatile Electrically Erasable And Programmable Semiconductor Memory Cell Utilizing Asymmetrical Charge Trapping. This particular example of the transistor uses a "sandwich" structure of silicon dioxide, silicon nitride, and silicon dioxide as its gate dielectric. Trapping charge in its gate dielectric is how such a transistor is programmed. Normally charge is trapped at the lower interface between the silicon nitride and the lower layer of silicon dioxide. Device 2202 is a schematic symbol used to represent the NROM memory core cell transistor 2201.

For numerous reasons, it is extremely valuable to have knowledge of the concentration of trapped dielectric charge at each location with respect to the drain and source (with respect to the channel length). Knowledge of gate dielectric charge concentrations and charge locations in standard MOSFET's can help to diagnose the cause of charge trapping and aid in assessing the risks to product reliability associated with trapped dielectric charge.

Knowledge of gate dielectric charge concentrations and charge locations in NROM memory core cell transistors is extremely helpful in determining the best methods for programming, erasing, and reading the memory transistors. Charge concentration and location are also critical issues in developing and improving methods for program and erase cycling of these memory transistors.

Gate capacitance versus gate voltage characteristics of transistors can lead to information on the position and concentration of trapped dielectric charge in standard MOS-FET transistors, in floating gate flash EPROM memory core cell transistors, in thick oxide field transistors, and NROM memory core cell transistors.

The example of trapped charge in the gate dielectric of an NROM memory transistor will be used to illustrate a method for profiling the concentration and location of the trapped dielectric charge. The illustrated method can also be applied to the characterization of trapped charge in the gate dielectric of a standard MOSFET transistor.

Figure 23:
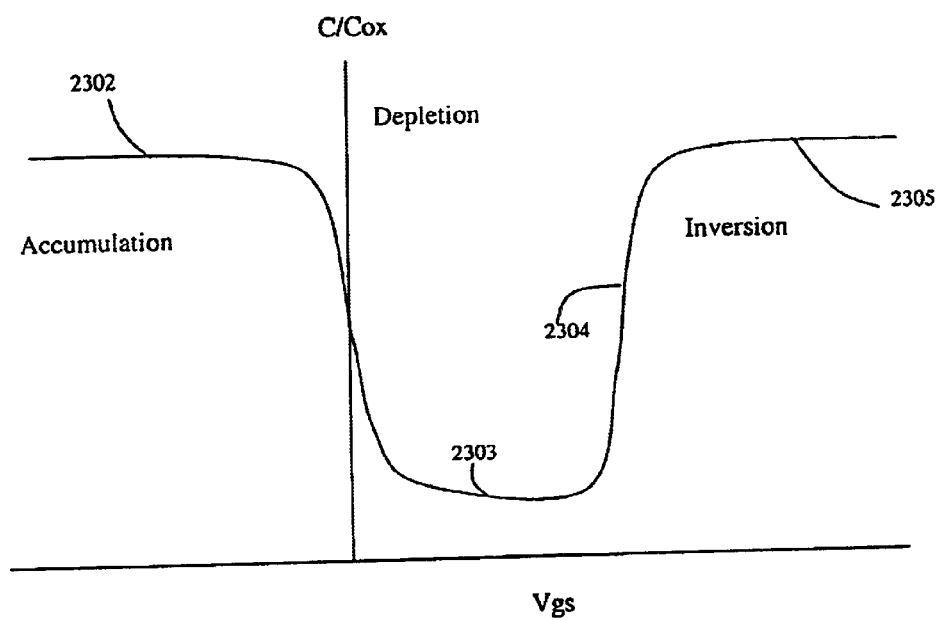
FIG. 23 illustrates the gate capacitance as a function of applied DC gate voltage of an uncharged (erased) NROM memory core cell transistor.

FIG. 23 illustrates an example C-V characteristic for an NROM memory core cell transistor that has no trapped charge in its gate dielectric. Refer to FIG. 22 for an idealized cross section 2201 and a schematic symbol for this transistor. A low gate to source voltage (e.g., less than zero volts) yields a portion of a C-V characteristic 2302 for an accumulated surface as a large density of holes is drawn to the silicon dioxide to silicon interface. Raising the gate voltage to above zero volts but keeping the gate voltage below the transistor's threshold voltage causes the transistor to go into the depletion condition. When a transistor is in depletion, the silicon at the transistor's silicon to silicon dioxide interface, the transistor's "surface", is depleted of mobile charge carriers. As such, the gate capacitance of the transistor is reduced (C-V curve portion 2303).

For gate voltages greater than the transistor's threshold voltage, the transistor's surface becomes inverted (C-V curve portions 2304, 2305). The curve of FIG. 23 is for a transistor with a low drain to source voltage VDS. The gate capacitance of the inverted transistor is dominated by the capacitance from the gate of the transistor to the inversion layer at the surface of the transistor. Here, the term surface means the silicon at the interface between the transistor's gate dielectric the silicon just beneath the gate dielectric. This is the region in which the transistor's inversion layer is formed.

Figure 24:
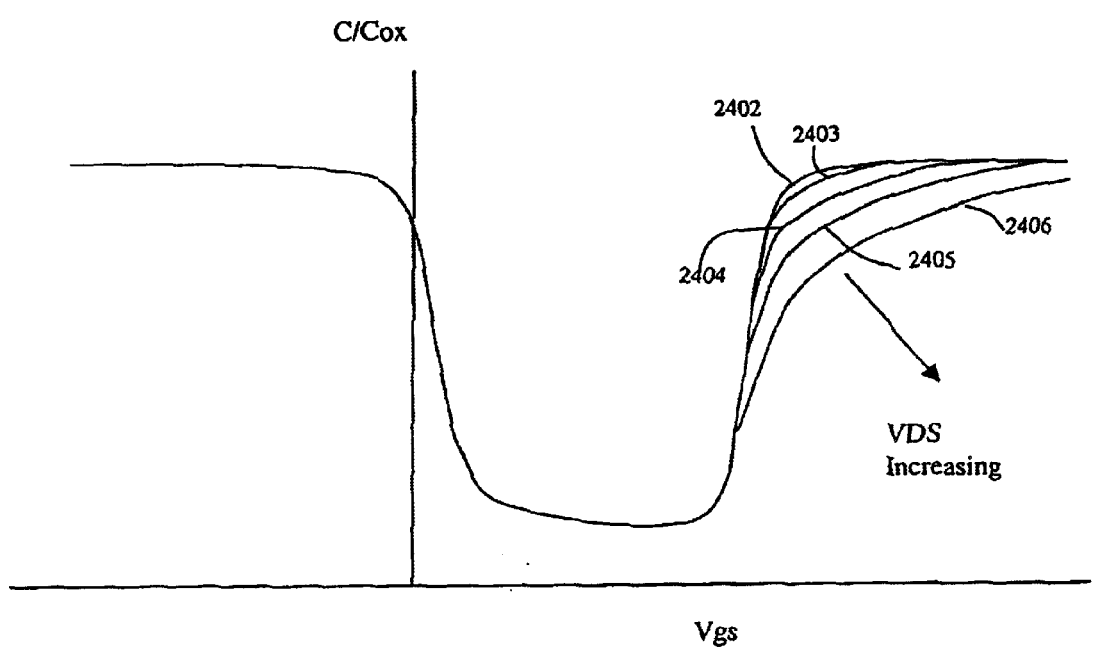
FIG. 24 illustrates the gate capacitance as a function of applied DC gate voltage.

FIG. 24 shows the effects (exaggerated and not to scale) of increasing the transistor's drain to source voltage and saturating the transistor. The saturation of the transistor is increased by raising its drain to source voltage successively further beyond the drain to source voltage that brings about the onset of saturation. The depletion region that forms between the drain end of the transistor's inversion layer and the drain of the transistor increases in width (in the drain to source direction). (This depletion region is often referred to as the saturation "pinch off region.") This increase in the depletion region width decreases the length of the channel inversion layer. The capacitance from the gate of the transistor to this pinch off depletion region is less per unit area than the capacitance from the gate to the inversion layer per unit area. Thus as the drain voltage is increased to bias the transistor further into saturation, the gate capacitance of the device is reduced. Note that if the gate voltage of the transistor increases the transistor becomes less saturated. This is because increasing the gate voltage of a transistor raises the drain voltage that is needed to bring on the onset of saturation. FIG. 24's curves 2402, 2403, 2404, 2405, and 2406 are for successively greater amounts of drain voltage and wider saturation pinch off depletion regions.

Figure 25:
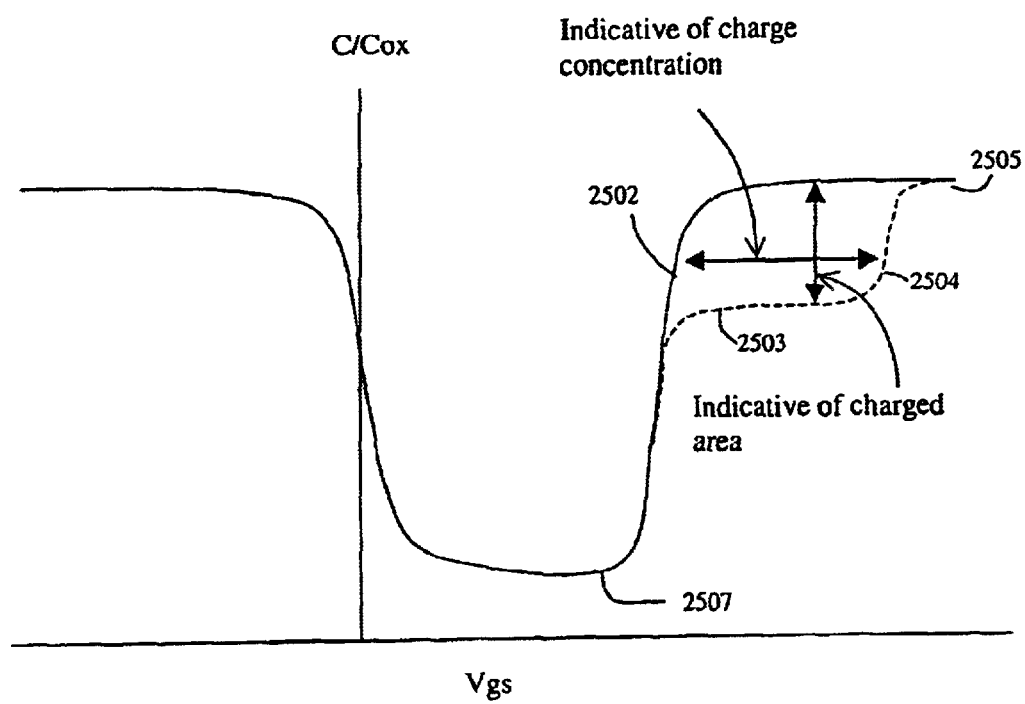
FIG. 25 illustrates the superimposed gate capacitances as functions of applied DC gate voltage of an uncharged (erased) NROM memory core cell transistor and of a charged NROM memory core cell transistor.

FIG. 25 shows the effects of trapped gate dielectric charge on the C-V characteristics. A shift in a curve's position to a higher gate voltage (from point 2502 to point 2504, for example) indicates an increase in threshold voltage in a portion of the channel. Trapped gate dielectric charge causes increases in transistor threshold voltage, corresponding to movement toward higher gate voltages of portions of the C-V curves. A threshold voltage shift for part of the transistor channel is shown as the shift from FIG. 25's 2502 curve to the figure's 2504 curve (shown not to scale). This shift is caused by trapped charge in the transistor's gate dielectric. The magnitude of the shift indicates the concentration of the trapped charge.

The vertical fraction of the curve that shifted to the greater threshold voltage indicates the area of the transistor's channel that is charged. The vertical fraction in this example is the difference in capacitance levels 2505 and 2503 divided by the difference in capacitance levels 2505 and 2507. Capacitance level 2507 is the gate capacitance of the transistor with the transistor biased in depletion. The area of the transistor channel that is charged is proportional to the above described vertical fraction. Again, the concentration of the charge in this area is commensurate with a shift in threshold voltage from 2502 to 2504.

This idealized curve would indicate that roughly one third of the area of the transistor's gate dielectric is uniformly charged to a concentration that would bring about a threshold voltage shift from curve 2502 to curve 2504. In practice, the trapped charge concentration usually is not normally distributed uniformly over the area of the transistor gate dielectric. As such, the resultant shift in the C-V curves is more spread out over the range of threshold voltage shift. In other words, the shape of the curve 2503 will have more of a gradual shift. Some portions of the gate area will have small threshold shifts resulting in a gradual shifting of curve 2502 toward higher gate voltages, although (perhaps not as abrupt as the sudden shift seen in curve 2503.

Figure 26:
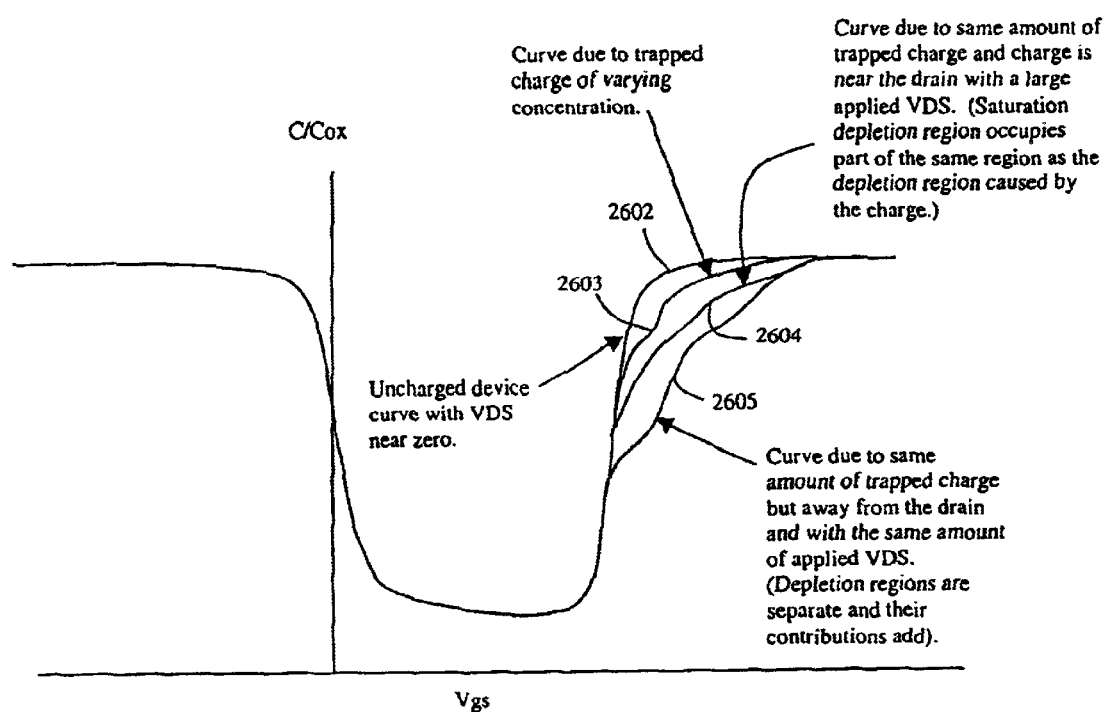
FIG. 26 illustrates the superimposed gate capacitances as functions of applied DC gate voltage of an NROM memory core cell transistor under various operating conditions.

FIG. 26 shows C-V curves resulting from trapped charge and from applied drain voltages that cause the transistor to saturate for some gate voltages. The curves of FIG. 26 are less idealized than the curves in FIG. 24 and FIG. 25. They are more exemplary of the curves seen in practice (the curves are still somewhat exaggerated). Example curve 2602 is for an uncharged gate dielectric with no voltage applied from drain to source. Example curve 2603 is for trapped charge of varying concentration somewhere in the gate dielectric. Example curve 2604 shows the effects of applying a large drain to source voltage to the device in the case when the trapped charge indicated by curve 2603 is near the drain of the transistor. In this situation, the elevated drain to source voltage would tend to deplete (through its drain voltage induced saturation pinch off depletion region) the portion of the transistor channel that is also already depleted by the trapped charge. In this situation, the saturation pinch off depletion region has less influence in depleting the transistor channel region than it would normally have. On the other hand, curve 2605 is an example of having charge in the gate dielectric in a region that is away from the drain of the transistor and of having a large drain voltage drive the transistor into saturation. Both the charge induced depletion region and the drain voltage induced pinch off region reduce the capacitance of the gate. To a major extent, the two effects add.

Commonly, a very effective alternate method can be used to determine NROM memory transistor charge density and charge location. As with the first method outlined above, this method is based upon analysis of capacitance versus voltage curves. Often, the charge in the gate dielectric above the channel of an NROM transistor extends across the entire transistor channel in a direction perpendicular to the flow of current. At low gate voltages, this sort of charge distribution has the effect of isolating the drain of the transistor from the source of the transistor. This type of charge distribution is referred to as a "full channel blocking charge distribution."

Consider the situation with drain and source voltages set equal to one another and a gate voltage that is just large enough to invert the portions of the channel that do not have charge in the gate dielectric above them. The gate voltage in this situation is low enough that the channel regions beneath the dielectric charge are not inverted but instead are depleted. The capacitance voltage characteristics (C-V curve) measured under this bias condition gives a strong indication of the total area of the channel that has charge in the dielectric above it. The C-V curves also indicate the concentration of the charge. The area that is charged is determined, as shown in FIG. 25, from the vertical shift in C-V characteristics from the curve labeled 2503 to the flat portion of the curve labeled 2502 (the highest portion of 2502). The lateral shift from the curve labeled 2502 to the portion of the curve labeled 2504 indicates charge concentration. As noted previously, the curve labeled 2503 and 2504 is idealized. An actual curve would not have capacitances as constant in the region labeled 2503 and would not have such an abrupt change in capacitance in the region labeled 2504. These curves have been simplified for the sake of illustration. Nonetheless, the described analysis could be applied to more complex actual curves in order to obtain charged area and charge concentration.

The theory needed for understanding how to locate the dielectric charge in the above example of a full-channel blocking charge distribution is akin to understanding the theory that explains saturation mode operation in MOSFET's. Raising the source to bulk voltage of a MOSFET transistor raises the transistor's threshold voltage. This is a fairly strong effect in NROM memory transistors due to the n-channel transistors' relatively high concentration of p-type channel dopant. Moreover, raising the voltage of any portion of a transistor's inversion layer raises the threshold voltage for that portion of the transistor's channel. Raising the drain voltage of an inverted transistor raises the voltage on the drain end of the transistor's inversion layer. This in turn increases the gate to channel threshold voltage local to the drain end of the inversion layer. Moreover, raising the voltage on the inversion layer near the drain causes the voltage from the gate of the transistor to the drain end of the inversion layer to become smaller. With enough drain voltage, this combination of increased local threshold voltage and reduced voltage from the gate to the local inversion layer can prohibit the existence of an inversion layer at the drain end of the channel. Thus a saturation pinch-off region forms near the drain end of the MOSFET channel. The above outlines the standard theory for MOSFET saturation.

Understanding the case of an NROM transistor with a full channel blocking charge distribution draws upon theory similar to that outlined above for MOSFET transistors in saturation. Consider the case of an NROM transistor having channel blocking charge fully crossing the center of the transistor's channel. The example further assumes that the charge covers 20 percent of the transistor's channel length (and thus 20 percent of the channel area). This leaves a region of channel near the source of the transistor having an uncharged gate dielectric and a similar region near the drain. Each of these uncharged regions would have areas equal to 40 percent of the channel area As explained above, holding the drain and the source of the transistor at the same voltage will yield a C-V curve indicating that 20 percent of the channel is charged. The capacitance curve will indicate that the transistor is fully depleted for gate voltages just below the threshold voltage of the uncharged regions. As the gate voltage is increased, the two uncharged regions (each having 40 percent of the channel area) will invert and the C-V curve will attain 80 percent of its fully inverted capacitance level. As the gate voltage increases further, the remaining 20 percent of the channel will invert and the C-V curve will reach its full inversion capacitance level. Of course, the various portions of this remaining 20 percent of the channel will their own threshold voltage. The level of each area's threshold is dependent upon the dielectric charge concentration overlying the area.

Under some bias conditions, raising the drain voltage of the full-channel charge blocked NROM transistor can isolate large portions of the transistor channel and can prevent these regions from being inverted. These portions of the channel would invert if not for the presence of the charge fully blocking the channel of the transistor. Consider a gate voltage that is just high enough to invert the uncharged portions of the transistor channel (80 percent of the channel area) but which is not high enough to invert the charged portion of the transistor channel (the 20 percent of the channel midway between source and drain). Under this condition, the dielectric charge in the middle of the channel effectively isolates the uncharged portions of the channel from one another. Again, these uncharged portions of the channel are the 40 percent of the channel near the drain and the 40 percent of the channel near the source. The inversion layer of the portion of the channel near the source takes on the same voltage as the source. The inversion layer of the portion of the channel near the drain takes on the same voltage as the drain. These two inversion layers are isolated from one another. The drain actually acts as a "pseudo source" for inversion layer electrons. As such, this inverted region near the drain is termed the "drain-sourced inversion layer."

Under this condition, raising the voltage on the drain of the transistor increases the voltage of the drain-sourced inversion layer. With enough increase in drain voltage, the voltage from the gate to the drain-sourced inversion layer is be too small to support an inversion layer. This portion of the channel is isolated for two reasons. First, the region cannot gain electrons from the source due to the full channel blocking charge. Second, the region cannot gain electrons from the drain. This is because the drain is at a higher voltage than the highest voltage that could exist in such a transistor's inversion layer. Simply, the transistor's gate voltage is too low to support inversion with such a high inversion layer voltage (such a high drain voltage). There would be too little voltage difference from the gate voltage to the inversion layer voltage. Note again that the transistor's drain is acting as the source for this isolated portion of the channel.

This is very similar in concept to the theory for saturation pinch-off in a normal uncharged transistor. Instead of gaining electrons from the drain, any drain-sourced inversion layer would lose its electrons to the higher voltage drain. This causes the 40 percent of the channel nearest to the drain to become depleted.

With the above in mind, it is fairly easy to determine how much channel area without overlying dielectric charge exists between the drain and the channel blocking charge. Two C-V curves are required. One C-V curve would be measured with the drain voltage low enough to allow inversion in the drain-sourced portion of the channel. A second C-V curve would be measured with the drain voltage raised enough to cause the drain-sourced channel region to deplete. The difference between the two C-V curves gives a clear indication of how much of the channel lies between the drain and the full channel blocking charge. Thus the method can determine the distance between the channel blocking charge and the drain.

Similarly, the roles of the source and drain can be reversed so that the distance from the source to the channel blocking charge can be determined. Knowing these two distances and knowing the amount of channel area "covered" by the dielectric charge yields a full understanding of the location of the charge with respect to the transistor's drain and source.

Figure 27:
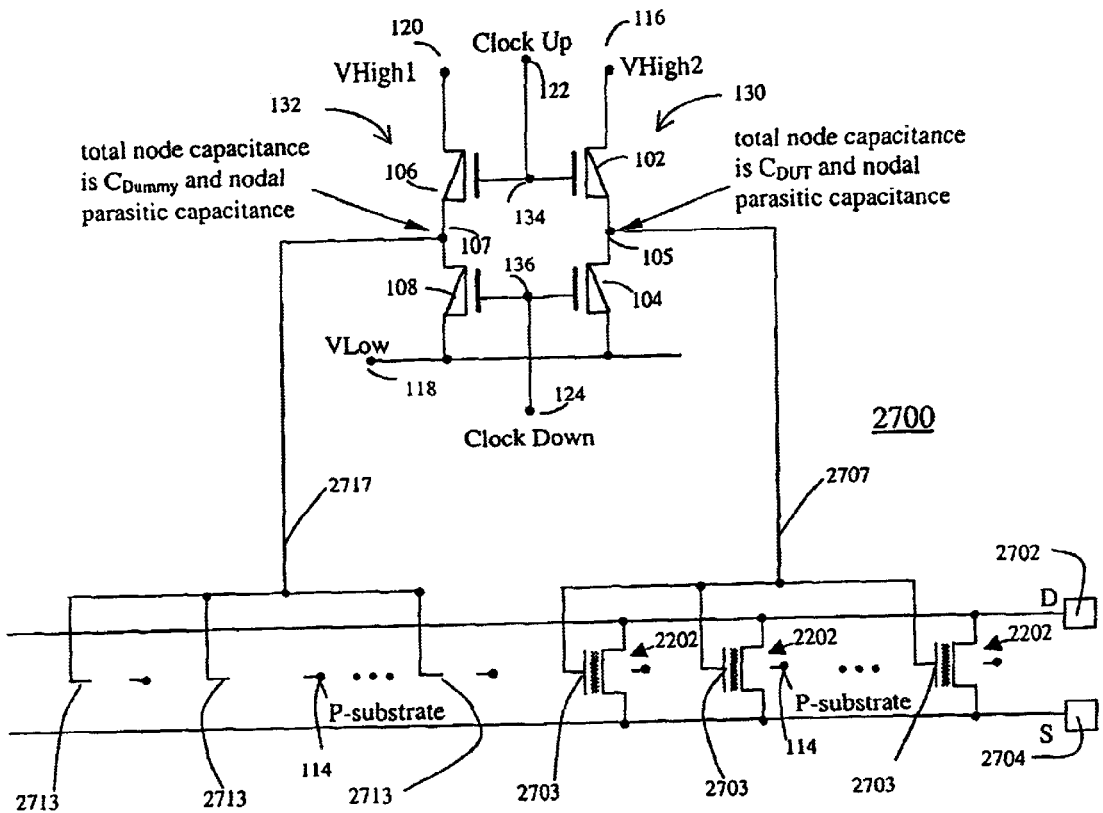
FIG. 27 is a schematic diagram of an exemplary on-chip circuit which uses the test circuit of FIG. 1 for measuring device parameters.

FIG. 27 is a schematic diagram of an exemplary circuit, 2700, for measuring the capacitances needed for creating capacitance versus voltage characteristics similar to those shown in FIG. 23, FIG. 24, FIG. 25, and FIG. 26. In the example of FIG. 27, the circuit is configured for measuring the capacitance versus gate voltage characteristics of NROM memory core cell transistors. Among other measurements and analysis that this circuit enables, the circuit provides for the determination of the location and concentration of trapped charges in the gate dielectrics of MOSFET transistors. Here, location means position with respect to the channel length (with respect to the source and the drain). The methods for determining charge location and concentration from capacitance and voltage characteristics were explained in the discussions of FIG. 23, FIG. 24, FIG. 25, and FIG. 26.

The gates 2703 of multiple parallel NROM memory core cell transistors 2202 are connected via interconnect network 2707 to node 105 of a test circuit similar to test circuit 100 discussed in conjunction with FIG. 1. The gate capacitances associated with these transistors form the device under test capacitances of this test circuit. The drains of the NROM transistors are connected in common to probe pad and node 2702. The sources of the NROM transistors are connected in common to probe pad and node 2704.

As shown in this example, these transistors can be fabricated in the doped substrate 114 of a semiconductor wafer. Alternatively, they can be fabricated in a doped well resident in the substrate of a semiconductor wafer. The transistors in this example happen to be n-channel NROM core cell memory transistors. Any type of transistor having an insulating gate could just as well be analyzed by a form of this circuit.

An interconnect network 2717 identical to network 2707 is connected to test circuit node 107 and forms the dummy capacitance of the test circuit. All of the capacitances associated with node 105 and 107 are measured in accordance with the method described in the discussion of FIG. 1. The gate capacitances of gates 2703 are the result of subtracting the node 107 capacitances from the node 105 capacitances at the various operating conditions.

Test circuit 2700 provides for the programming and erasure of NROM memory core cell transistors 2202. NROM memory transistor programming, erasure and reading occur via the application of appropriate voltages to drain connection 2702, source connection 2704, and gate node 105, 2707, and 2703 (105, 2707, and 2703 are all portions of the same node). Similar to methods outlined herein for other test circuits, a DC voltage can be applied to node 105 merely by taking Clock Up node 122 negative in voltage in order to turn on transistor 102, taking Clock Down node 124 to a large positive voltage in order to turn off transistor 104, and then applying to node 116 the gate voltage that is desired for gate nodes 2703.

Circuit 2700 employs multiple parallel connected copies of NROM memory core cell transistor 2202 in order to increase the overall capacitance to be measured. Measuring a large number of transistor gate capacitances enables more precise capacitance measurements. Under ideal conditions, a single transistor 2202 could be used in the circuit. Although this example describes the charge profiling method in conjunction with NROM cells, the method can be applied in the same fashion to the analysis of standard MOSFET transistors.

Figure 28:
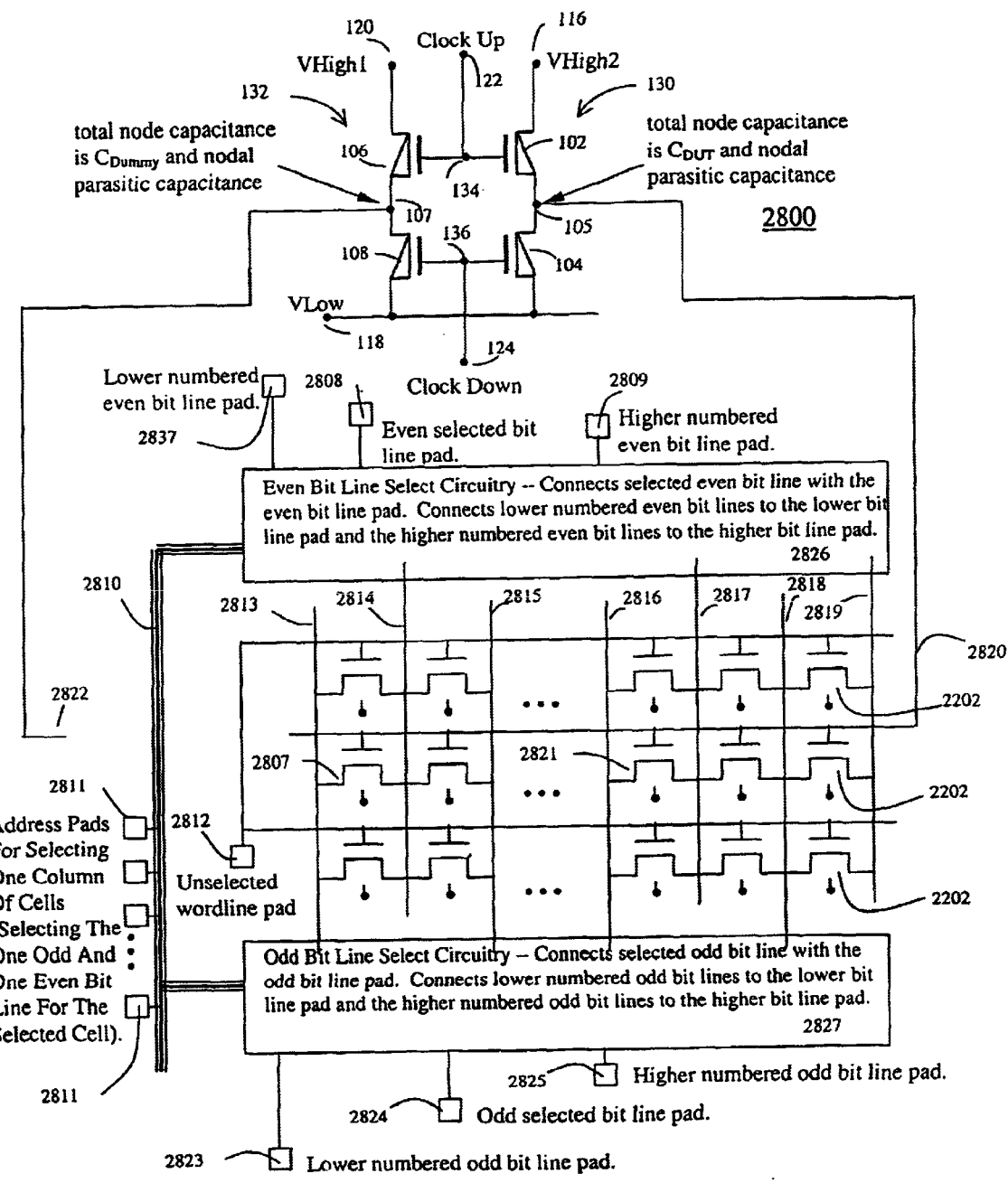
FIG. 28 is an exemplary on-chip circuit in partial-block, partial schematic form which uses the test circuit of FIG. 1 for measuring device parameters.

Test circuit 2800 of FIG. 28 is an example of another embodiment of a test circuit for measuring the gate capacitances of NROM memory core cell transistors. Alternatively, the circuit can be used to measure the gate capacitances of other types of transistors.

Test circuit 2800 improves on test circuit 2700 in that 2800 provides for the programming, and reading of individual NROM memory core cell transistors. Transistors can be programmed and read individually as is normally done in some phases of these types of transistors' operation in products. It is very desirable to have a method for determining the gate dielectric charge distributions in transistors that result from many cycles of transistor program and erase cycling. Charge distribution refers here to the location and concentration of charge in the gate dielectric. Test circuit 2800 provides an improved means for determining the concentration and location of trapped charge in the gate dielectric of NROM memory transistors.

Test circuit 2800 contains an array of NROM memory core cell transistors arranged in the same fashion that transistors in a product array would be arranged in. Having an array of transistors is advantageous in that the transistors of interest are subjected to the same processing anomalies to which the transistors in a product memory are subjected, such as transistor to transistor proximity effects, plasma etcher loading, etc. Moreover, simultaneously measuring the gate capacitance of many parallel transistors increases the overall capacitance being measured and hence increases capacitance measurement accuracy.

Transistors 2807, 2821 and the other transistors in the same row of transistors as transistors 2807 and 2821 are the devices whose gate capacitances can be measured in this example circuit (the transistors of interest). The gates of all of the transistors on this array row are connected to interconnect 2820 and are eventually connected to node 105 of a copy of test circuit 100. The common gate connecting all of the transistors in the row containing transistors 2807 and 2821 is normally referred to as the "word line" for that row of transistors. The term "word line" normally refers to the portion of this node that is transiting the array of memory transistors itself. The other word lines in the array of circuit 2800 are connected to a common probe pad and to node 2812. The circuit's bit-lines 2813, 2814, 2815, 2816, 2817, 2818 2819 are the lines connecting the drains and sources of the transistors in the array. In the preferred embodiment, the word lines are poly crystalline silicon and the bit lines are n-doped regions in the semiconductor substrate.

In this example embodiment, each bit line can act as the source line for all of the transistors connected to it and, in other operating modes, as the drain line for all of the transistors connected to it. In this example, the NROM memory core cell transistors are bi-directional devices. Each NROM transistor is reversible with its two ends (drain and source diffusions) acting as drain and source in one mode and then acting respectively as source and drain in another. Whether a bit line is acting as a drain or as a source at a particular moment merely depends upon the bias condition of the array's various bit lines at that time. If a first bit line is biased to a relatively high positive voltage and a second adjacent bit line is biased to a lower voltage then the first bit line acts as a drain and while the second acts as a source. In this example, bit lines are numbered from left to right. Bit lines 2813, 2815, 2816, and 2818 are odd bit lines and connect to the odd bit line select circuitry 2827. Bit lines 2814, 2817, and 2819 are even bit lines and connect to the even bit line select circuitry 2826. Note that although bit lines 2815 and 2816 are shown adjacent to one another in the figure, they are actually separated by perhaps a very large number of even and odd bit lines that were omitted from the figure for the sake of brevity. This circuit often contains thousands of bit lines with thousands of NROM transistors having their gates connected to the word line that also connects to transistors 2807 and 2821.

The even bit line select circuitry, 2826, serves to electrically connect a single selected even bit line to the even selected bit line probe pad 2808. The select circuitry also connects all lower numbered even bit lines to the lower numbered even bit line probe pad 2837 and all higher numbered even bit lines to the higher numbered even bit line probe pad 2809. Similarly, the odd bit line select circuitry, 2827, serves to electrically connect a single selected odd bit line to the odd selected bit line probe pad 2824. The select circuitry also connects all lower numbered odd bit lines to the lower numbered odd bit line probe pad 2823 and all higher numbered odd bit lines to the higher numbered odd bit line probe pad 2825. The even selected bit line and the odd selected bit line are adjacent to one another in this example. In other embodiments, select circuitry 2826 and 2827 could be constructed such that all of the bit lines could be selected and connected in different fashions as desired.

In this embodiment, the bit line select circuits, 2826 and 2827, accept signals from the address lines coming from address bus 2810 and from those signals determine the even bit line and the odd bit line to be selected. Address probe pads 2811 are used for connecting the address bus nodes to the automated parametric test system normally used for reading, programming, erasing, and program and erase cycling NROM transistor test arrays. Lower numbered even bit line probe pad 2837, even selected bit line probe pad 2808, higher numbered even bit line probe pad 2809, lower numbered odd bit line probe pad 2823, odd selected bit line probe pad 2824, and higher numbered odd bit line probe pad 2825 are also used for connecting their respective nodes to appropriate nodes in the parametric test system. These bit line probe pads are used for applying appropriate voltages and measuring bit line currents and voltages. Unselected word line probe pad 2812 is used for connecting the parametric test system node which will be used to apply voltages to the other (unselected) word lines in the test circuit memory transistor array.

The bit line select circuits 2826 and 2827 can be formed from the high voltage and negative voltage transistors that are parts of typical non-volatile memory technologies. The construction of the select circuits is very similar to the construction of the circuits that are used as "y decoders" in memory products. Decoding addresses, selecting bit-lines and electrically connecting bit lines and groups of bit lines to nodes used for biasing those bit lines is a very common practice in memory technologies. As previously mentioned, circuit 2800 uses a copy of test circuit 100 and has circuit 100 connected to interconnect 2820 and the selected word line.

As with other previously described test circuits (for example 900, 1400, 1600, 1800 and 2000), a copy, 2822, of interconnect 2820 is connected to test circuit node 107 and acts as the dummy capacitance. Measuring the capacitances associated with node 107 results in the dummy capacitance. Measuring the capacitances associated with node 105 results in the device under test capacitance. Subtracting the dummy capacitance from the device under test capacitance results in the capacitance from the word line and the gates of the transistors on the array row containing transistors 2807 and 2821 to the rest of the structure. These capacitances include the gate to channel, gate to source, and gate to drain capacitances of the transistors of interest. The capacitances also include the word line to bit line capacitances and the capacitances between the word line and the adjacent word lines. Commonly, the parametric test system used for biasing circuit 2800's address probe pads also provides the signals used to drive circuit 2800's copy of circuit 100. The parametric test system also measures the currents into the two VHIGH nodes of the copy of circuit 100 (116, and 120).

Generally, all of the NROM transistors in a single test circuit array are of the same size. Having a number of test circuits 2800, with each having its own unique size of transistors, can allow for the isolation of the capacitances of specific portions of the transistors. This is similar in nature to the methods employed in conjunction with the test circuits of FIG. 9 and FIG. 10.

Test circuit 2800 provides a means for developing NROM memory core cell transistor capacitance versus voltage characteristics similar to those in FIGS. 23, 24, 25, and 26. Thus is provides a means for characterizing the location and concentration of charge trapped in NROM transistor gate dielectrics. It also allows the NROM transistors of interest to be individually programmed, erased and read.

In another embodiment, the word line of interest is merely chosen from among the word lines of an existing test chip memory array. These memory test arrays are a common feature of memory technology development test chips and commonly contain, for example, 4,194,304 NROM transistors (4 Mega-cells). In this situation, interconnect 2827 would connect test circuit 100's node 105 to an existing test array word line. Interconnect 2822 would be connected to test circuit node 107 and would be a copy of the interconnect 2820 connecting node 105 with the test array word line to be monitored. In short, the lower portion of the circuit in FIG. 28 would be replaced with the circuitry in the existing test chip memory array. In this embodiment, one of the test chip memory array's word lines would be dedicated to the measurement of word line capacitance and the measurement of NROM gate capacitance, and to the characterization of trapped dielectric charge.

Figure 29:
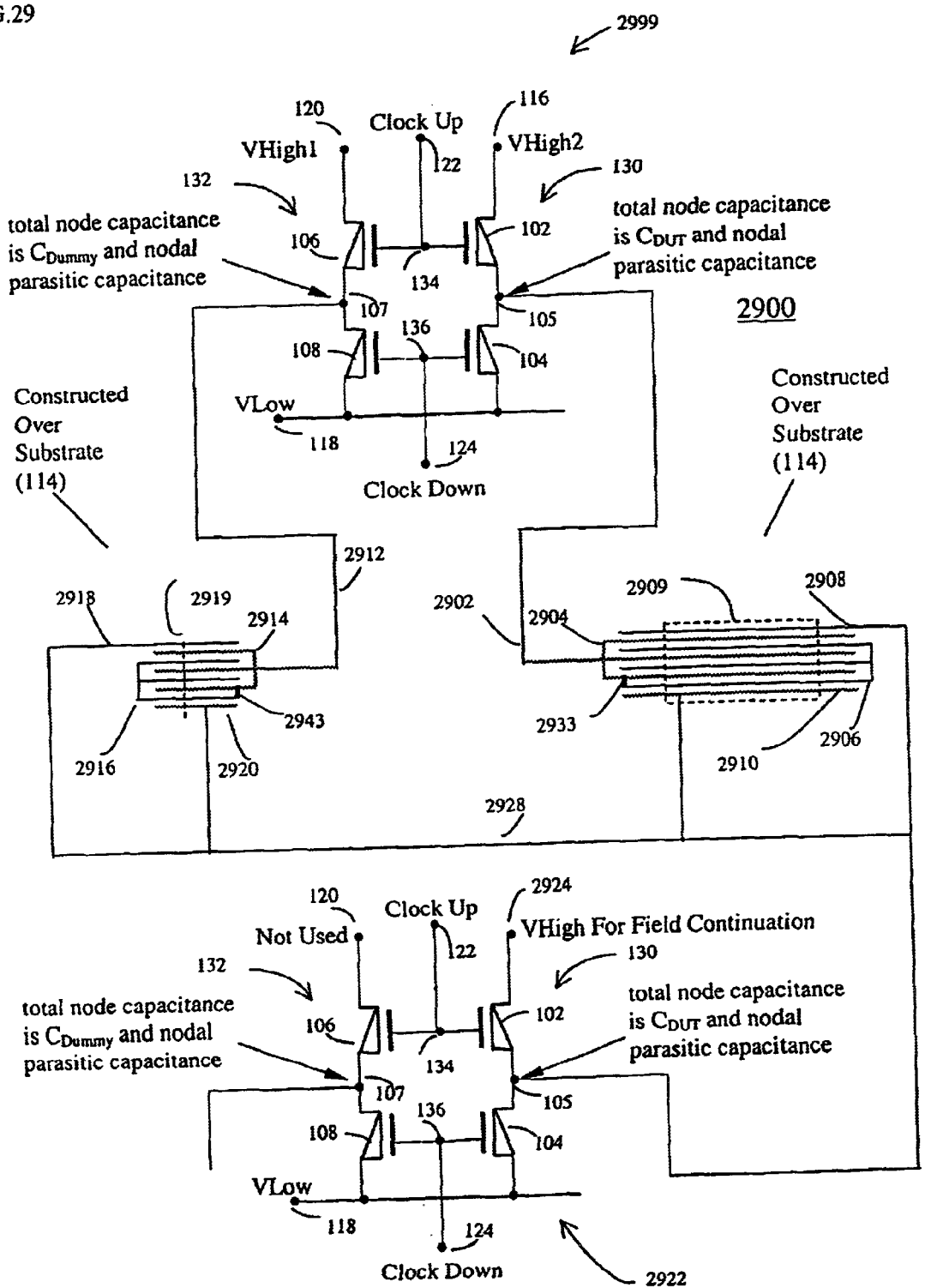
FIG. 29 is an illustration of an exemplary on-chip circuit in partial schematic, partial layout form which uses two copies of the test circuit of FIG. 1 for measuring device parameters.
Figure 30:
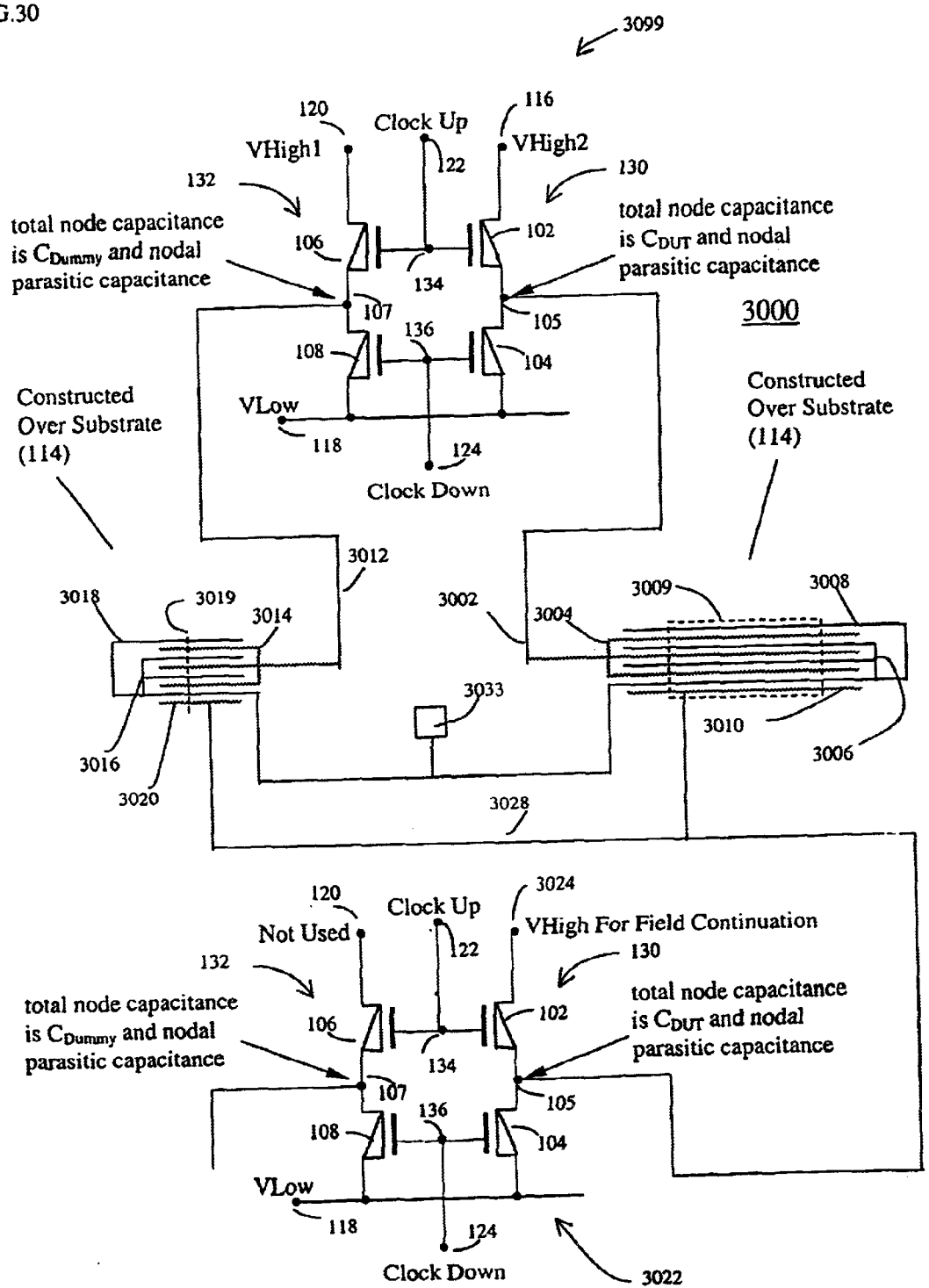
FIG. 30 is an illustration of an exemplary on-chip circuit in partial schematic, partial layout form which uses two copies of the test circuit of FIG. 1 for measuring device parameters.
Figure 31:
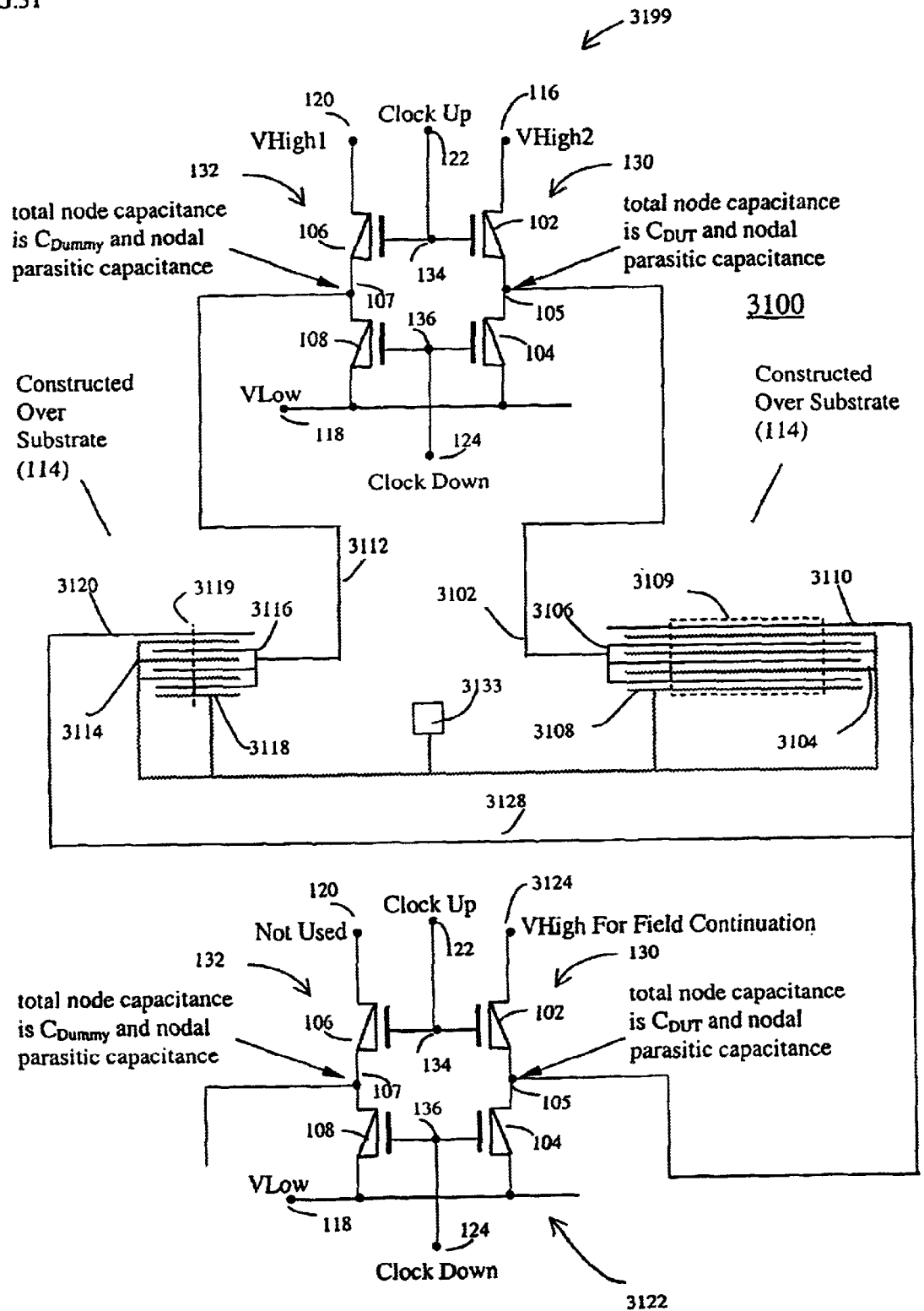
FIG. 31 is an illustration of an exemplary on-chip circuit in partial schematic, partial layout form which uses two copies of the test circuit of FIG. 1 for measuring device parameters.

FIG. 29, FIG. 30, and FIG. 31 illustrate exemplary circuits 2900, 3000, and 3100 which are used in conjunction with one another for determining the various electrode to electrode capacitances and the electrode to underlying ground plane capacitances of an exemplary three electrode capacitive system. In this example, two of the three electrodes are metal interconnect lines on two different metal layers of a semiconductor process. The third electrode is the semiconductor substrate. In other embodiments, a conducting plate connected to a probe pad could be substituted for the third electrode (substituted for the substrate). Secondly, although circuits 2900, 3000, 3100 in this example measure the capacitances associated with metal lines on two separate layers, the method can also be applied to conductive lines of materials other than metal. Further, the method can be applied to lines formed in separate layers or to lines formed in the same layer.

In a similar fashion to the general circuits described in FIG. 13, circuits 2900, 3000, and 3100 are used in determining the interelectrode capacitances of a line to line and line to ground plane (substrate in this example) three electrode capacitance system. Circuit 2900 takes the role of circuit 1382 in FIG. 13 while circuits 3000 and 3100 take the roles of circuits 1383 and 1384.

Circuit 2900 of FIG. 29 employs a first copy, 2999, and a second copy, 2922, of the circuit 100 for measuring device parameters. This first copy has its nodes 105 and 107 connected, respectively, to nodes 2902 and 2912 of the device under test capacitance and the dummy capacitance of circuit 2900. Circuit 2900 has first device under test metal lines 2904 and second device under test metal lines 2906.

For this example, lines 2904 and 2906 are formed on two separate metal layers of the semiconductor process. Lines 2904 are formed in a layer that is further from the substrate than the layer in which lines 2906 are formed.

The circuit also has first dummy device metal lines 2914 and second dummy device metal lines 2916. For this example, lines 2914 and 2916 are also formed on two separate metal layers of the semiconductor process. Lines 2914 are formed in a layer that is further from the substrate than the layer that lines 2916 are formed in. Lines 2904 and 2914 are formed in the same layer and lines 2906 and 2916 are formed in the same layer. Lines 2914 and lines 2904 have the same widths and same spacings. Lines 2914 are shorter than lines 2904 by an amount $L_{DUT}$. Lines 2916 and lines 2906 also have the same widths as one another and the same spacings as one another. Lines 2916 are also shorter than lines 2906 by the amount $L_{DUT}$. As shown in FIG. 2900, lines 2904 run parallel to lines 2906 and are interdigitated (interleaved) between lines 2906. Lines 2904 and 2906 are spaced evenly so that the spaces between individual lines are all the same as one another. Lines 2914 also run parallel to lines 2916 and are also interdigitated (interleaved) between lines 2916. Lines 2914 and 2916 are also spaced evenly so that the spaces between individual lines are all the same as one another.

The connections to lines 2914 are either identical to the connections to lines 2904 or else are mirror images of the connections to lines 2904. Also, the connections to lines 2916 are either identical to the connections to lines 2906 or else are mirror images of the connections to lines 2906. Similar correspondences between the device under test structures and the dummy device structures apply to all of the interconnects that link various lines of each group lines to each other. For example, the interconnects that link the individual lines of 2914 to one another are mirror images of the interconnects that link the individual lines of 2904 to one another. Also, the interconnects that link the individual lines of 2916 to one another are mirror images of the interconnects that link the individual lines of 2906 to one another.

In the case of circuit 2900, lines 2904 are connected to lines 2906 by interconnect 2933 and lines 2914 are connected to lines 2916 by interconnect 2943. Interconnects 2933 and 2943 are either identical to one another or else are mirror images of one another. Having lines 2906 connected to lines 2904 and having lines 2916 connected to lines 2906 makes circuit 2900 be a specific form of the general circuit 1382 for measuring the capacitances of and characterizing three electrode capacitors. The device under test capacitors and the dummy capacitors in circuits 3000 and 3100 do not have connections 2933 and 2943. Instead, 3000's and 3100's device under test capacitors and dummy capacitors are configured and connected in ways to make circuits 3000 and 3100 be specific forms of the general circuits 1383 and 1384 for measuring the capacitances of and characterizing three electrode capacitors.

As described herein in the above discussions of circuit 100, the first copy, 2999, of the test circuit 100 is used to measure the value of the sum of the capacitances connected to node 105 (including the parasitic capacitance associated with node 105, the capacitances associated with interconnect 2902, and the capacitances associated with device under test metal lines 2904 and 2906). Node 105 of the first copy of circuit 100 connects to device under test metal lines 2904, 2906 and connection 2933 via interconnect 2902.

The first copy, 2999, of the test circuit 100 is also used to measure the value of the sum of the capacitances connected to node 107 (including the parasitic capacitance associated with node 107, the capacitances associated with interconnect 2912, and the capacitances associated with dummy device metal lines 2914 and 2916). Node 107 of the first copy of circuit 100 connects to dummy device metal lines 2914, 2916 and connection 2943 via interconnect 2912.

The circuit 2900's second copy, 2922, of the circuit 100 is used to develop time varying electric fields in portions of the device under test capacitor and the dummy device capacitor of circuit 2900. All of the voltage signals applied to circuit 2922 (the second copy of 100 in the lower part of FIG. 29) are identical in timing and voltage levels to those applied to the various input nodes of 2900's first copy of 100. In practice, 2922's nodes 122, 124 and 118 are connected to their counterparts in 2900's first copy of circuit 100. When 2900's first copy, 2999, of circuit 100 is being used to measure the capacitances connected to node 105, a separate power supply is used to apply the same voltage to 2922's node 2924 as the voltage that is being applied to node 116 of 2900's first copy, 2999, of circuit 100. In this way, at each moment in time, electric field continuation lines 2908 and 2910 have the same voltages on them as do the lines in 2904 and 2906.

When 2900's first copy, 2999, of circuit 100 is being used to measure the capacitances connected to node 107, 2922' node 2924 is also biased. Circuit 130 of 2922 is used for both the device under test capacitance measurements and for the dummy device capacitance measurements. Circuit 132 in 2922 is not used for field continuation purposes and can be used, as desired, for the measurement of other capacitances.

Line 2908 is formed from the same material and on the same layer as lines 2906. It has the same line width as lines 2906 and has the same line spacing from itself to lines 2904 as lines 2906 have from lines 2904. Line 2910 is formed from the same material and on the same layer as lines 2904. It has the same line width as lines 2904 and has the same line spacing from itself to lines 2906 as lines 2904 have from lines 2906.

Lines 2908, 2910 and the voltages applied to them are needed in order to make the strengths and distributions of the electric fields at locations between lines 2904 and 2908 and between lines 2906 and 2910 be the same as the strengths and distributions at similar locations between the various lines 2906 and 2904. Lines 2908 and 2910 continue the periodic distribution (in the y-axis or up and down the page direction with respect to the orientation of FIG. 29) of the electric fields generated by the voltages on lines 2904 and 2906 to beyond the edges of 2904 and 2906. In this way, the structure formed by 2904 and 2906 has the same capacitances (or very nearly the same capacitances) per line and per line pair as would a similar structure with an infinite number of interdigitated lines (alternating between lines as in 2904 and 2906). Being able to accurately characterize structures that have periodic electric fields and periodic capacitances of this nature is important because the resultant capacitances are often used to "calibrate" the inputs to electric field simulation programs. These field simulation programs normally assume "periodic boundary conditions", boundary conditions that render the results of the simulations valid for structures that repeat to infinity in either one or two dimensions. The structures in 2900 are designed to characterize the capacitances of portions of structures that would repeat to infinity.

Lines 2918 and 2920 adjacent to lines 2914 and 2916 provide the same sort of field continuation for lines 2914 and lines 2916 as lines 2908 and 2910 do for lines 2904 and lines 2906.

The region delineated by the rectangle 2909 encloses circuit 2900's device under test. If the structures inside of rectangle 2909 were removed and the rectangle were compressed laterally, the result would look like a mirror image of circuit 2900's dummy device. Rectangle 2909 would compress to look like line 2919 in the dummy capacitance structure.

The sum of the capacitances connected to circuit 2999's node 107 are subtracted from the sum of the capacitances connected to circuit 2999's node 105. This yields the capacitance from the portions of lines 2904 and 2906 inside of rectangle 2909 to the portion of the substrate contained inside the rectangle. It is important to note that this capacitance is that which would result from a portion of a capacitor that would be infinite in expanse in both the "x direction" (left and right on the page; and the "y direction" (up and down on the page). In the example of circuit 2900, the portion would consist of three lines similar to 2904 and three lines similar to lines 2906. The length of these lines is the same as the width in the "y direction" (left and right on the page) of the rectangle 2909. This length is the same as $L_{DUT}$, the difference in lengths of the device under test and dummy device metal lines.

Circuit 2900's device under test layout and dummy device layout eliminate from the three dimensional capacitance calculations and simulations the need for considering the fringe fields that would otherwise be associated with the ends of lines. The circuit's field continuation structures also largely eliminate the inaccuracies associated with missing nearest neighbor lines in the regions adjacent to the lines whose capacitances are being measured.

It should be further noted that other embodiments of this circuit can eliminate the effects of missing second and third nearest neighbor lines by also including those lines in the device under test and the dummy device. These second and third nearest neighbor lines would (in the case of circuit 2900) be connected in common with field continuation lines 2908, 2910, 2918 and 2920.

As noted above, circuit 3000 in FIG. 30 is used in conjunction with circuit 2900 in FIG. 29 and circuit 3100 in FIG. 31 in order to determine the various electrode to electrode capacitances and the electrode to underlying ground plane capacitances of an exemplary three electrode capacitive system. Circuit 3000 is to circuit 2900 as circuit 1383 is to circuit 1382. FIG. 30 continues FIG. 29's example of two types of metal lines over a grounded substrate. Circuit 3000 has first device under test metal lines 3004 which are on the same layer, and have the same widths and spacings as circuit 2900's first device under test metal lines 2904. Circuit 3000 has second device under test metal lines 3006 which are on the same layer and have the same widths and spacings as circuit 2900's first device under test metal lines 2906.

The circuit also has first dummy device metal lines 3014 which are on the same layer and have the same widths and spacings as circuit 2900's first dummy device metal lines 2914. Circuit 30 also has second dummy device metal lines 3016 which are on the same layer, and have the same widths and spacings as circuit 2900's second dummy device metal lines 2916. As with circuit 2900's lines, circuit 3000's dummy device metal lines 3014 are shorter than the circuit's device under test metal lines 3004 by an amount $L_{DUT}$. Circuit 3000's dummy device metal lines 3016 are also shorter than the circuit's device under test metal lines 3006 by an amount $L_{DUT}$.

Circuit 3000 is very similar in structure and operation to circuit 2900. Circuit 3000 only differs from circuit 2900 in the way that circuit 3000's device under test structure and dummy device structure are configured. Circuit 3000's line structures 3004, 3006, 3014, 3016, and field continuation structures 3008, 3010, 3018, and 3020 are of the same materials, on the same layers, and are of the same dimensions and spacings as their circuit 2900 counterparts, 2904, 2906, 2914, 2916, 2908, 2910, 2918, and 2920, respectively.

Circuit 3000 is used to measure the capacitance from lines such as 3004 to lines such as 3006 and to the substrate when the lines 3006 and the substrate are at the same potential (the normal case). Lines 3004 are connected to node 105 of 3000's first copy, 3099, of circuit 100. Similarly, lines 3014 are connected to node 107 of 3000's first copy, 3099, of circuit 100. Lines 3006 and lines 3016 are both connected to a probe pad 3033 for biasing (usually to the same potential as the substrate). As in 2900, lines 3010 and 3020 are connected to the field continuation circuit 3022. These two lines are analogous to lines 2910 and 2920. Lines 3008 and 3018 also provide field continuation and are connected to probe pad 3033. Lines 3008 and 3018 are biased to the same potential as lines 3006 and lines 3016 because lines 3008 and 3018 act toward lines 3004 and 3014 in the same fashions as lines 3006 and lines 3016 do.

The voltages on lines 3004 and 3014 oscillate when the capacitances of these lines are being measured. To continue the periodic electric field patterns caused by lines 3004 and 3014, field continuation generation circuit 3022 causes the voltages on lines 3010 and 3020 to also oscillate with the same voltage signals as those on lines 3004 and 3014. The voltages on lines 3006 and 3016 are held constant (normally to the same ground potential as that on the substrate). In order to continue the periodic electric field pattern caused by the voltages on lines 3006 and 3016 being held constant, the voltages on field continuation lines 3008 and 3018 are also held constant (with the same voltages as the voltages on lines 3006 and 3016). In short, lines 3008, 3010, 3018 and 3020 continue the electric field patterns set up by lines 3004, 3006, 3014, and 3016 during the respective times when measurements are being performed on lines 3004 and lines 3014.

In analogy to rectangle 2909 in FIG. 29, rectangle 3009 in FIG. 30 encloses the device whose capacitance is being measured in circuit 3000. Circuit 3000 provides a means for measuring the capacitance from the portions of lines 3004 inside of rectangle 3009 to the structure comprising the portions of lines 3006 in rectangle 3009, the portions of line 3008 in rectangle 3009, and the portion of the substrate in rectangle 3009. As in circuit 2900, the lengths of the portions of the lines 3004 and 3006 which contribute to the measured capacitance are the same as $L_{DUT}$, the difference in lengths of the device under test and dummy device metal lines.

As with the capacitance measured by circuit 2900, this capacitance is the capacitance that would result from a portion of a capacitor that would be infinite in expanse in both the "x direction" (left and right on the page) and the "y direction" (up and down the page). As with circuit 2900's capacitances, circuit 3000's device under test layout and dummy device layout eliminate from the three dimensional capacitance calculations and simulations, the need for considering the fringe fields that would otherwise be associated with the ends of lines. The circuit's field continuation structures also largely eliminate the inaccuracies associated with missing nearest neighbor lines in the regions adjacent to the lines whose capacitances are being measured.

It should be further noted that other embodiments of this circuit can also eliminate the effects of missing second and third nearest neighbor lines by including those lines in the device under test and the dummy device. Among these added second to nearest neighbor and third to nearest neighbor field continuation lines, lines similar to lines 3008 and 3018 (of the same material on the same layer, with the same dimensions and spacings) would be connected in common with lines 3008 and 3018. Added second to nearest neighbor and third to nearest neighbor field continuation lines similar to 3010 and 3020 would be connected in common with lines 3010 and 3020.

Circuit 3000 serves the same role as circuit 1383 with the portion of lines 3004 in rectangle 3009 serving the same role as electrode 1342 ("Electrode A") in circuit 1383.

As noted above, circuit 3100 in FIG. 31 is used in conjunction with circuit 2900 in FIG. 29 and circuit 3000 in FIG. 30 in order to determine the various electrode to electrode capacitances and the electrode to underlying ground plane capacitances of an exemplary three electrode capacitive system. Circuit 3100 is to circuits 2900 and 3000 as circuit 1384 is to circuits 1382 and 1383. FIG. 31 continues FIG. 29's example of two types of metal lines over a grounded substrate. Circuit 3100 has first device under test metal lines 3104 which are on the same layer and have the same widths and spacings as circuit 2900's first device under test metal lines 2904. Circuit 3100 has second device under test metal lines 3106 which are on the same layer and have the same widths and spacings as circuit 2900's first device under test metal lines 2906.

The circuit also has first dummy device metal lines 3114 which are on the same layer and have the same widths and spacings as circuit 2900's first dummy device metal lines 2914. Circuit 31 also has second dummy device metal lines 3116 which are on the same layer and have the same widths and spacings as circuit 2900's second dummy device metal lines 2916. As with circuit 2900's lines, circuit 3100's dummy device metal lines 3114 are shorter than the circuit's device under test metal lines 3104 by an amount $L_{DUT}$. Circuit 3100's dummy device metal lines 3116 are also shorter than the circuit's device under test metal lines 3106 by an amount $L_{DUT}$.

Circuit 3100 is very similar in structure and operation to circuit 2900. Circuit 3100 only differs from circuit 2900 in the way that circuit 3100's device under test structure and dummy device structure are configured. Circuit 3100's line structures 3104, 3106, 3114, 3116, and field continuation structures 3108, 3110, 3118, and 3120 are of the same materials, on the same layers, and are of the same dimensions and spacings as their circuit 2900 counterparts, 2904, 2906, 2914, 2916, 2910, 2908, 2920, and 2918, respectively.

Very similar to circuits 2900 and 3000, circuit 3100 uses device under test capacitance and dummy device capacitance cancellations to provide a means for measuring interconnect line capacitances. In particular, circuit 3100 provides a means for measuring the capacitance from the portions of lines 3106 inside of rectangle 3109 to the structure comprising the portions of lines 3104 in rectangle 3109, the portions of line 3108 in rectangle 3109, and the portion of the substrate in rectangle 3109. As with the capacitance measured by circuit 2900, this capacitance is the capacitance that would result from a portion of a capacitor that would be infinite in expanse in both the "x direction" (left and right on the page) and the "y direction" (up and down the page). As with circuit 2900's capacitances, circuit 3100's device under test layout and dummy device layout eliminate from the three dimensional capacitance calculations and simulations the need for considering the fringe fields that would otherwise be associated with the ends of lines. The circuit field continuation structures also largely eliminate the inaccuracies associated with the missing nearest neighbor lines in the regions adjacent to the lines whose capacitances are being measured.

As with circuits 2900 and 3000, it should be further noted that other embodiments of this circuit can also eliminate the effects of missing second and third nearest neighbor lines by including those lines in the device under test and the dummy device. Among these added second to nearest neighbor and third to nearest neighbor field continuation lines, lines similar to line 3108 and 3118 (of the same material on the same layer, with the same dimensions and spacings) would be connected in common with lines 3108 and 3118. Added second to nearest neighbor and third to nearest neighbor field continuation lines similar to 3110 and 3120 would be connected in common with lines 3110 and 3120.

Circuit 3100 serves the same role as circuit 1384 with the portion of lines 3106 in rectangle 3109 serving the same role as electrode 1364 ("Electrode B") in circuit 1384.

With circuits 2900, 3000 and 3100 acting in concert with one another, the various interelectrode capacitances (analogous to those shown in FIG. 13) from the first type of interconnect line to the second type of interconnect line, from the first type of interconnect line to the substrate, and from the second type of interconnect line to the substrate can be measured.

It is important to note that capacitance circuits for determining the capacitances of non-periodic structures can also be created from reductions of circuits 2900, 3000, and 3100. A simple example is that of having a single line of a first type of interconnect run parallel for a distance with a single line of a second type of interconnect. The first interconnect would be substituted for one of the lines of 2904, 3004 and 3104 in circuits 2900, 3000, 3100 while the second interconnect would be substituted for one of the adjacent lines of 2906, 3006 and 3106. Analogous substitutions would be made for the dummy devices' lines 2914, 3014, 3114, 2916, 3016, and 3116. In all cases the lengths of the dummy device interconnect lines would be shorter than the device under test lines by an amount $L_{DUT}$. The portions of the dummy device lines running parallel to one another would be shorter than the parallel portions of the devices under test's lines by an amount $L_{DUT}$. All electric field continuation structures would be removed. The three resulting circuits would be suitable for measuring the capacitances from line to line and the capacitances from each line to the substrate or ground plane. The capacitances would be the capacitances corresponding to a length $L_{DUT}$ of two isolated parallel lines of the first and second types of interconnect.

All of these circuits 2900, 3000, 3100, and their three single lines in parallel analogies, can be copied and their line widths and line spacings modified to create circuits which can be used to determine the values of various components of the overall capacitances. Further, these circuits can be modified to consider four and more electrode capacitance systems.

The circuits 3200, 3300, and 3400 (FIG. 32, FIG. 33, and FIG. 34) are further examples of how circuits 2900, 3000 and 3100 can be used. The three circuits illustrate an exemplary embodiment of circuits for determining the capacitance from a first set of interconnect lines, to a second set of interconnect lines, with the first set of lines crossing the second set of lines. The first set of interconnect lines are comprised of a first type of interconnect having first line widths and first line spacings. The second set of interconnect lines are comprised of a second type of interconnect having second line widths and second line spacings. The first and second types of interconnects are formed on separate non-intersecting layers of the semiconductor test chip.

Of the three circuits, 3200, 3300, and 3400, circuit 3200 is analogous to circuits 1382 and 2900. Circuit 3300 is analogous to circuits 1383 and 3000. And circuit 3400 is analogous to circuits 1384 and 3100. Circuits 3200, 3300, and 3400 are also used for determining the interelectrode capacitances of a three electrode capacitance system. In this case the three electrodes are the first set of interconnect lines, the second set of interconnect lines, and an underlying ground plane (normally the underlying semiconductor substrate).

Figure 32:
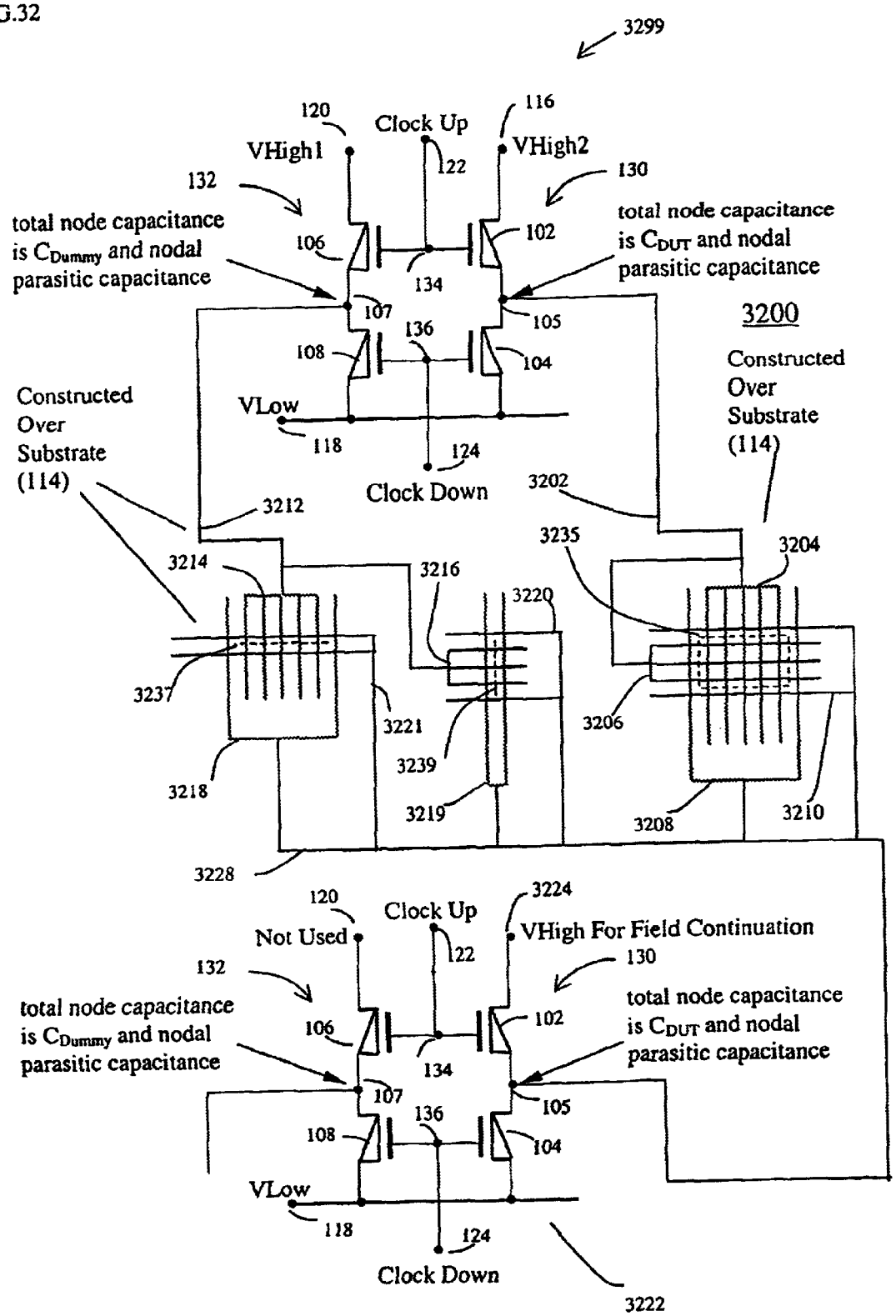
FIG. 32 is an illustration of an exemplary on-chip circuit in partial schematic, partial layout form which uses two copies of the test circuit of FIG. 1 for measuring device parameters.

Circuit 3200 considers the case in which the first and second set of interconnect lines are connected together and the capacitance from them to the ground plane is measured. Circuit 3200 has device under test interconnect lines 3204 and 3206, and dummy device interconnect lines 3214 and 3216. The circuit also has field continuation interconnect lines 3208, 3219, 3220, and 3218 connected to the circuit's second copy, 3222, of circuit 100. Circuit 3200's first copy, 3299, of circuit 100 is shown at the top of FIG. 32. Lines 3219 and 3221 in the dummy device provide capacitances from themselves to lines 3216 and 3214. These components of the dummy device capacitances are equal to the device under test capacitances from lines 3204 to lines 3210 and from lines 3206 to lines 3208. These dummy and device under test capacitances are designed to cancel one another.

Lines 3204, 3208, 3219, 3214, and 3218 running in the vertical direction (y direction) with respect to FIG. 32 are composed of the first type of interconnect, while lines 3206, 3210, 3216, 3220, and 3221 running in the horizontal direction (x direction) with, respect to FIG. 32 are composed of the first type of interconnect. Rectangle 3235 has a horizontal width $L_{DUT}$ and a vertical height $H_{DUT}$.

Device under test capacitor lines 3206 are longer than dummy capacitor lines 3216 by an amount equal to $L_{DUT}$. Device under test capacitor lines 3204 are longer than dummy capacitor lines 3214 by an amount equal to $H_{DUT}$. As shown in FIG. 32, interconnects 3202 and 3212 will have the same capacitances to the substrate as each other. The two interconnects are equivalent to one another in their total lengths and, from a capacitance standpoint, have equivalent shapes. The two lines have the same number of corners in them and have the same lengths in their line segments.

The capacitances connected to node 107 of the first copy, 3299, of circuit 100 are subtracted from the capacitances connected to node 105 of the first copy, 3299, of circuit 100. The result is the capacitance from the portions of lines 3204 and 3206 contained in rectangle 3235 to the portion of the substrate contained in 3235. This capacitance can be interpreted as the capacitance of a portion of a periodic capacitance structure (periodic in x and y directions) that extends to infinity in vertical as well as horizontal expanse. The portion of the infinite capacitor that this circuit considers is a portion like that contained in rectangle 3235.

Similarly, circuit 3300 of FIG. 33 measures the capacitance from the portion of first lines 3304 contained in rectangle 3335 to the portions of second lines 3306 and the underlying ground plane (normally the substrate) contained in rectangle 3335. Again rectangle 3335 has height $H_{DUT}$ and width $L_{DUT}$. $H_{DUT}$ corresponds to the difference in lengths of the device under test lines 3304 and the dummy device lines 3314. The dimensions of rectangle 3335 are identical to the dimensions of rectangle 3235 in circuit 3200. Moreover, the two rectangles contain identical structures.

Figure 34:
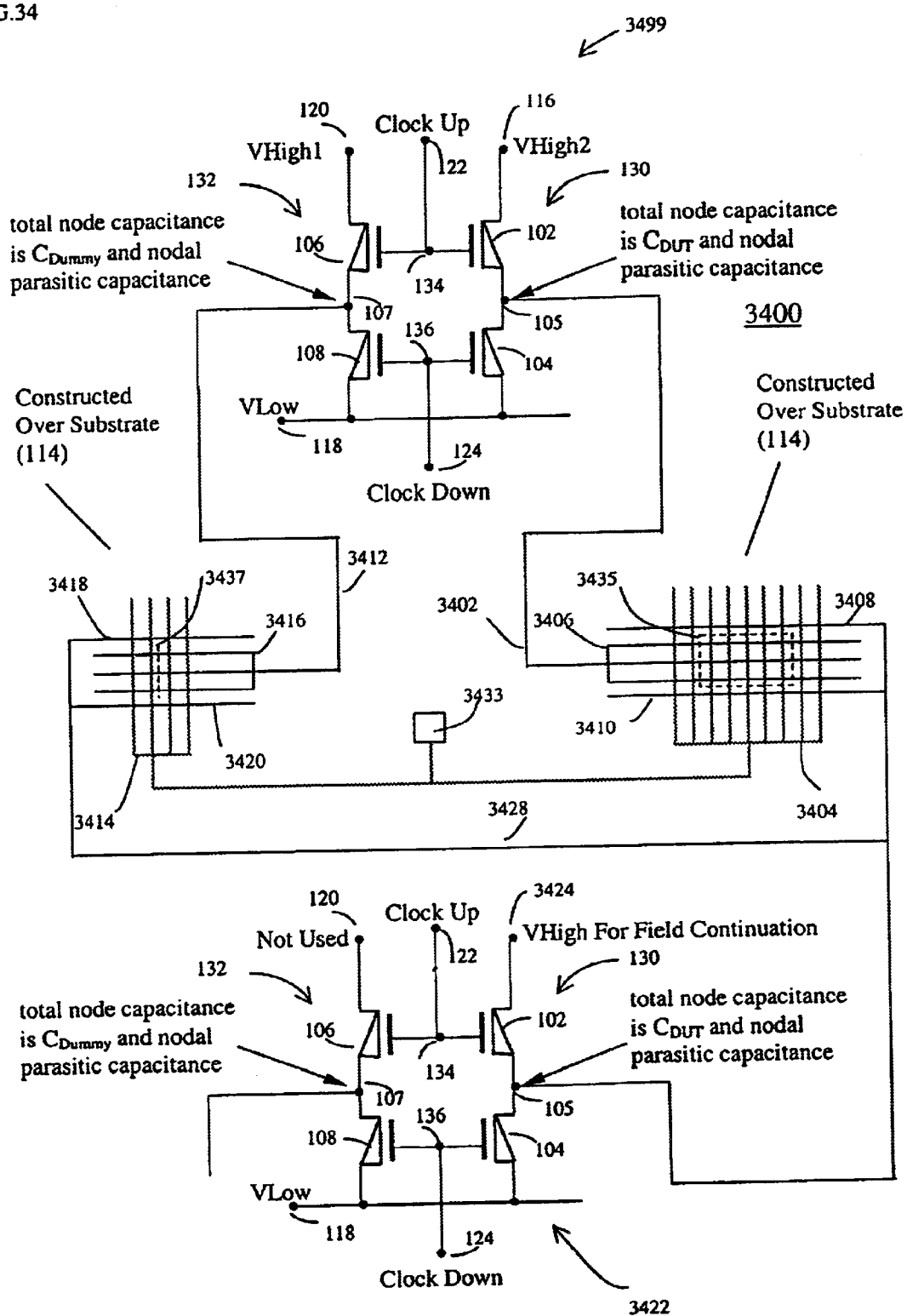
FIG. 34 is an illustration of an exemplary on-chip circuit in partial schematic, partial layout form which uses two copies of the test circuit of FIG. 1 for measuring device parameters.

Finally, circuit 3400 of FIG. 34 measures the capacitance from the portion of second lines 3406 contained in rectangle 3435 to the portions of first lines 3404 and the underlying ground plane (normally the substrate) contained in rectangle 3435. Again rectangle 3435 has height $H_{DUT}$ and width $L_{DUT}$. $L_{DUT}$ corresponds to the difference in lengths of the device under test lines 3406 and the dummy device lines 3416. The dimensions of rectangle 3435 are identical to the dimensions of rectangles 3235, and 3335 in circuits 3200 and 3300.

Circuit 3200 serves the same role as circuit 1382 with the portion of lines 3204 and 3206 in rectangle 3235 serving the same roles as electrodes 1322 and 1324 ("Electrodes A and B") in circuit 1382. Circuit 3300 serves the same role as circuit 1383 with the portion of lines 3304 contained in rectangle 3335 serving the same role as electrode 1342 ("Electrode A") in circuit 1383. The portion of lines 3306 contained in circuit 3300's rectangle 3335 serve the same role as electrode 1344 ("Electrode B") in circuit 1383. Circuit 3400 serves the same role as circuit 1384 with the portion of lines 3406 contained in rectangle 3435 serving the same role as electrode 1364 ("Electrode B") in circuit 1384. The portion of lines 3404 contained in circuit 3400's rectangle 3435 serve the same role as electrode 1362 ("Electrode A") in circuit 1384.

With circuits 3200, 3300 and 3400 acting in concert, the various interelectrode capacitances analogous to those shown in FIG. 13 can be measured. For circuits 3200, 3300 and 3400, these interelectrode capacitances are the capacitances from the first set of interconnect lines to the second set of interconnect lines, from the first set of interconnect lines to the underlying ground plane (normally the substrate), and from the second set of interconnect lines to the underlying ground plane.

As with circuits 2900, 3000 and 3100, it is important to note that circuits for determining the capacitances of non-periodic structures can also be created from reductions of circuits 3200, 3300, and 3400. A simple example is that of having a first interconnect, comprised of a single line of a first interconnect type cross a second interconnect, comprised of a single line of a second interconnect type. The first interconnect is substituted for one of the lines of each of 3204, 3304 and 3404 in circuits 3200, 3300, 3400 while the second interconnect is substituted for one of the lines of 3206, 3306 and 3406. The dummy devices are versions of the device under test first and second interconnect lines that are shortened by a uniform amount so as not to include the crossings of conductors.

These dummy device lines are most easily made from copies of the device under test lines. The dummy device lines are uniformly shortened as appropriate by an amount equal to the portion of the device under test lines that were considered to be part of the device under test line crossing. All the dummy capacitances are capacitances to the underlying ground plane. Electric field continuation and generation structures 3221, 3220, 3208, 3210, 3320, 3310, 3418, and 3408 are removed. The three resulting circuits are suitable for measuring the line to line and line to underlying ground plane capacitances.

All of these circuits (3200, 3300, 3400, and their three single lines crossing other lines embodiments) can be copied and their line widths and line spacings modified to create circuits which can be used to determine the values of various components of the overall capacitances. Further, these circuits can also be modified to consider four and more electrode capacitance systems.

FIG. 35 is a schematic diagram of a test circuit 3500 for characterizing device parameters. Among these parameters, the circuit is well suited for measuring very small DC currents through various devices.

Circuit 3500 employs capacitive devices which have had their capacitance versus voltage characteristics previously characterized using various of the embodiments of circuit 100 for characterizing device parameters. These capacitive devices are either insulators to DC currents or else pass very small amounts of DC currents (for example 10 femto Amps, $10^{-14}$ Amps).

The circuit of FIG. 35 includes a voltage sense transistor 3508, which is an n-channel MOSFET in the preferred embodiment, and a duplicate transistor 3512, along with a pull-up capacitor 3503 and a pull-down capacitive device 3505. In the preferred embodiment, all of these devices are fabricated on the semiconductor substrate of a process development test chip or a production process control monitor test structure. The gate capacitance of the voltage sense transistor has also had its capacitance versus voltage characteristics previously characterized using various of the embodiments of circuit 100 for characterizing device parameters.

In this example, pull down device 3505 is a semiconductor p-n junction diode. The diode will be reversed biased and has a well characterized reverse biased capacitance. In this embodiment, circuit 3500 provides a means for measuring the reverse biased leakage current of diode 3505. The voltage sense transistor 3508 has a drain connected to a probe pad 3507 and a source connected to a probe pad 3509 for applying bias voltages to the drain and to the source of transistor 3508 and for detecting currents into the drain of transistor 3508.

One terminal of capacitor 3503 is connected to probe pad 3502 for applying voltages to the capacitor. The other terminal of capacitor 3503 is connected to node 3504. One terminal of diode 3505 is connected to probe pad 3506 for applying voltages to the device. The other terminal of diode 3505 is connected to node 3504. In the preferred embodiment, the p-doped end of diode 3505 is connected to probe pad 3506 and the diode's n-doped end is connected to node 3504. The gate of the voltage sense transistor 3508, is connected to node 3504 and provides a means for sensing the voltage at node 3504.

The duplicate transistor 3512 is preferably substantially identical to the voltage sense transistor 3508 so that the operational characteristics of the duplicate transistor 3512 substantially match those of the voltage sense transistor 3508. The duplicate transistor 3512 has a drain connected to a probe pad 3510, a source connected to a probe pad 3513, and a gate connected to a probe pad 3511. The probe pads permit application and sensing of voltages and currents at each of the terminals of the transistor 3512.

To first order, devices 3503, 3505 and 3508 form a capacitive voltage divider from node 3502 to node 3506 with node 3502 intended to be the more positive voltage going of the several nodes. During voltage division, with the voltage on node 3502 being increased in the positive sense and the voltages applied to nodes 3506, 3507 and 3509 being held constant, the increase in voltage on node 3502 tends to couple positive voltage onto node 3504 via the capacitance of device 3503. At the same time, the capacitances of devices 3505 and 3508 tend to retard the increase in voltage on node 3504. The capacitances associated with device 3508 which tend to retard the rise in voltage on node 3504 are the transistor's gate to drain, gate to source, gate to inversion layer and gate to body capacitances.

The voltage sense transistor 3508, with its gate connected to the common node 3504, provides an indication of the voltage at the common node 3504. Preferably, the pull-up capacitor 3503 is a known value capacitor such as a voltage invariant metal-to-metal capacitor characterized using the techniques described herein, or a well characterized voltage variable gate oxide capacitor characterized using the techniques described herein. When 3503 is a gate oxide capacitor, it is normally implemented as a p-channel transistor with its gate connected to node 3504 and its source and drain connected to node 3502. In the preferred embodiment, the transistor is formed in an n-doped well in the semiconductor's p-doped substrate. Similarly, the pull down device 3505 has a capacitance-voltage behavior characterized using the techniques described herein. Any type of capacitive device may be suitably used.

Figure 36:
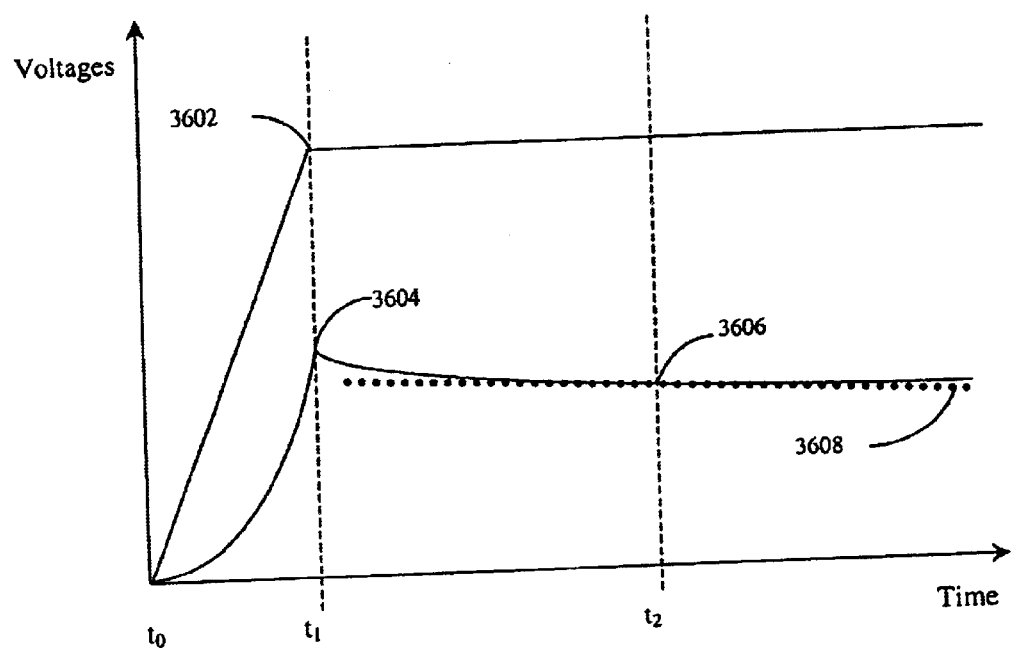
FIG. 36 is an exemplary waveform for activating the test circuit of FIG. 35 and a resultant waveform.

During voltage division, the voltage on node 3504 is determined via voltage sense transistor 3508. Before a voltage is applied to node 3502, a drain voltage is applied to node 3507 (for example 5 volts), and a source voltage is applied to node 3509 (for this example 0 volts with the substrate grounded). From this point until the end of the test, the drain current into node 3507 is monitored and values are periodically recorded. Voltages are applied to node 3506 (usually 0 volts in this embodiment) and to node 3502. Representative voltage versus time characteristics are shown in FIG. 36. An example voltage signal to be applied to node 3502 is marked 3602 in FIG. 36. When a positive voltage is applied to node 3502, capacitor 3503 couples a positive voltage onto node 3504 raising the voltage on the node. The voltage on node 3504 must attain a voltage large enough to turn on transistor 3508. The magnitude of the voltage on node 3504 is determined by the value of the voltage applied to node 3502 and by the capacitances of devices 3503, 3505 and 3508. The sizes of these devices' capacitances can be suitably chosen during test circuit construction. With the voltage on node 3504 large enough to exceed the gate to source threshold voltage of transistor 3508, the transistor turns on and conducts current.

The amount of current flowing into the drain of transistor 3508 is a strong function of the voltage on the transistor's gate, the voltage on node 3504. This is particularly the case when the voltage on node 3507, the transistor's drain, is chosen to be substantially greater than the voltage that will appear on node 3504 (transistor in saturation).

The precise voltage, normally within ±0.005 volts, on node 3504 can be determined by also applying the same drain and source voltages to duplicate transistor 3512 that are applied to transistor 3508. The same voltage as that which is applied to probe pad 3507 is applied to probe pad 3510 and the same voltage as that which is applied to probe pad 3509 is applied to probe pad 3513. A voltage is applied to the duplicate transistor's gate probe pad 3511. The current into the duplicate transistor's drain 3510 is also monitored and the voltage applied to the duplicate transistor's gate, 3511, is modified until the current into the drain 3510 of the duplicate transistor is the same as the current into the drain 3507 of the voltage sense transistor. Typically the voltage on the gate of transistor 3512 is binary searched by the automatic test system that is conducting the tests. Once equivalent drain currents are achieved in the two transistors, the voltage on the gate 3511 of the duplicate transistor 3512 is the same as the voltage on node 3504, the gate of the voltage sense transistor.

It is important to note that the periodic recording of the currents through sense transistor 3508 and the determination of the matching gate voltages on node 3511 of duplicate transistor 3512 need not occur simultaneously. A series of currents into node 3507 can be measured over time and later these currents can be used to determine what the voltage on node 3504 was at the time of each measurement. As long as the temperatures of transistors 3508 and 3512 are the same during the measurements of currents into nodes 3507 and 3510, and as long as the parameters of the two devices are stable over time, the measurement of currents into node 3507 and the determination of the corresponding voltages on node 3504 can take place at widely separate times.

As the voltage on node 3502 is raised from ground potential to a fixed voltage, the voltage on node 3504 will increase to a specific voltage due to the coupling of voltage through capacitor 3503. FIG. 36 illustrates exemplary voltage versus time signals for the voltage applied to node 3502 (curve 3602) and for the resultant voltage on node 3504 (curve 3606). At time $t_1$, the voltage applied to node 3502 has reached its peak value and is then held constant. In response, the voltage on node 3504 rises to its peak voltage shown as point 3604. Due to the positive voltage on node 3504, device 3505, which is in this case a reverse biased diode, will begin to pass current. This current will slowly reduce the positive charge on the node 3504 connected terminals of the various capacitive devices connected to node 3504. Over time, this charge loss will lower the voltage on node 3504. The sizes of the capacitances of devices 3503, 3505 and transistor 3508 can be chosen during test circuit design to adjust the expected fall rate of the voltage on node 3504. This is an important test equipment issue. The fall rate must be slow enough to allow the test equipment enough time to measure the currents into node 3507 several times during the fall time. Very slow voltage decay times require larger capacitors and can lengthen test times. Very fast voltage decay times can be too fast for some parametric test systems to accurately measure.

Having a thorough understanding of the capacitance versus voltage characteristics of the devices in circuit 3500, and having an accurate method for monitoring the time dependence of the voltage on node 3504, provide a means for determining the amount of current flowing through device 3505. The leakage current through the diode is equal to the time derivative of the voltage on node 3504 (dV/dt) multiplied by the sum of the capacitances connected to node 3504. This assumes that the voltages on all other nodes of circuit 3500 are constant. This derivative is shown in FIG. 36 as the slope of the tangent 3608 to the voltage versus time curve for the voltage on node 3504. This tangent occurs at time $t_2$ in FIG. 36. The diode current calculated from the time derivative would be valid for the voltages at time $t_2$. If necessary, a circuit simulator can also be used as an aid in determining the current through device 3505 from the change in node 3504's voltage over time. Careful choice of the types and capacitances of the devices used in circuit 3500 enables a wide range of voltages to be induced on node 3504. This in turn allows the current through device 3505 to be characterized over a wide range of DC voltage conditions.

Because the reverse biased leakage current of each diode can vary greatly with variations in temperature, several circuits with several sets of device capacitance sizes may be necessary for characterizing the leakage currents of each diode over a range of temperatures. Copies of all of the capacitors connected to node 3504 can be thoroughly characterized via the various embodiments of the capacitance measurement methods provided by circuit 100.

The implementation illustrated in FIG. 35 is particularly suitable for measuring reverse bias currents in the diode forming the pull down capacitor 3505. The pull-up capacitor 3503 is preferably a capacitor that allows passage of little or no DC current while the reverse biased diode 3505 allows passage of some level of DC current. Further, the gate of the voltage sensing transistor 3508 allows passage of little or no DC current.

In this embodiment, the device which has its current characterized and which acts as the voltage divider pull down device 3505 is a diode. In alternative embodiments, small currents can be measured through any device with a capacitance. The device to be measured is placed in the position occupied by device 3505 in circuit 3500.

It is to be noted that the techniques for characterizing the reverse bias diode forming the pull down capacitor 3505 may be extended to a characterization of any suitable device. This includes any of the p-n junctions formed in the semiconductor substrate, including well-substrate junctions, active area-substrate junctions, active area-well junctions, etc. Further, the currents through other types of devices such as the gate leakage currents of metal semiconductor field effect transistors (MESFET's) may be characterized in this manner.

When it is desired to measure the current through a device that has a relatively small capacitance, a non-conductive device (non-conductive in the DC sense) with a large capacitance can be placed in the position occupied by device 3505 in circuit 3500. The low capacitance device with the current to be measured is placed in parallel with the larger capacitance device occupying the place of 3505. The current through the low capacitance device is measured in the same fashion as described herein with the only difference being that the calculation of the current must also account for the capacitance of the added large capacitance device.

FIG. 37 illustrates an extension of this general technique. Circuit 3700 provides a means for measuring tunnel currents through a dielectric such as a gate oxide layer. Circuit 3700 includes a voltage sense transistor 3708 having a drain connected to a probe pad 3707, a source connected to a probe pad 3709 and a gate connected to node 3704. In the preferred embodiment, the sense transistor is an n-channel enhancement transistor formed in a p-doped well 3721 in an n-doped well 3720 formed in the semiconductor substrate. In this way positive or negative voltages can be applied to p-well 3721. With negative voltages applied to p-well 3721, sense transistor 3708 can be operated with negative voltages present on its drain 3707, source 3709 and gate 3704 nodes.

Circuit 3700 further includes a duplicate transistor 3712 having its drain, gate and source electrically connected to probe pads 3710, 3711 and 3713, respectively. Duplicate transistor 3712 also resides in a p-doped well in an n-doped well in the p-doped semiconductor substrate. In the preferred embodiment, the sense device and the duplicate sense device share the same p-well 3721 and the same n-well 3720. In addition, in the circuit 3700, a capacitor voltage divider is formed using a pull-up capacitor 3703 and a pull down capacitor 3716. In the implementation of FIG. 37, the pull down capacitor 3716 is formed using the floating gate of a floating gate transistor. Floating gate transistors are typically used in non-volatile memory devices such as in Flash EPROM memories. The floating gate device has source and drain regions diffused in a substrate or a well area. Above the source, drain and transistor channel are two gates made of poly silicon. The first gate is a floating gate, meaning that it is not normally electrically connected and is isolated by a gate dielectric and an inter-poly dielectric. The second gate is a control gate and is electrically connected to other portions of the circuit. In the circuit 3700, the source of the floating gate transistor is connected to a probe pad 3714 and the drain of the transistor is connected to a probe pad 3717. The floating gate is electrically connected to node 3704. The control gate of the floating gate transistor is electrically connected to a probe pad 3706.

The pull-up capacitor 3703 is preferably a previously characterized voltage-dependent or voltage-independent capacitor. In one embodiment, capacitor 3703 is a p-channel MOSFET transistor gate oxide capacitor formed in an n-well formed in the p-type substrate. The transistor capacitor uses thick gate oxide as opposed to tunnel oxide. The voltage divider upper node at the probe pad 3702 is formed from the source/drain diffusion of gate oxide capacitor 3703. The gate of gate oxide capacitor 3703 is connected to node 3704. Alternatively, the capacitor 3703 may be formed using a metal-to-metal capacitor.

Copies of all of the capacitances in the circuit 3700 are previously characterized via the use various embodiments of circuit 100. For example, the tunnel oxide capacitance between the floating gate and the source and drain of the transistor forming the pull down capacitor has been previously characterized for voltage dependence.

Using methods very similar in concept to those described in conjunction with circuit 3500, the tunneling current from the floating gate 3715 to the channel and source and drain of floating gate transistor 3716 can be characterized over a range of voltages. In addition to providing for the inducement of and sensing of positive voltages on node 3704, circuit 3700 provides for the inducement and sensing of negative voltages on node 3704. The tunneling of electrons from the floating gate 3715, to the channel, to the source 3714 or to the drain 3717 of transistor 3716 can be characterized when node 3704 has a sufficient negative voltage on it. Negative voltages are coupled into node 3704 via the application of negative voltages to nodes 3702 and 3706. In addition to the rest of the capacitances in circuit 3700, the tunneling current calculations must take into account the effects of the capacitance from transistor 3716's floating gate 3715 to the transistor's control gate 3705.

Along with allowing the measurement of tunneling currents through the tunneling dielectric between the channel of transistor 3716 and floating gate 3715, circuit 3700 also allows the programming and erasure of floating gate transistor 3716. Normal memory transistor source and drain voltages suitable for transistor programming and erasure can be applied to the source 3714 and drain 3717 of floating gate transistor 3716 while normal programming and erase voltages can be connected onto the floating gate via the application of appropriate voltages to probe pads 3702 and 3706.

Through its ability to provide a method for measuring the amount of charge on node 3704, circuit 3700 provides a way to measure the amount of charging current flowing through the channel to floating gate dielectric during the programming of transistor 3716. As already noted above, the circuit provides for the measurement of tunneling current through this same dielectric. This tunneling current is the current that is normally used to erase the transistor.

As with test circuit 100 and its devices under test, multiple copies of test circuits 3500 and 3700 and their associated devices under test, 3505 and 3705, and their duplicate sense transistors, 3512 and 3712, can be constructed in smaller spaces on test wafers than can the probe pads that are required for connecting such circuits to parametric test systems. Using just a few probe pads to control many such circuits 3500 and 3700 can be very advantageous from the standpoint of saving space on test wafers and test chips. Moreover, using just a few probe pads to control many test circuits 3500 and 3700 is a likely requirement for economically placing large numbers of current measurement circuits 3500 and 3700 into product wafer scribe lines scribe grids.

FIG. 38 illustrates an exemplary embodiment of a test circuit 3800 that uses a relatively small number of probe pads to control a large number of individual test circuits. Test circuit 3800 controls multiple copies of test circuit 3500. A very similar method can be used to control multiple copies of test circuit 3700. Test circuit 3800 allows the sharing of individual test structure probe pads by numerous device test structures, that is, multiplexing of test structure probe pads.

In FIG. 38, the multiplexing technique is implemented by connecting numerous copies of a test circuit such as test circuit 3500 to the same probe pad, pad 3807. The copies of circuit 3500 are connected in a parallel configuration. The connections to probe pad 3807 are made through select transistors 3817, 3827, 3837. In this embodiment, these select transistors are p-channel MOSFET transistors fabricated in an n-doped well in the semiconductor technology's p-doped substrate. Although only three measurement circuits, 3871, 3872, 3873, are shown in FIG. 38 connected to probe pad 3807, the circuit 3800 can accommodate many copies of such circuits. Many circuits such as circuit 3871 can be connected to a single probe pad such as pad 3807. Each circuit like 3871 can be linked to the probe pad with a select transistor identical to transistors 3817, 3827, 3837.

Furthermore, FIG. 38 shows the circuitry associated with only one multiplexed probe pad 3807. Normally, multiple copies of the circuit shown in FIG. 38 are fabricated in close proximity to one another. These multiple copies share common signal lines.

Along with controlling select transistors 3817, 3827, 3837, probe pads 3802, 3812, 3822 also control the select transistors connecting other probe pads similar to pad 3807 with other measurement circuits similar to circuits 3871, 3872, 3873. Probe pads 3832, 3806, 3809, 3819 each also carry common signals to these other measurement circuits connected to other probe pads similar to probe pad 3807.

Circuit 3800 functions in a very similar fashion to how circuit 3500 functions. Reverse biased leakage currents are measured through diodes 3805, 3815, 3825 in largely the same manner as currents are measured through diode 3505 of circuit 3500. Pull up capacitors 3803, 3813, 3823 have the same role as pull up capacitor 3503 in circuit 3500. Voltage sense transistors 3808, 3818 and 3828 have the same role as voltage sense transistor 3508 of circuit 3500. Duplicate sense transistor 3852 is substantially identical to voltage sense transistors 3808, 3818, 3828. Duplicate sense transistor select device 3855 is substantially identical to select transistors 3817, 3827, 3837. This embodiment also includes auxiliary pull down capacitors 3804, 3814 and 3824. These capacitors are added to circuit 3800 as an example of how additional capacitance can be added in parallel with diodes 3805, 3815, 3825. This is sometimes done in order to augment the natural capacitances of the diodes 3805, 3815, 3825. These auxiliary capacitors are typically included in circuits such as circuit 3800 and circuit 3500 when the capacitances of diodes 3805, 3815, 3825 and 3505 are small compared with the capacitances of the other devices in the circuits. Auxiliary pull down capacitors 3804, 3814, 3824 are often not necessary and are not specifically needed for the multiplexing accomplished by circuit 3800.

A single current measurement circuit such as circuit 3871 can be selected from among the various current measurement circuits by turning on the selected circuit's select transistor. For example, individual current measurement circuit 3871 can be used to measure the current through diode 3805 by applying an appropriately large negative voltage to probe pad 3822 which is electrically coupled with the gate of select transistor 3817. Meanwhile, measurement circuits 3872, 3873 and all other measurement circuits connected to node 3807 are deselected by applying appropriately large positive voltages to their select transistors 3827, 3837 and the select transistors for any other measurement circuits connected to probe pad 3807.

In this way, applying a positive voltage to probe pad 3807 allows current to enter the drain of transistor 3808. This current is analogous to the current running into the drain of transistor 3508 when circuit 3500 is sensing the voltage on node 3504. With a sufficiently large negative voltage on the gate 3822, of p-channel select transistor 3817, almost all of the voltage from pad 3807 to sense transistor source pad 3809 is present as drain to source voltage on transistor 3808. In other words, transistor 3817 is operated in its linear mode with very little voltage drop from its source to its drain. Further, select transistors 3817, 3827, 3837 and 3855 are normally designed with short channel lengths and wide channel widths. In this way, when the transistors are turned on, their drain to source voltages will be small even with relatively large source to drain currents running through them.

As with circuit 3500, the voltages on nodes 3881, 3882, 3883 are determined from the amounts of currents passing through transistors 3808, 3818, 3828. Again, note that only one of these transistors will be passing current during a given measurement. The other two circuits' select transistors are turned off. As with circuit 3500, the voltage on the gate 3851 of the duplicate sense transistor 3852 is varied until the current through the duplicate sense transistor matches the current through the selected sense transistor one of either 3808, 3818 or 3828.

To some extent, the presence of the select transistors in circuit 3800 will influence the drain to source current passing through the selected sense transistor. This influence is duplicated by the duplicate select transistor 3855 in the duplicate sense circuit. This duplicate sense circuit is shown in FIG. 38 connected to probe pads 3850, 3853, 3854, 3851. For example, assume that transistors 3827 and 3837 and other select transistors not shown in FIG. 38 are unselected (turned off). With equal voltages applied to probe pads 3807, 3850, equal voltages applied to probe pads 3809, 3853, and equal voltages applied to probe pads 3822, 3854, equal currents will flow through transistors 3808 and 3852 once the voltage on node 3851 attains the same level as the voltage on node 3881.

The currents through diodes 3804, 3814 and 3824 are determined as explained in the previous discussions of circuit 3500 in FIG. 35. Multiple copies of circuit 3800 connected to multiplexed pads like 3807 and sharing common nodes 3802, 3812, 3822, 3832, 3806, 3809 and 3819 can be used to accurately measure very small currents through devices such as the diodes in the example of FIG. 38. Moreover, this method can measure the small currents through a large number of devices while using a minimum number of probe pads.

For example, if the devices in circuit 3800 could be made sufficiently small, a 46 pad test tile could accommodate nearly 400 separate test diodes of various types and sizes. Common probe pads 3832, 3806, 3809, 3819, an n-well probe pad, and a substrate probe pad would consume six probe pads. Nineteen probe pads would be used for select gate bias pads. These pads would be similar to probe pads 3802, 3812 and 3822. Twenty probe pads would be used in the same fashion as probe pad 3807 as sense transistor drain bias probe pads. Each of the twenty drain bias probe pads, similar to probe pad 3807, would be connected to the sources of 19 select transistors. Each of those select transistors would be connected to a separate current measurement circuit like circuits 3871, 3872 and 3873. Each of the gates of the 19 select transistors connected to a single drain bias probe pad would be connected to a separate select gate bias probe pad. In this way, each of the select transistors connected to a single drain bias probe pad can be individually controlled either selected or unselected. During measurements involving a particular drain bias probe pad like pad 3807, the 19 select gate bias probe pads would be used to select one of the 19 select transistors connected to the drain bias probe pad and to deselect the other 18 select transistors also connected to that drain bias probe pad.

The duplicate sense transistor circuit can also be integrated with the measurement circuits in this 46 probe pad test tile. Duplicate drain node 3850 is connected to one of the 20 drain bias probe pads and probe pad 3850 is omitted. Transistor 3855 is substituted for one of the 19 select transistors connected to that drain bias probe pad. The duplicate select transistor's gate bias node is controlled by the select gate bias probe pad that the replaced select transistor was connected to. Probe pad 3854 is thus omitted. Node 3853 is connected to the common source probe pad 3809 and probe pad 3853 is omitted. Duplicate sense transistor gate node 3851 requires its own dedicated probe pad.

In this way the reverse bias leakage currents of 379 separate diodes can be measured using only 46 pads. This number of diodes comes from having 20 drain bias probe pads with 19 measurement circuits connected to each drain bias probe pad. One of the 19 circuits on one of the pads is replaced with a duplicate sense circuit. In practice, the devices in circuit 3800 are not usually small enough to allow this level of test wafer packing efficiency. However, it is extremely useful to even use probe pad multiplexing just to double the number of devices that can be tested using a given number of probe pads.

It is important to note that FIG. 38 is only one possible embodiment of ways to reduce the number of probe pads required for test structures that are designed for measuring small device currents.

From the foregoing, it can be seen that the illustrated embodiments provide an improved method and apparatus for characterizing on-chip devices, currents and capacitances, in particular those which are variable with applied voltage. A novel circuit allows application of voltages to bias nodes that are not the same as the substrate voltage or any other voltage in the circuit. This allows complete characterization across all applied voltages. Switching devices are employed that are capable of applying bias voltages that can be both negative as well as positive with respect to the non-clocked electrode of the device under test.

While a particular embodiment of the present invention has been shown and described, modifications may be made. It is therefore intended in the appended claims to cover all such changes and modifications which fall within the true spirit and scope of the invention.

What is claimed is:

1. A test circuit comprising:
   a first transistor pair including a first transistor and a second transistor coupled with a device under test; and a second transistor pair including a third transistor and a fourth transistor coupled with a dummy device, the first transistor and the third transistor having a first common gate connection configured to be driven by a first variable voltage, the first transistor and the third transistor being biased by a first variable bias voltage, the second transistor and the fourth transistor having a second common gate connection configured to be driven by a second variable voltage, the second transistor and the fourth transistor being biased by a second variable bias voltage, wherein the first transistor and the third transistor each comprise a p-channel transistor and the second transistor and the fourth transistor each comprise a p-channel transistor.

2. The test circuit of claim 1 wherein:

the first transistor has a drain coupled to the device under test; and the second transistor has a source coupled to the device under test.

3. The test circuit of claim 2 wherein:

the third transistor has a drain coupled to the dummy device; and the fourth transistor has a source coupled to the dummy device.

4. The test circuit of claim 3 where the first transistor, the second transistor, the third transistor and the fourth transistor are formed in an n-well on a p-substrate.

5. The test circuit of claim 4 wherein the first transistor is substantially matched to the third transistor and the second transistor is substantially matched to the fourth transistor.

6. The test circuit of claim 1 further comprising a clock signal generating circuit coupled with the first common gate connection and the second common gate connection and configured to generate the first variable voltage and the second variable voltage.

7. The test circuit of claim 6 wherein the clock signal generating circuit comprises:

an oscillator; and a frequency division circuit for reducing frequency of signals generated by the oscillator to provide for allowing monitoring frequencies of the first variable voltage and the second variable voltage.

8. The test circuit of claim 7 wherein the frequency division circuit comprises one or more counters.

9. The test circuit or claim 6 wherein the clock signal generating circuit comprises one or more voltage controlled oscillators.

10. The test circuit of claim 9 wherein the clock signal generating circuit further comprises circuitry to control frequency division of the signals generated by the oscillator.

11. The test circuit of claim 1 wherein the device under test and the dummy device comprise multiple electrode capacitances.

* * * * *